United States Patent
Otsuki et al.

(10) Patent No.: US 7,553,373 B2
(45) Date of Patent: Jun. 30, 2009

(54) SILICON CARBIDE SINGLE CRYSTAL AND PRODUCTION THEREOF

(75) Inventors: Masashi Otsuki, Koganei (JP);
Takayuki Maruyama, Kodaira (JP);
Shigeki Endo, Tokorozawa (JP);
Daisuke Kondo, Kodaira (JP); Takuya Monbara, Iruma (JP)

(73) Assignee: Bridgestone Corporation, Tokyo (JP)

( * ) Notice: Subject to any disclaimer, the term of this patent is extended or adjusted under 35 U.S.C. 154(b) by 455 days.

(21) Appl. No.: 11/435,762

(22) Filed: May 18, 2006

(65) Prior Publication Data

US 2006/0254507 A1    Nov. 16, 2006

Related U.S. Application Data

(63) Continuation-in-part of application No. 10/161,715, filed on Jun. 5, 2002, now abandoned.

(30) Foreign Application Priority Data

| Jun. 15, 2001 | (JP) | ............... 2001-181671 |
| Jun. 22, 2001 | (JP) | ............... 2001-189864 |
| May 18, 2005 | (JP) | ............... 2005-145790 |
| Mar. 8, 2006 | (JP) | ............... 2006-062974 |

(51) Int. Cl.
*C30B 25/12* (2006.01)

(52) U.S. Cl. ............... 117/109; 117/84; 117/88; 117/100; 117/105; 117/951

(58) Field of Classification Search ............ 117/84, 117/88, 100, 105, 951
See application file for complete search history.

(56) References Cited

U.S. PATENT DOCUMENTS

| 4,832,888 A | 5/1989 | Sato et al. |
| 4,866,005 A | 9/1989 | Davis et al. |
| 5,045,298 A | 9/1991 | Muramatsu et al. |

(Continued)

FOREIGN PATENT DOCUMENTS

JP    06-316499 A    11/1994

(Continued)

OTHER PUBLICATIONS

Hobgood et al, "Status of Large Diameter SiC Crystal Growth for Electronic and Optical Applicaionts," *Materials Science Forum*, vols. 338-342 (2000), pp. 3-8.

(Continued)

*Primary Examiner*—Felisa C Hiteshew
(74) *Attorney, Agent, or Firm*—Sughrue Mion, PLLC

(57) ABSTRACT

A method of producing a silicon carbide single crystal, having:
fixing a seed crystal, including setting a seed crystal on a seed crystal fixing part with interposition of an adhesive; applying a uniform pressure on the entire surface of the seed crystal by contacting a flexible bag which is inflatable and deflatable to the seed crystal by charging a gas into the to flexible bag; hardening the adhesive; and
sublimating a silicon carbide powder obtained by calcinating a mixture containing at least a silicon source and a resol xylene resin, having a nitrogen content of 100 mass ppm or less and having a content of each impurity elements of 0.1 mass ppm or less, and re-crystallizing for growing a silicon carbide single crystal.

2 Claims, 14 Drawing Sheets

U.S. PATENT DOCUMENTS

| | | |
|---|---|---|
| RE34,861 E | 2/1995 | Davis et al. |
| 5,863,325 A | 1/1999 | Kanemoto et al. |
| 5,873,937 A | 2/1999 | Hopkins et al. |
| 6,013,236 A | 1/2000 | Takahashi et al. |
| 6,025,289 A | 2/2000 | Carter et al. |
| 6,218,680 B1 | 4/2001 | Carter et al. |
| 6,280,496 B1 | 8/2001 | Kawai et al. |
| 6,406,539 B1 | 6/2002 | Shigeto et al. |
| 2002/0165078 A1 | 11/2002 | Otsuki et al. |

FOREIGN PATENT DOCUMENTS

| | | |
|---|---|---|
| JP | 07-157307 A | 6/1995 |
| JP | 09-268099 A | 10/1997 |
| JP | 10-182296 A | 7/1998 |
| JP | 10-291899 A | 11/1998 |
| JP | 2000-503968 A | 4/2000 |
| WO | 00/39372 A1 | 7/2000 |
| WO | WO 00/71787 A2 | 11/2000 |

OTHER PUBLICATIONS

Snyder et al., "Large Diameter PVT Growth of Bulk 6H SiC Crystals," *Materials Science Forum*, vols. 338-342 (2000), pp. 9-12.

Patent Abstracts of Japan. English Abstract of JP 11-109639 (1999).

Office Action Dated Oct. 30, 2007 for JPA 2002-158938, Japanese Patent Office.

Japanese Office Action dated Feb. 12, 2008.

10mm

10mm

SILICON CARBIDE SINGLE CRYSTAL AND PRODUCTION THEREOF

RELATED APPLICATION

This is a Continuation-in-Part of application Ser. No. 10/161,715 filed on Jun. 5, 2002 now abandoned. The entire disclosure of the prior application, application Ser. No. 10/161,715 is considered part of the disclosure of the accompanying continuation-in-part application and is hereby incorporated by reference. This application claims benefit of priority under 35 USC 119 based on Japanese Patent Application P2001-181671, filed Jun. 15, 2001, Japanese Patent Application P2001-189864, filed Jun. 22, 2001, Japanese Patent Application P2005-145790, filed May 18, 2005, and Japanese Patent Application P2006-62974, filed Mar. 8, 2006, the entire contents of which are incorporated by reference herein.

BACKGROUND OF THE INVENTION

1. Field of the Invention

The present invention relates to a silicon carbide single crystal which can be suitably used as a semi-insulating or insulating single crystal substrate and the like, and an effective method of producing the same. Further, the present invention relates to a silicon carbide single crystal which can be suitably used as a p-type semiconductor and the like, and an effective method of producing the same. The present invention relates to a seed crystal fixing apparatus for fixing a seed crystal to a seed crystal setting part of a reaction vessel with interposition of an adhesive, and a method for fixing the seed crystal.

2. Related Art

Silicon carbides have larger band gap and more excellent in dielectric breakdown property, heat resistance, radiation resistance and the like as compared with silicon, therefore, have been noticed as electronic device materials such as portable and high output semiconductors and the like, and due to excellent optical properties, noticed as optical device materials. Among such silicon carbide crystals, silicon carbide single crystals have a merit that they are particularly excellent in uniformity of properties in wafer when applied to devices such as wafers and the like as compared with silicon carbide polycrystals.

As a method of producing the above-mentioned silicon carbide single crystal, Improved Rayleigh method (improved sublimation re-crystallization method) is known in which a graphite crucible is used, a silicon carbide powder is sublimated and a silicon carbide single crystal is grown on a seed crystal of a silicon carbide single crystal, however, there are known few methods of producing a silicon carbide single crystal having a content of impurity elements (elements of atomic number of 3 or more belonging to group I to group XVII elements in the periodic table of 1989 IUPAC inorganic chemical nomenclature revision (excluding, a carbon atom, nitrogen atom, oxygen atom and silicon atom), hereinafter the same) of 1.0 mass ppm or less.

On the other hand, a silicon carbide single crystal obtained by using a silicon carbide powder containing a significant amount of nitrogen atoms not included in the above-mentioned impurity elements cannot be utilized as a semi-insulator or insulator though it can be utilized as an n-type semiconductor, since nitrogen imparts, as a donor atom, electron conductivity to a silicon carbide crystal. Consequently, in some devices such as MESFET and the like using high frequency, use of high insulating substrates is desired for the purpose of suppression of high frequency loss of a substrate and the like, however, under current conditions, a method of producing a silicon carbide single crystal suitable for such a high insulating substrate has not been provided yet.

As a method of producing a silicon carbide single crystal which can be utilized as a p-type semiconductor, a method is known in which a powder of aluminum or alumina is added to a sublimation raw material silicon carbide powder and the mixture is sublimated simultaneously to produce a silicon carbide single crystal. In the case of this method, an aluminum atom in the grown silicon carbide single crystal supplies as an acceptor a hole, to manifest p-type electric conductivity. However, in this case, when nitrogen is contained in a sublimation raw material silicon carbide powder, there is a problem that compensation occurs between a nitrogen atom acting as a donor and an aluminum atom acting as an acceptor, resulting in loss of conductivity. There is no method provided under current conditions which can effectively prevent such compensation and can efficiently produce a silicon carbide single crystal suitable as a p-type semiconductor.

When the seed crystal is grown without being completely bonded to the seed crystal setting part in improved Lely method, macroscopic defects (void defects) penetrate through the seed crystal from the side of the seed crystal setting part where the seed crystal is not completely bonded into the growing crystal, and the quality of the wafer was liable to be impaired. Since the adhesive is gasified at high temperatures, it has been also conjectured that remaining bubbles of the gasified adhesive in the adhesive layer causes deterioration of the quality of the crystal.

Several techniques have been proposed for solving the above-mentioned problems (for example. see Japanese Patent Application Laid-Open Nos. 2001-139394 and 2003-119098). Japanese Patent Application Laid-Open No. 2001-139394 discloses, for example, a method for fixing the seed crystal by applying a given pressure. Japanese Patent Application Laid-Open No. 2003-119098 discloses a fixing method for press-bonding the seed crystal by mounting a weight on the seed crystal.

However, it was difficult to uniformly bond the entire surface of the seed crystal by the mechanical press-bond method which cause the surface of the seed crystal finely roughened. Uniform press-bonding with a weight was also difficult.

SUMMARY OF THE INVENTION

This invention relates to a method of producing a silicon carbide single crystal, having:

fixing a seed crystal, including setting a seed crystal on a seed crystal fixing part with interposition of an adhesive; applying a uniform pressure on the entire surface of the seed crystal by contacting a flexible bag which is inflatable and deflatable to the seed crystal by charging a gas into the to flexible bag; hardening the adhesive; and sublimating a silicon carbide powder obtained by calcinating a mixture containing at least a silicon source and a resol xylene resin, having a nitrogen content of 100 mass ppm or less and having a content of each impurity elements of 0.1 mass ppm or less, and re-crystallizing for growing a silicon carbide single crystal.

DETAILED DESCRIPTION OF PREFERRED EMBODIMENTS

Figure 1:
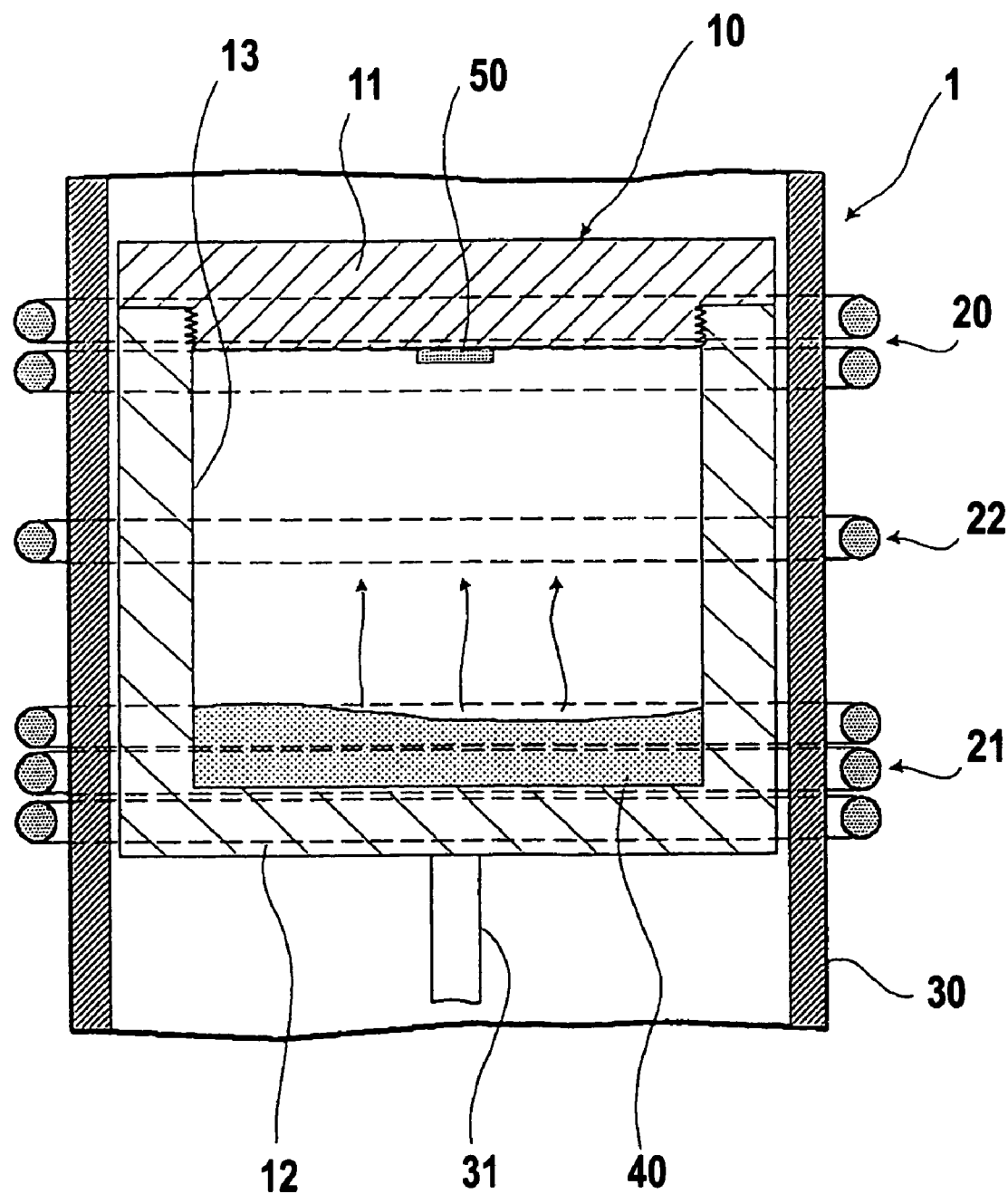
FIG. 1 is a schematic view for illustrating the initial condition in a method of producing a silicon carbide single crystal of the present invention.

While the present invention is described below with reference to embodiments, it is needless to say that the invention is not restricted to the embodiments as set forth below. Those parts having the same functions in the drawings are given the same reference numerals, and descriptions thereof are omitted.

Namely, a first embodiment of the present invention is to provide a silicon carbide single crystal which has a small content of the above-mentioned impurity elements, also has a small content of elements such as nitrogen and the like not included in the above-mentioned impurity elements, can be used as a semi-insulator or insulator, and can be suitably used as a semi-insulating or insulating single crystal substrate and the like, and a method of producing a silicon carbide single crystal which can efficiently produce the above-mentioned silicon carbide single crystal.

Means for attaining the above-mentioned first embodiment are as shown below.

<I-1> A method of producing a silicon carbide single crystal, wherein a silicon carbide powder having a nitrogen content of 100 mass ppm or less and having an each content of impurity elements of 0.1 mass ppm or less is sublimated and then re-crystallized to grow a silicon carbide single crystal.

<I-2> The method of producing a silicon carbide single crystal according to <I-1>, wherein the silicon carbide powder has nitrogen content of 50 mass ppm or less.

<I-3> A method of producing a silicon carbide single crystal, wherein a silicon carbide powder having a nitrogen content of 0.1 mass ppm or less is sublimated and then re-crystallized to grow a silicon carbide single crystal.

<I-4> The method of producing a silicon carbide single crystal according to any of <I-1> to <I-3>, wherein the silicon carbide powder is obtained by calcinating a mixture containing at least a silicon source and a xylene-based resin.

<I-5> The method of producing a silicon carbide single crystal according to <I-4>, wherein the silicon source is an alkoxysilane compound.

<I-6> The method of producing a silicon carbide single crystal according to <I-4> or <I-5>, wherein the mixture is obtained by adding an acid to the silicon source, then, adding the xylene-based resin.

<I-7> The method of producing a silicon carbide single crystal according to any of <I-4> to <I-6>, wherein the ratio of carbon contained in the xylene-based resin to silicon contained in the silicon source in the mixture in calcinating is 1.8 or less.

<I-8> The method of producing a silicon carbide single crystal according to any of <I-1> to <I-7>, wherein the silicon carbide powder has a volume-average particle size of 50 to 400 μm.

<I-9> The method of producing a silicon carbide single crystal according to any of <I-1> to <I-8>, wherein the silicon carbide powder contains 30 mass % or less of a silicon carbide powder having crystal polymorphism of beta type (3C).

<I-10> The method of producing a silicon carbide single crystal according to any of <I-1> to <I-9>, wherein the silicon carbide single crystal is grown while maintaining the whole growing surface in convex shape throughout the all of growth process.

<I-11> The method of producing a silicon carbide single crystal according to any of <I-1> to <I-10>, wherein the crystal of silicon carbide containing a silicon carbide single crystal is grown in a form approximating a peak.

<I-12> The method of producing a silicon carbide single crystal according to any of <I-1> to <I-11>, wherein the crystal of silicon carbide containing a silicon carbide single crystal is composed solely of a silicon carbide single crystal.

<I-13> The method of producing a silicon carbide single crystal according to any of <I-1> to <I-12>, wherein a silicon carbide powder is accommodated in a reaction vessel, a seed crystal of a silicon carbide single crystal is placed at the end part approximately facing the silicon carbide powder in the reaction vessel, and growth of the crystal of silicon carbide containing a silicon carbide single crystal is conducted only at regions excepting adjacent parts to the peripheral surface part in the reaction vessel, at this end part.

<I-14> The method of producing a silicon carbide single crystal according to any of <I-1> to <I-13>, wherein a silicon carbide powder is accommodated at one end side in a reaction vessel, a seed crystal of a silicon carbide single crystal is placed at another end side in the reaction vessel, a sublimation atmosphere is formed so that the silicon carbide powder can be sublimated by a first heating means placed at the above-mentioned one end side, a re-crystallization atmosphere is formed so that silicon carbide sublimated by the above-mentioned first heating means can be re-crystallized only around the above-mentioned seed crystal of a silicon carbide single crystal by a second heating means placed at the above-mentioned another end side, and the silicon carbide is re-crystallized on the above-mentioned seed crystal of a silicon carbide single crystal.

<I-15> The method of producing a silicon carbide single crystal according to <I-14>, wherein the first heating means and the second heating means are a coil which can be induction-heated.

<I-16> The method of producing a silicon carbide single crystal according to <I-15>, wherein the current value of induction heating current in the first heating means is larger than the current value of induction heating current in the second heating means.

<I-17> The method of producing a silicon carbide single crystal according to <I-15> or <I-16>, wherein the current value of induction heating current in the second heating means is continuously or gradually decreased with increase in the diameter of a silicon carbide single crystal grown.

<I-18> The method of producing a silicon carbide single crystal according to any of <I-14> to <I-17>, wherein, when the temperature of one end side accommodating a silicon carbide powder is represented by $T_1$, the temperature of another end side containing a seed crystal of a silicon carbide single crystal placed is represented by $T_2$, and the temperature of adjacent parts to the inner peripheral surface part of the reaction vessel, at this another end side, is represented by $T_3$, in the reaction vessel, then, $T_3-T_2$ and $T_1-T_2$ increase continuously or gradually.

<I-19> A silicon carbide single crystal produced by the method of producing a silicon carbide single crystal according to any of <I-1> to <I-18>.

<I-20> The silicon carbide single crystal according to <I-19>, wherein the number of crystal defects in the form of hollow pipe optically image-detected without break is 100 or less per $cm^2$.

<I-21> The silicon carbide single crystal according to <I-19> or <I-20>, wherein the total content of impurity elements is 10 mass ppm or less.

<I-22> The silicon carbide single crystal according to any of <I-19> to <I-21>, wherein the volume resistivity is $1\times10^7$ Ωcm or more.

<I-23> The silicon carbide single crystal according to any of <I-19> to <I-22>, wherein the nitrogen content is 0.01 mass ppm or less.

As the means for solving the above-mentioned first embodiment, following inventions are further listed.

<I-24> The method of producing a silicon carbide single crystal according to any of <I-4> to <I-18>, wherein the calcination is conducted by heating at 100 to 1000° C./h up to 1300 to 1600° C., then, heating at 50 to 300° C./h up to 1800 to 2100° C., then, maintaining at 1800 to 2100° C. for 240 minutes or less, in a non-oxidizing atmosphere.

<I-25> The method of producing a silicon carbide single crystal according to any of <I-4> to <I-18> and <I-24>, wherein, in calcinating, a halogen or hydrogen halide is added in an amount of 1 to 5 vol % to a silicon source or carbon source.

<I-26> The method of producing a silicon carbide single crystal according to any of <I-4> to <I-18> and <I-23> to <I-25>, wherein, after calcination, post treatment by heating is conducted.

<I-27> The method of producing a silicon carbide single crystal according to <I-26>, wherein the post treatment is conducted at 2150 to 2400° C.

<I-28> The method of producing a silicon carbide single crystal according to <I-26> or <I-27>, wherein the post treatment is conducted for 3 to 8 hours in an argon atmosphere.

<I-29> The method of producing a silicon carbide single crystal according to any of <I-1> to <I-18> and <I-23> to <I-28>, wherein the volume-average particle size ($D_{50}$) of a silicon carbide powder is 0.5 to 800 μm.

<I-30> The method of producing a silicon carbide single crystal according to any of <I-1> to <I-18> and <I-23> to <I-29>, wherein the silicon carbide powder has a particle size distribution ($D_{90}/D_{10}$) of 4 or less.

<I-31> The method of producing a silicon carbide single crystal according to any of <I-12> to <I-18> and <I-23> to <I-30>, wherein, in the reaction vessel, the temperature of the re-crystallization atmosphere is lower than the temperature of the sublimation atmosphere by 30 to 300° C.

<I-32> The method of producing a silicon carbide single crystal according to any of <I-12> to <I-18> and <I-23> to <I-31>, wherein the reaction vessel is a crucible placed in a quartz tube.

<I-33> The method of producing a silicon carbide single crystal according to any of <I-12> to <I-18> and <I-23> to <I-32>, wherein the surface of adjacent parts to the peripheral surface part in the reaction vessel, at another end part, is made of vitreous carbon.

<I-34> The method of producing a silicon carbide single crystal according to any of <I-12> to <I-18> and <I-23> to <I-33>, wherein an interference preventing means is placed between the first heating means and the second heating means, so that induction current can be passed and which prevents interference between the first heating means and the second heating means by passing the induction current.

<I-35> The method of producing a silicon carbide single crystal according to <I-34>, wherein the interference preventing means is a coil through which cooling water can be flown.

<I-36> The method of producing a silicon carbide single crystal according to any of <I-12> to <I-18> and <I-23> to <I-35>, wherein one end part is the lower end part and another end part is the upper end part.

<I-37> The method of producing a silicon carbide single crystal according to any of <I-12> to <I-18> and <I-23> to <I-36>, wherein, at another end part, a region for effecting growth of a silicon carbide single crystal and a region placed at the outer periphery of the growth region and adjacent to the inner peripheral surface part of the reaction vessel are formed of different members, and one end of a member forming the above-mentioned region for effecting growth of a silicon carbide single crystal is exposed into the reaction vessel and another end thereof is exposed out of the reaction vessel.

A second embodiment of the present invention is to provide a silicon carbide single crystal which has a small content of the above-mentioned impurity elements, also has a small content of elements such as nitrogen and the like not included in the above-mentioned impurity elements, and can be suitably used as a p-type semiconductor and the like, and a method of producing a silicon carbide single crystal which can efficiently produce the above-mentioned silicon carbide single crystal.

Means for attaining the above-mentioned second embodiment are as shown below.

<II-1> A method of producing a silicon carbide single crystal, wherein a silicon carbide powder having a nitrogen content of 100 mass ppm or less, having an each content of impurity elements excepting group XIII elements in the periodic table of element of 0.1 mass ppm or less and having a total content of group XIII elements in the periodic table of element of not less than the nitrogen content (atom ppm) is sublimated and then re-crystallized to grow a silicon carbide single crystal.

<II-2> The method of producing a silicon carbide single crystal according to <II-1>, wherein the silicon carbide powder has a nitrogen content of 50 mass ppm or less.

<II-3> A method of producing a silicon carbide single crystal, wherein a silicon carbide powder having a nitrogen content of 0.1 mass ppm or less and having a total content of group XIII elements in the periodic table of element of not less than the nitrogen content (atom ppm) is sublimated and then re-crystallized to grow a silicon carbide single crystal.

<II-4> The method of producing a silicon carbide single crystal according to any of <II-1> to <II-3>, wherein the group XIII element in the periodic table of element is aluminum.

<II-5> The method of producing a silicon carbide single crystal according to any of <II-1> to <II-4>, wherein the silicon carbide powder is obtained by calcinating a mixture containing at least a silicon source and a xylene-based resin.

<II-6> The method of producing a silicon carbide single crystal according to <II-5>, wherein the silicon source is an alkoxysilane compound.

<II-7> The method of producing a silicon carbide single crystal according to <II-5> or <II-6>, wherein the mixture is obtained by adding an acid to the silicon source, then, adding the xylene-based resin.

<II-8> The method of producing a silicon carbide single crystal according to any of <II-5> to <II-7>, wherein the ratio of carbon contained in the xylene-based resin to silicon contained in the silicon source in the mixture in calcinating is 1.8 or less.

<II-9> The method of producing a silicon carbide single crystal according to any of <II-1> to <II-8>, wherein the silicon carbide powder has a volume-average particle size of 50 to 400 μm.

<II-10> The method of producing a silicon carbide single crystal according to any of <II-1> to <II-9>, wherein the silicon carbide powder contains 30 mass % or less of a silicon carbide powder having crystal polymorphism of beta type (3C).

<II-11> The method of producing a silicon carbide single crystal according to any of <II-1> to <II-10>, wherein the silicon carbide single crystal is grown while maintaining the whole growing surface in convex shape throughout the all of growth process.

<II-12> The method of producing a silicon carbide single crystal according to any of <II-1> to <II-11>, wherein the crystal of silicon carbide containing a silicon carbide single crystal is grown in a form approximating a peak.

<II-13> The method of producing a silicon carbide single crystal according to any of <II-1> to <II-12>, wherein the crystal of silicon carbide containing a silicon carbide single crystal is composed solely of a silicon carbide single crystal.

<II-14> The method of producing a silicon carbide single crystal according to any of <II-1> to <II-13>, wherein a silicon carbide powder is accommodated in a reaction vessel, a seed crystal of a silicon carbide single crystal is placed at the end part approximately facing the silicon carbide powder in the reaction vessel, and growth of the crystal of silicon carbide containing a silicon carbide single crystal is conducted only at regions excepting adjacent parts to the peripheral surface part in the reaction vessel, at this end part.

<II-15> The method of producing a silicon carbide single crystal according to any of <II-1> to <II-13>, wherein a silicon carbide powder is accommodated at one end side in a reaction vessel, a seed crystal of a silicon carbide single crystal is placed at another end side in the reaction vessel, a sublimation atmosphere is formed so that the silicon carbide powder can be sublimated by a first heating means placed at the above-mentioned one end side, a re-crystallization atmosphere is formed so that silicon carbide sublimated by the above-mentioned first heating means can be re-crystallized only around the above-mentioned seed crystal of a silicon carbide single crystal by a second heating means placed at the above-mentioned another end side, and the silicon carbide is re-crystallized on the above-mentioned seed crystal of a silicon carbide single crystal.

<II-16> The method of producing a silicon carbide single crystal according to <II-15>, wherein the first heating means and the second heating means are a coil which can be induction-heated.

<II-17> The method of producing a silicon carbide single crystal according to <II-16>, wherein the current value of induction heating current in the first heating means is larger than the current value of induction heating current in the second heating means.

<II-18> The method of producing a silicon carbide single crystal according to <II-16> or <II-17>, wherein the current value of induction heating current in the second heating means is continuously or gradually decreased with increase in the diameter of a silicon carbide single crystal grown.

<II-19> The method of producing a silicon carbide single crystal according to any of <II-15> to <II-18>, wherein, when the temperature of one end side accommodating a silicon carbide powder is represented by $T_1$, the temperature of another end side containing a seed crystal of a silicon carbide single crystal placed is represented by $T_2$, and the temperature of adjacent parts to the inner peripheral surface part of the reaction vessel, at this another end side, is represented by $T_3$, in the reaction vessel, then, $T_3-T_2$ and $T_1-T_2$ increase continuously or gradually.

<II-20> A silicon carbide single crystal produced by the method of producing a silicon carbide single crystal according to any of <II-1> to <II-19>.

<II-21> The silicon carbide single crystal according to <II-20>, wherein the number of crystal defects in the form of hollow pipe optically image-detected without break is 100 or less per $cm^2$.

<II-22> The silicon carbide single crystal according to <II-20> or <II-21>, wherein the total content of impurity elements is 10 mass ppm or less.

<II-23> The silicon carbide single crystal according to any of <II-20> to <II-22>, wherein the volume resistivity is $1\times10^1$ Ω·cm or less.

<II-24> The silicon carbide single crystal according to any of <II-20> to <II-23>, wherein the nitrogen content is 0.01 mass ppm or less.

As the means for solving the above-mentioned second embodiment, following inventions are further listed.

<II-25> The method of producing a silicon carbide single crystal according to any of <II-4> to <II-19>, wherein the calcination is conducted by heating at 100 to 1000° C./h up to 1300 to 1600° C., then, heating at 50 to 300° C./h up to 1800 to 2100° C., then, maintaining at 1800 to 2100° C. for 240 minutes or less, in a non-oxidizing atmosphere.

<II-26> The method of producing a silicon carbide single crystal according to any of <II-4> to <II-19> and <II-25>, wherein, in calcinating, a halogen or hydrogen halide is added in an amount of 1 to 5 vol % to a silicon source or carbon source.

<II-27> The method of producing a silicon carbide single crystal according to any of <II-4> to <II-19> and <II-24> to <II-26>, wherein, after calcination, post treatment by heating is conducted.

<II-28> The method of producing a silicon carbide single crystal according to <II-27>, wherein the post treatment is conducted at 2150 to 2400° C.

<II-29> The method of producing a silicon carbide single crystal according to <II-27> or <II-28>, wherein the post treatment is conducted for 3 to 8 hours in an argon atmosphere.

<II-30> The method of producing a silicon carbide single crystal according to any of <II-1> to <II-19> and <II-24> to <II-29>, wherein the volume-average particle size ($D_{50}$) of a silicon carbide powder is 0.5 to 800 μm.

<II-31> The method of producing a silicon carbide single crystal according to any of <II-1> to <II-19> and <II-24> to <II-30>, wherein the silicon carbide powder has a particle size distribution ($D_{90}/D_{10}$) of 4 or less.

<II-32> The method of producing a silicon carbide single crystal according to any of <II-12> to <II-19> and <II-24> to <II-31>, wherein, in the reaction vessel, the temperature of the re-crystallization atmosphere is lower than the temperature of the sublimation atmosphere by 30 to 300° C.

<II-33> The method of producing a silicon carbide single crystal according to any of <II-12> to <II-19> and <II-24> to <II-32>, wherein the reaction vessel is a crucible placed in a quartz tube.

<II-34> The method of producing a silicon carbide single crystal according to any of <II-12> to <II-19> and <II-24> to <II-33>, wherein the surface of adjacent parts to the peripheral surface part in the reaction vessel, at another end part, is made of vitreous carbon.

<II-35> The method of producing a silicon carbide single crystal according to any of <II-12> to <II-19> and <II-24> to <II-34>, wherein an interference preventing means is placed between the first heating means and the second heating means, so that induction current can be passed and which prevents interference between the first heating means and the second heating means by passing the induction current.

<II-36> The method of producing a silicon carbide single crystal according to <II-35>, wherein the interference preventing means is a coil through which cooling water can be flown.

<II-37> The method of producing a silicon carbide single crystal according to any of <II-12> to <II-19> and <II-24> to <II-36>, wherein one end part is the lower end part and another end part is the upper end part.

<II-38> The method of producing a silicon carbide single crystal according to any of <II-12> to <II-19> and <II-24> to <II-37>, wherein, at another end part, a region for effecting growth of a silicon carbide single crystal and a region placed at the outer periphery of the growth region and adjacent to the inner peripheral surface part of the reaction vessel are formed of different members, and one end of a member forming the above-mentioned region for effecting growth of a silicon carbide single crystal is exposed into the reaction vessel and another end thereof is exposed out of the reaction vessel.

A third embodiment of the present invention is to provide

Means for attaining the above-mentioned third embodiment are as shown below.

<III-1> A method of producing a silicon carbide single crystal, having:

fixing a seed crystal, including setting a seed crystal on a seed crystal fixing part with interposition of an adhesive; applying a uniform pressure on the entire surface of the seed crystal by contacting a flexible bag which is inflatable and deflatable to the seed crystal by charging a gas into the to flexible bag; hardening the adhesive; and sublimating a silicon carbide powder obtained by calcinating a mixture containing at least a silicon source and a resol xylene resin, having a nitrogen content of 100 mass ppm or less and having a content of each impurity elements of 0.1 mass ppm or less, and re-crystallizing for growing a silicon carbide single crystal.

According to the above-mentioned means for solving the first embodiment, the following actions and effects are obtained.

In the method of producing a silicon carbide single crystal of <I-1>, since a silicon carbide powder having a nitrogen content of 100 mass ppm or less and having an each content of impurity elements of 0.1 mass ppm or less is sublimated and then re-crystallized to grow a silicon carbide single crystal, the nitrogen content in the silicon carbide single crystal re-crystallized is low. Therefore, the produced silicon carbide single crystal is suitable as a semi-insulating or insulating single crystal substrate and the like.

In the method of producing a silicon carbide single crystal of <I-2>, since the above-mentioned silicon carbide powder has a nitrogen content of 50 mass ppm or less in <I-1>, the nitrogen content in the silicon carbide single crystal re-crystallized is extremely low. Therefore, the produced silicon carbide single crystal is particularly suitable as a semi-insulating or insulating single crystal substrate and the like.

In the method of producing a silicon carbide single crystal of <I-3>, since a silicon carbide powder having a nitrogen content of 0.1 mass ppm or less is sublimated and then re-crystallized to grow a silicon carbide single crystal, the nitrogen content in the silicon carbide single crystal re-crystallized is extremely low. Therefore, the produced silicon carbide single crystal is particularly suitable as a semi-insulating or insulating single crystal substrate and the like.

In the method of producing a silicon carbide single crystal of <I-4>, since the above-mentioned silicon carbide powder is obtained by calcinating a mixture containing at least a silicon source and a xylene-based resin in any of <I-1> to <I-3> and the nitrogen content in the silicon carbide powder is low, the nitrogen content in the silicon carbide single crystal re-crystallized is extremely low. Therefore, the produced silicon carbide single crystal is particularly suitable as a semi-insulating or insulating single crystal substrate and the like.

In the method of producing a silicon carbide single crystal of <I-5>, the above-mentioned silicon source is an alkoxysilane polymer in <I-4>. Therefore, the above-mentioned silicon carbide powder is obtained easily at low cost.

In the method of producing a silicon carbide single crystal of <I-6>, the mixture is obtained by adding an acid to the silicon source, then, adding the xylene-based resin in <I-4> or <I-5>. Therefore, the above-mentioned mixture in uniform condition is obtained extremely easily, and a silicon carbide single crystal is produced efficiently.

In the method of producing a silicon carbide single crystal of <I-7>, since the ratio of carbon contained in the xylene-based resin to silicon contained in the silicon source in the mixture in calcinating is 1.8 or less and consequently the amount of free carbon in the above-mentioned silicon carbide powder is small in any of <I-4> to <I-6>, a silicon carbide single crystal of high quality is obtained.

In the method of producing a silicon carbide single crystal of <I-8>, since the silicon carbide powder has a volume-average particle size of 50 to 400 μm in any of <I-1> to <I-7>, the volume-average particle size thereof is larger than that of a silicon carbide powder produced by CVD and the like, handling thereof is easy, and efficiency in producing a silicon carbide single crystal is excellent.

In the method of producing a silicon carbide single crystal of <I-9>, since the silicon carbide powder contains only 30 mass % or less of a silicon carbide powder having crystal polymorphism of beta type (3C) in any of <I-1> to <I-8>, the volume-average particle size thereof is larger than that of a beta type silicon carbide powder produced by CVD and the like, and additionally, sublimation is conducted stably, consequently, handling thereof is easy, and efficiency in producing a silicon carbide single crystal is excellent.

In the method of producing a silicon carbide single crystal of <I-10>, the above-mentioned silicon carbide single crystal is grown while maintaining a convex shape of the growing surface throughout the all of growth process in any of <I-1> to <I-9>. Here, on the whole surface of the growing surface of the silicon carbide single crystal grown, the above-mentioned depressed concave part is not formed toward the reverse direction to its growing direction. Therefore, a silicon carbide single crystal of high quality having no breakage such as cracking and the like and containing no crystal defects present such as polycrystal, mixing of polymorphism, micropipe and the like is produced.

In the method of producing a silicon carbide single crystal of <I-11>, since the crystal of silicon carbide containing a silicon carbide single crystal is grown in a form approximating a peak in any of <I-1> to <I-10>, the above-mentioned depressed concave part is not formed at all toward the reverse direction to its growing direction, in the silicon carbide single crystal grown. Therefore, a silicon carbide single crystal of high quality having no breakage such as cracking and the like and containing no crystal defects present such as polycrystal, mixing of polymorphism, micropipe and the like is produced.

In the method of producing a silicon carbide single crystal of <I-12>, the above-mentioned crystal of silicon carbide containing a silicon carbide single crystal is composed solely of a silicon carbide single crystal in any of <I-1> to <I-11>. Therefore, a silicon carbide single crystal having large diameter is obtained, and there is no need of separation of the silicon carbide single crystal from a silicon carbide polycrystal, or the like.

In the method of producing a silicon carbide single crystal of <I-13>, the above-mentioned silicon carbide powder is accommodated in a reaction vessel, a seed crystal of the silicon carbide single crystal is placed at the end part approximately facing the silicon carbide powder in the reaction vessel, and growth of the crystal of silicon carbide containing the silicon carbide single crystal is conducted only at regions excepting adjacent parts to the peripheral surface part in the reaction vessel, at this end part, in any of <I-1> to <I-12>. Therefore, the above-mentioned depressed concave part is not formed toward the reverse direction to its growing direction, in the silicon carbide single crystal grown, further, a silicon carbide polycrystal does not grow in the condition of contact with the peripheral surface part in the reaction vessel, at the above-mentioned end part. Therefore, when the grown silicon carbide single crystal is cooled to room temperature, stress based on difference in thermal expansion is not applied concentratedly from the silicon carbide polycrystal side to the silicon carbide single crystal side, defects such as cracking and the like do not occur in the resulting silicon carbide single crystal. As a result, a silicon carbide single crystal of high quality having no breakage such as cracking and the like and containing no crystal defects present such as polycrystal, mixing of polymorphism, micropipe and the like is produced efficiently and infallibly.

In the method of producing a silicon carbide single crystal of <I-14>, the above-mentioned silicon carbide powder is accommodated at one end side in the reaction vessel, a seed crystal of the silicon carbide single crystal is placed at another end side in the reaction vessel, a sublimation atmosphere is formed so that the silicon carbide powder can be sublimated by a first heating means placed at the above-mentioned one end side, a re-crystallization atmosphere is formed so that silicon carbide sublimated by the above-mentioned first heating means can be re-crystallized only around the seed crystal of the silicon carbide single crystal by a second heating means placed at the above-mentioned another end side, and the silicon carbide is re-crystallized on the above-mentioned seed crystal of the silicon carbide single crystal, in any of <I-1> to <I-13>.

In this method of producing a silicon carbide single crystal, heating for formation of a sublimation atmosphere so that the above-mentioned silicon carbide powder can be sublimated is conducted by the first heating means and formation of a re-crystallization atmosphere so that re-crystallization is possible only on the seed crystal of the silicon carbide single crystal is conducted by a second heating means, consequently, re-crystallization can be conducted selectively only on the seed crystal of the silicon carbide single crystal or around it, and the above-mentioned silicon carbide polycrystal does not grow in the condition of contact with the peripheral surface part in the reaction vessel, at the above-mentioned end part. When the grown silicon carbide single crystal is cooled to room temperature, stress based on difference in thermal expansion is not applied concentratedly from the silicon carbide polycrystal side to the silicon carbide single crystal side, and defects such as cracking and the like do not occur in the resulting silicon carbide single crystal. As a result, a silicon carbide single crystal of high quality having no breakage such as cracking and the like and containing no crystal defects present such as polycrystal, mixing of polymorphism, micropipe and the like is produced.

In the method of producing a silicon carbide single crystal of <I-15>, the above-mentioned first heating means and the second heating means are a coil which can be induction-heated in <I-14>. Therefore, the temperature control of the above-mentioned first heating means for formation of the above-mentioned sublimation atmosphere and the temperature control of the above-mentioned second heating means for formation of the above-mentioned re-crystallization atmosphere are conducted easily and infallibly by induction-heating by the coil.

In the method of producing a silicon carbide single crystal of <I-16>, the current value of induction heating current in the first heating means is larger than the current value of induction heating current in the second heating means in <I-15>. Therefore, the temperature of the re-crystallization atmosphere around the above-mentioned seed crystal is maintained lower than the temperature of the above-mentioned sublimation atmosphere, and re-crystallization is conducted easily.

In the method of producing a silicon carbide single crystal of <I-17>, since the current value of induction heating current in the above-mentioned second heating means is continuously or gradually decreased with increase in the diameter of a silicon carbide single crystal grown in <I-15> or <I-16>. Therefore, the heating amount by the above-mentioned second heating means is controlled low with growth of the above-mentioned silicon carbide single crystal, consequently, re-crystallization is conducted only around the above-mentioned silicon carbide single crystal continuing to grow, and a polycrystal does not grow around the above-mentioned silicon carbide single crystal.

In the method of producing a silicon carbide single crystal of <I-18>, when the temperature of one end side accommodating a silicon carbide powder is represented by $T_1$, the temperature of another end side containing a seed crystal of a silicon carbide single crystal placed is represented by $T_2$, and the temperature of adjacent parts to the inner peripheral surface part of the reaction vessel, at this another end side, is represented by $T_3$, in the reaction vessel, then, $T_3-T_2$ and $T_1-T_2$ increase continuously or gradually in any of <I-14> to <I-17>. When $T_1-T_2$ increases continuously or gradually, even if a silicon carbide single crystal continues to grow toward the above-mentioned one end side with the lapse of time, the crystal growth peak side of the silicon carbide single crystal is always maintained at the condition of easy re-crystallization. On the other hand, when $T_3-T_2$ increases continuously or gradually, even if a silicon carbide single crystal continues to grow toward the outer peripheral direction at the above-mentioned another end side with the lapse of time, the crystal growth outer peripheral end side of the silicon carbide single crystal is always maintained at the condition of easy re-crystallization. As a result, production of a silicon carbide polycrystal is effectively suppressed, and the silicon carbide single crystal continues to grow toward the direction of larger thickness while enlarging the diameter, and finally, a silicon carbide single crystal of larger diameter containing no incorporated silicon carbide polycrystal and the like is obtained.

The silicon carbide single crystal of <I-19> is produced by the method of producing a silicon carbide single crystal according to any of <I-1> to <I-18>. Therefore, the resulting silicon carbide single crystal has low nitrogen content, and is particularly suitable as a semi-insulating or insulating single crystal substrate and the like.

In the silicon carbide single crystal of <I-20>, the number of crystal defects in the form of hollow pipe optically image-detected without break is 100 or less per $cm^2$ in <I-19>. Therefore, this silicon carbide single crystal has extremely high quality, is excellent particularly in insulation breakdown property, heat resistance, radiation resistance and the like, and particularly suitable for electronic devices such as a semiconductor wafer and the like, optical devices such as a light emitting diode and the like.

In the silicon carbide single crystal of <I-21>, the total content of the above-mentioned impurity elements is 10 mass ppm or less in <I-19> or <I-20>. Therefore, this silicon carbide single crystal has extremely high quality.

In the silicon carbide single crystal of <I-22>, the volume resistivity is $1 \times 10^7$ Ωcm or more in any of <I-19> or <I-21>. Therefore, this silicon carbide single crystal is a semi-insulator or insulator.

The silicon carbide single crystal of <I-23> has a nitrogen content of 0.01 mass ppm or less in any of <I-19> to <I-22>, consequently, the nitrogen content in the silicon carbide single crystal to be re-crystallized is extremely low. Therefore, the produced silicon carbide single crystal is particularly suitable as a semi-insulating or insulating single crystal substrate and the like.

In the method of producing a silicon carbide single crystal of <I-24>, the calcination is conducted by heating at 100 to 1000° C./h up to 1300 to 1600° C., then, heating at 50 to 300° C./h up to 1800 to 2100° C., then, maintaining at 1800 to 2100° C. for 240 minutes or less, in a non-oxidizing atmosphere in any of <I-4> to <I-18>. Therefore, a silicon carbide single crystal is produced efficiently.

In the method of producing a silicon carbide single crystal of <I-25>, in calcinating, a halogen or hydrogen halide is added in an amount of 1 to 5 vol % to a silicon source or carbon source in any of <I-4> to <I-18> and <I-24>. Therefore, in the resulting silicon carbide single crystal, the amount of impurity elements is suppressed low effectively.

In the method of producing a silicon carbide single crystal of <I-26>, after calcination, post treatment by heating is conducted in any of <I-4> to <I-18> and <I-23> to <I-25>. Therefore, impurity elements are removed and a silicon carbide single crystal of high purity and high quality is produced efficiently.

In the method of producing a silicon carbide single crystal of <I-27>, since the post treatment is conducted at 2150 to 2400° C. in <I-26>, impurity elements are removed, and a silicon carbide single crystal of high purity and high quality is produced efficiently.

In the method of producing a silicon carbide single crystal of <I-28>, since the post treatment is conducted for 3 to 8 hours in an argon atmosphere in <I-26> or <I-27>, impurity elements are removed, and a silicon carbide single crystal of high purity and high quality is produced efficiently.

In the method of producing a silicon carbide single crystal of <I-29>, since the volume-average particle size ($D_{50}$) of a silicon carbide powder is 100 to 500 μm in any of <I-1> to <I-18> and <I-23> to <I-28>, sublimation is conducted efficiently, and a silicon carbide single crystal is produced efficiently.

In the method of producing a silicon carbide single crystal of <I-30>, since the silicon carbide powder has a particle size distribution ($D_{90}/D_{10}$) of 4 or less in any of <I-1> to <I-18> and <I-23> to <I-29>, sublimation is conducted efficiently, and a silicon carbide single crystal is produced efficiently.

In the method of producing a silicon carbide single crystal of <I-31>, in the above-mentioned reaction vessel, the temperature of the re-crystallization atmosphere is lower than the temperature of the sublimation atmosphere by 30 to 300° C. in any of <I-12> to <I-18> and <I-23> to <I-30>. Therefore, re-crystallization is conducted easily and smoothly on the above-mentioned seed crystal of the silicon carbide single crystal and around of it.

In the method of producing a silicon carbide single crystal of <I-32>, the above-mentioned reaction vessel is a crucible placed in a quartz tube in any of <I-12> to <I-18> and <I-23> to <I-31>. Therefore, sublimation and re-crystallization of the above-mentioned silicon carbide powder and growth of the above-mentioned silicon carbide single crystal are conducted in a closed system in the quartz tube, consequently, control of them is easy.

In the method of producing a silicon carbide single crystal of <I-33>, the surface of adjacent parts to the inner peripheral surface part in the reaction vessel, at the above-mentioned another end part is made of vitreous carbon in any of <I-12> to <I-18> and <I-23> to <I-32>. Therefore, re-crystallization does not occur easily at the above-mentioned adjacent parts to the inner peripheral surface part in the reaction vessel, at the above-mentioned another end part, as compared with regions other than the adjacent parts. As a result, a crystal of silicon carbide does not grow at the above-mentioned adjacent parts at the above-mentioned another end part, and a silicon carbide single crystal re-crystallizes and grows selectively only at regions other than the adjacent parts.

In the method of producing a silicon carbide single crystal of <I-34>, an interference preventing means is placed between the first heating means and the second heating means, so that induction current can be passed and which prevents interference between the first heating means and the second heating means by passing the induction current in any of <I-12> to <I-18> and <I-23> to <I-33>. Therefore, when induction heating by the above-mentioned first heating means and induction heating by the above-mentioned second heating means are conducted simultaneously, induction current flows through the interference preventing means, and the interference preventing means minimizes and prevents interference between them.

In the method of producing a silicon carbide single crystal of <I-35>, the above-mentioned interference preventing means is a coil which can be cooled in <I-34>. Even if the coil is heated by flow of induction current, this coil is cooled, consequently, this coil does not heat the above-mentioned reaction vessel. Therefore, temperature control of the above-mentioned reaction vessel is easy.

In the method of producing a silicon carbide single crystal of <I-36>, the above-mentioned one end part is the lower end part and the above-mentioned another end part is the upper end part in any of <I-12> to <I-18> and <I-23> to <I-35>. Therefore, the above-mentioned silicon carbide powder is accommodated at the lower part in the above-mentioned reaction vessel, sublimation of the silicon carbide powder is conducted smoothly, and the above-mentioned silicon carbide single crystal grows toward lower direction, namely, toward gravity direction, in the condition of no excess load.

In the method of producing a silicon carbide single crystal of <I-37>, the region for effecting growth of a silicon carbide single crystal and the region placed at the outer periphery of the growth region and adjacent to the inner peripheral surface part of the reaction vessel are formed of different members, and one end of a member forming the above-mentioned region for effecting growth of a silicon carbide single crystal is exposed into the reaction vessel and another end thereof is exposed out of the reaction vessel, in any of <I-12> to <I-18> and <I-23> to <I-36>. Since the region for effecting growth of a silicon carbide single crystal (inner region) and the region placed at the outer periphery of the growth region and adjacent to the inner peripheral surface part of the reaction vessel (outer region) are formed of different members, when heating is conducted by the above-mentioned second heating means, the above-mentioned outer region situated at the second heating means side is heated easily, while the above-mentioned inner region is not easily heated due to difference in contact resistance from the outer region. Therefore, even if heating is conducted by the above-mentioned second heating means, difference in temperature occurs between the above-mentioned outer region and the above-mentioned inner region, and the inner region is not easily heated as compared with the outer region, consequently, temperature is kept low and the above-mentioned re-crystallization of silicon carbide is conducted easily.

Further, since the opposite side to the inner side of the reaction vessel in the above-mentioned member forming the inner region is exposed out of the reaction vessel, and heat is easily released out of the reaction vessel, therefore, when heating is conducted by the above-mentioned second heating means, the above-mentioned inner region is not easily heated as compared with the above-mentioned outer region, consequently, difference in temperature occurs between the above-mentioned outer region and the above-mentioned inner region, and the temperature of the above-mentioned inner region is kept lower than the temperature of the above-mentioned outer region and the above-mentioned re-crystallization of silicon carbide is conducted easily. As a result, a silicon carbide single crystal does not grow easily in the above-mentioned outer region, and a silicon carbide single crystal re-crystallizes and grows selectively only in the inner region.

According to the above-mentioned means for solving the second embodiment, the following actions and effects are obtained.

In the method of producing a silicon carbide single crystal of <II-1>, since a silicon carbide powder having a nitrogen content of 100 mass ppm or less, having an each content of impurity elements excepting group XIII elements in the periodic table of element of 0.1 mass ppm or less and having a total content of group XIII elements in the periodic table of element of not less than the nitrogen content (atom ppm) is sublimated and then re-crystallized to grow a silicon carbide single crystal, the silicon carbide single crystal re-crystallized has a low nitrogen content, and on the other hand, contains group XIII elements in an amount capable of forming a p-type semiconductor. Therefore, in the produced silicon carbide single crystal, compensation between a nitrogen atom acting as a donor and a group XIII element acting as an acceptor is suppressed effectively, and this silicon carbide single crystal is suitable as a p-type semiconductor.

In the method of producing a silicon carbide single crystal of <II-2>, since the above-mentioned silicon carbide powder has a nitrogen content of 50 mass ppm or less in <II-1>, the nitrogen content in the silicon carbide single crystal re-crystallized is extremely low, and on the other hand, group III elements are contained in an amount capable of forming a p-type semiconductor. Therefore, the produced silicon carbide single crystal is particularly suitable as a p-type semiconductor.

In the method of producing a silicon carbide single crystal of <II-3>, since a silicon carbide powder having a nitrogen content of 0.1 mass ppm or less and having a total content of group XIII elements in the periodic table of element of not less than the nitrogen content (atom ppm) is sublimated and then re-crystallized to grow a silicon carbide single crystal, the nitrogen content in the silicon carbide single crystal re-crystallized is extremely low, and on the other hand, group III elements are contained in an amount capable of forming a p-type semiconductor. Therefore, in the produced silicon carbide single crystal, compensation between a nitrogen atom acting as a donor and a group XIII element acting as an acceptor is suppressed effectively, and this silicon carbide single crystal is suitable as a p-type semiconductor.

In the method of producing a silicon carbide single crystal of <II-4>, since the group XIII element in the periodic table of element is aluminum in any of <II-1> to <II-3>, activation is easy, and the resulting silicon carbide single crystal is particularly suitable as a p-type semiconductor.

In the method of producing a silicon carbide single crystal of <II-5>, since the above-mentioned silicon carbide powder is obtained by calcinating a mixture containing at least a silicon source and a xylene-based resin in any of <II-1> to <II-4> and the nitrogen content in the silicon carbide powder is low, the nitrogen content in the silicon carbide single crystal re-crystallized is extremely low. Therefore, the produced silicon carbide single crystal is particularly suitable as a p-type semiconductor.

In the method of producing a silicon carbide single crystal of <II-6>, the above-mentioned silicon source is an alkoxysilane polymer in <II-5>. Therefore, the above-mentioned silicon carbide powder is obtained easily at low cost.

In the method of producing a silicon carbide single crystal of <II-7>, the mixture is obtained by adding an acid to the silicon source, then, adding the xylene-based resin in <II-5> or <II-6>. Therefore, the above-mentioned mixture in uniform condition is obtained extremely easily, and a silicon carbide single crystal is produced efficiently.

In the method of producing a silicon carbide single crystal of <II-8>, since the ratio of carbon contained in the xylene-based resin to silicon contained in the silicon source in the mixture in calcinating is 1.8 or less and consequently the amount of free carbon in the above-mentioned silicon carbide powder is small in any of <II-5> to <II-7>, a silicon carbide single crystal of high quality is obtained.

In the method of producing a silicon carbide single crystal of <II-9>, since the silicon carbide powder has a volume-average particle size of 50 to 400 μm in any of <II-1> to <II-8>, the volume-average particle size thereof is larger than that of a silicon carbide powder produced by CVD and the like, handling thereof is easy, and efficiency in producing a silicon carbide single crystal is excellent.

In the method of producing a silicon carbide single crystal of <II-10>, since the silicon carbide powder contains 30 mass % or less of a silicon carbide powder having crystal polymorphism of beta type (3C) in any of <II-1> to <II-9>, the volume-average particle size thereof is larger than that of a beta type silicon carbide powder produced by CVD and the like, handling thereof is easy, and efficiency in producing a silicon carbide single crystal is excellent.

In the method of producing a silicon carbide single crystal of <II-11>, the above-mentioned silicon carbide single crystal is grown while maintaining a convex shape of the growing surface throughout the all of growth process in any of <II-1> to <II-10>. Here, on the whole surface of the growing surface of the silicon carbide single crystal grown, the above-mentioned depressed concave part is not formed toward the reverse direction to its growing direction. Therefore, a silicon carbide single crystal of high quality having no breakage such as cracking and the like and containing no crystal defects present such as polycrystal, mixing of polymorphism, micropipe and the like is produced.

In the method of producing a silicon carbide single crystal of <II-12>, since the crystal of silicon carbide containing a silicon carbide single crystal is grown in a form approximating a peak in any of <II-1> to <II-11>, the above-mentioned depressed concave part is not formed at all toward the reverse direction to its growing direction, in the silicon carbide single crystal grown. Therefore, a silicon carbide single crystal of high quality having no breakage such as cracking and the like and containing no crystal defects present such as polycrystal, mixing of polymorphism, micropipe and the like is produced.

In the method of producing a silicon carbide single crystal of <II-13>, the above-mentioned crystal of silicon carbide containing a silicon carbide single crystal is composed solely of a silicon carbide single crystal in any of <II-1> to <II-12>. Therefore, a silicon carbide single crystal having large diameter is obtained, and there is no need of separation of the silicon carbide single crystal from a silicon carbide polycrystal, or the like.

In the method of producing a silicon carbide single crystal of <II-14>, the above-mentioned silicon carbide powder is accommodated in a reaction vessel, a seed crystal of the silicon carbide single crystal is placed at the end part approximately facing the silicon carbide powder in the reaction vessel, and growth of the crystal of silicon carbide containing the silicon carbide single crystal is conducted only at regions excepting adjacent parts to the peripheral surface part in the reaction vessel, at this end part, in any of <II-1> to <II-13>. Therefore, the above-mentioned depressed concave part is not formed toward the reverse direction to its growing direction, in the silicon carbide single crystal grown, further, a silicon carbide polycrystal does not grow in the condition of contact with the peripheral surface part in the reaction vessel, at the above-mentioned end part. Therefore, when the grown silicon carbide single crystal is cooled to room temperature, stress based on difference in thermal expansion is not applied concentratedly from the silicon carbide polycrystal side to the silicon carbide single crystal side, defects such as cracking and the like do not occur in the resulting silicon carbide single crystal. As a result, a silicon carbide single crystal of high quality having no breakage such as cracking and the like and containing no crystal defects present such as polycrystal, mixing of polymorphism, micropipe and the like is produced efficiently and infallibly.

In the method of producing a silicon carbide single crystal of <II-15>, the above-mentioned silicon carbide powder is accommodated at one end side in the reaction vessel, a seed crystal of the silicon carbide single crystal is placed at another end side in the reaction vessel, a sublimation atmosphere is formed so that the silicon carbide powder can be sublimated by a first heating means placed at the above-mentioned one end side, a re-crystallization atmosphere is formed so that silicon carbide sublimated by the above-mentioned first heating means can be re-crystallized only around the seed crystal of the silicon carbide single crystal by a second heating means placed at the above-mentioned another end side, and the silicon carbide is re-crystallized on the above-mentioned seed crystal of the silicon carbide single crystal, in any of <II-1> to <II-14>.

In the method of producing a silicon carbide single crystal, heating for formation of a sublimation atmosphere so that the above-mentioned silicon carbide powder can be sublimated is conducted by the first heating means and formation of a re-crystallization atmosphere so that re-crystallization is possible only on the seed crystal of the silicon carbide single crystal is conducted by a second heating means, consequently, re-crystallization can be conducted selectively only on the seed crystal of the silicon carbide single crystal or around it, and the above-mentioned silicon carbide polycrystal does not grow in the condition of contact with the peripheral surface part in the reaction vessel, at the above-mentioned end part. When the grown silicon carbide single crystal is cooled to room temperature, stress based on difference in thermal expansion is not applied concentratedly from the silicon carbide polycrystal side to the silicon carbide single crystal side, and defects such as cracking and the like do not occur in the resulting silicon carbide single crystal. As a result, a silicon carbide single crystal of high quality having no breakage such as cracking and the like and containing no crystal defects present such as polycrystal, mixing of polymorphism, micropipe and the like is produced.

In the method of producing a silicon carbide single crystal of <II-16>, the above-mentioned first heating means and the second heating means are a coil which can be induction-heated in <II-15>. Therefore, the temperature control of the above-mentioned first heating means for formation of the above-mentioned sublimation atmosphere and the temperature control of the above-mentioned second heating means for formation of the above-mentioned re-crystallization atmosphere are conducted easily and infallibly by induction-heating by the coil.

In the method of producing a silicon carbide single crystal of <II-17>, the current value of induction heating current in the first heating means is larger than the current value of induction heating current in the second heating means in <II-16>. Therefore, the temperature of the re-crystallization atmosphere around the above-mentioned seed crystal is maintained lower than the temperature of the above-mentioned sublimation atmosphere, and re-crystallization is conducted easily.

In the method of producing a silicon carbide single crystal of <II-18>, since the current value of induction heating current in the above-mentioned second heating means is continuously or gradually decreased with increase in the diameter of a silicon carbide single crystal grown in <II-16> or <II-17>. Therefore, the heating amount by the above-mentioned second heating means is controlled low with growth of the above-mentioned silicon carbide single crystal, consequently, re-crystallization is conducted only around the above-mentioned silicon carbide single crystal continuing to grow, and a polycrystal does not grow around the above-mentioned silicon carbide single crystal.

In the method of producing a silicon carbide single crystal of <II-19>, when the temperature of one end side accommodating a silicon carbide powder is represented by $T_1$, the temperature of another end side containing a seed crystal of a silicon carbide single crystal placed is represented by $T_2$, and the temperature of adjacent parts to the inner peripheral surface part of the reaction vessel, at this another end side, is represented by $T_3$, in the reaction vessel, then, $T_3-T_2$ and $T_1-T_2$ increase continuously or gradually in any of <II-15> to <II-18>. When $T_1-T_2$ increases continuously or gradually, even if a silicon carbide single crystal continues to grow toward the above-mentioned one end side with the lapse of time, the crystal growth peak side of the silicon carbide single crystal is always maintained at the condition of easy re-crystallization. On the other hand, when $T_3-T_2$ increases continuously or gradually, even if a silicon carbide single crystal continues to grow toward the outer peripheral direction at the above-mentioned another end side with the lapse of time, the crystal growth outer peripheral end side of the silicon carbide single crystal is always maintained at the condition of easy re-crystallization. As a result, production of a silicon carbide polycrystal is effectively suppressed, and the silicon carbide single crystal continues to grow toward the direction of larger thickness while enlarging the diameter, and finally, a silicon carbide single crystal of larger diameter containing no incorporated silicon carbide polycrystal and the like is obtained The silicon carbide single crystal of <II-20> is produced by the method of producing a silicon carbide single crystal according to any of <II-1> to <II-19>. Therefore, the resulting silicon carbide single crystal has a low nitrogen content, and is particularly suitable as a p-type semiconductor.

In the silicon carbide single crystal of <II-21>, the number of crystal defects in the form of hollow pipe optically image-detected without break is 100 or less per cm² in <II-20>.

Therefore, this silicon carbide single crystal has extremely high quality, is excellent particularly in insulation breakdown property, heat resistance, radiation resistance and the like, and particularly suitable for electronic devices such as a semiconductor wafer and the like, optical devices such as a light emitting diode and the like.

In the silicon carbide single crystal of <II-22>, the total content of the above-mentioned impurity elements is 10 mass ppm or less in <II-20> or <II-21>. Therefore, this silicon carbide single crystal has extremely high quality.

In the silicon carbide single crystal of <II-23>, the volume resistivity is $1 \times 10^1$ Ωcm or less in any of <II-20> or <II-22>. Therefore, this silicon carbide single crystal is a semiconductor or conductor.

The silicon carbide single crystal of <II-24> has a nitrogen content of 0.01 mass ppm or less in any of <II-20> to <II-23>, consequently, the nitrogen content in the silicon carbide single crystal to be re-crystallized is extremely low. Therefore, the produced silicon carbide single crystal is particularly suitable as a p-type semiconductor.

In the method of producing a silicon carbide single crystal of <II-25>, the calcination is conducted by heating at 100 to 1000° C./h up to 1300 to 1600° C., then, heating at 50 to 300° C./h up to 1800 to 2100° C., then, maintaining at 1800 to 2100° C. for 240 minutes or less, in a non-oxidizing atmosphere in any of <II-4> to <II-19>. Therefore, a silicon carbide single crystal is produced efficiently.

In the method of producing a silicon carbide single crystal of <II-26>, in calcinating, a halogen or hydrogen halide is added in an amount of 1 to 5 vol % to a silicon source or carbon source in any of <II-4> to <II-19> and <II-25>. Therefore, in the resulting silicon carbide single crystal, the amount of impurity elements is suppressed low effectively.

In the method of producing a silicon carbide single crystal of <II-27>, after calcination, post treatment by heating is conducted in any of <II-4> to <II-19> and <II-24> to <II-26>. Therefore, impurity elements are removed and a silicon carbide single crystal of high purity and high quality is produced efficiently.

In the method of producing a silicon carbide single crystal of <II-28>, since the post treatment is conducted at 2150 to 2400° C. in <II-27>, impurity elements are removed, and a silicon carbide single crystal of high purity and high quality is produced efficiently.

In the method of producing a silicon carbide single crystal of <II-29>, since the post treatment is conducted for 3 to 8 hours in an argon atmosphere in <II-27> or <II-28>, impurity elements are removed, and a silicon carbide single crystal of high purity and high quality is produced efficiently.

In the method of producing a silicon carbide single crystal of <II-30>, since the volume-average particle size ($D_{50}$) of a silicon carbide powder is 100 to 500 μm in any of <II-1> to <II-19> and <II-24> to <II-29>, sublimation is conducted efficiently, and a silicon carbide single crystal is produced efficiently.

In the method of producing a silicon carbide single crystal of <II-31>, since the silicon carbide powder has a particle size distribution ($D_{90}/D_{10}$) of 4 or less in any of <II-1> to <II-19> and <II-24> to <II-30>, sublimation is conducted efficiently, and a silicon carbide single crystal is produced efficiently.

In the method of producing a silicon carbide single crystal of <II-32>, in the above-mentioned reaction vessel, the temperature of the re-crystallization atmosphere is lower than the temperature of the sublimation atmosphere by 30 to 300° C. in any of <II-12> to <II-19> and <II-24> to <II-31>. Therefore, re-crystallization is conducted easily and smoothly on the above-mentioned seed crystal of the silicon carbide single crystal and around of it.

In the method of producing a silicon carbide single crystal of <II-33>, the above-mentioned reaction vessel is a crucible placed in a quartz tube in any of <II-12> to <II-19> and <II-24> to <II-32>. Therefore, sublimation and re-crystallization of the above-mentioned silicon carbide powder and growth of the above-mentioned silicon carbide single crystal are conducted in a closed system in the quartz tube, consequently, control of them is easy.

In the method of producing a silicon carbide single crystal of <II-34>, the surface of adjacent parts to the inner peripheral surface part in the reaction vessel, at the above-mentioned another end part is made of vitreous carbon in any of <II-12> to <II-19> and <II-24> to <II-33>. Therefore, re-crystallization does no occur easily at the above-mentioned adjacent parts to the inner peripheral surface part in the reaction vessel, at the above-mentioned another end part, as compared with regions other than the adjacent parts. As a result, a crystal of silicon carbide does not grow at the above-mentioned adjacent parts at the above-mentioned another end part, and a silicon carbide single crystal re-crystallizes and grows selectively only at regions other than the adjacent parts.

In the method of producing a silicon carbide single crystal of <II-35>, an interference preventing means is placed between the first heating means and the second heating means, so that induction current can be passed and which prevents interference between the first heating means and the second heating means by passing the induction current in any of <II-12> to <II-19> and <II-24> to <II-34>. Therefore, when induction heating by the above-mentioned first heating means and induction heating by the above-mentioned second heating means are conducted simultaneously, induction current flows through the interference preventing means, and the interference preventing means minimizes and prevents interference between them.

In the method of producing a silicon carbide single crystal of <II-36>, the above-mentioned interference preventing means is a coil which can be cooled in <II-35>. Even if the coil is heated by flow of induction current, the coil is cooled, consequently, the coil does not heat the above-mentioned reaction vessel. Therefore, temperature control of the above-mentioned reaction vessel is easy.

In the method of producing a silicon carbide single crystal of <II-37>, the above-mentioned one end part is the lower end part and the above-mentioned another end part is the upper end part in any of <II-12> to <II-19> and <II-24> to <II-36>. Therefore, the above-mentioned silicon carbide powder is accommodated at the lower part in the above-mentioned reaction vessel, sublimation of the silicon carbide powder is conducted smoothly, and the above-mentioned silicon carbide single crystal grows toward lower direction, namely, toward gravity direction, in the condition of no excess load.

In the method of producing a silicon carbide single crystal of <II-38>, the region for effecting growth of a silicon carbide single crystal and the region placed at the outer periphery of the growth region and adjacent to the inner peripheral surface part of the reaction vessel are formed of different members, and one end of a member forming the above-mentioned region for effecting growth of a silicon carbide single crystal is exposed into the reaction vessel and another end thereof is exposed out of the reaction vessel, in any of <II-12> to <II-19> and <II-24> to <II-37>. Since the region for effecting growth of a silicon carbide single crystal (inner region) and the region placed at the outer periphery of the growth region and adjacent to the inner peripheral surface part of the reaction vessel (outer region) are formed of different members, when heating is conducted by the above-mentioned second heating means, the above-mentioned outer region situated at the second heating means side is heated easily, while the above-mentioned inner region is not easily heated due to difference in contact resistance from the outer region. Therefore, even if heating is conducted by the above-mentioned second heating means, difference in temperature occurs between the above-mentioned outer region and the above-mentioned inner region, and the inner region is not easily heated as compared with the outer region, consequently, temperature is kept low and the above-mentioned re-crystallization of silicon carbide is conducted easily. Further, since the opposite side to the inner side of the reaction vessel in the above-mentioned member forming the inner region is exposed out of the reaction vessel, and heat is easily released out of the reaction vessel, therefore, when heating is conducted by the above-mentioned second heating means, the above-mentioned inner region is not easily heated as compared with the above-mentioned outer region, consequently, difference in temperature occurs between the above-mentioned outer region and the above-mentioned inner region, and the temperature of the above-mentioned inner region is kept lower than the temperature of the above-mentioned outer region and the above-mentioned re-crystallization of silicon carbide is conducted easily. As a result, a silicon carbide single crystal does not grow easily in the above-mentioned outer region, and a silicon carbide single crystal re-crystallizes and grows selectively only in the inner region.

(Method of Producing Silicon Carbide Single Crystal (I))

In the method of producing a silicon carbide single crystal according to the present invention, a silicon carbide powder having a nitrogen content of 100 mass ppm or less is sublimated and then re-crystallized to grow a silicon carbide single crystal.

—Silicon Carbide Powder (I)—

As the above-mentioned silicon carbide powder, those having a nitrogen content of 100 mass ppm or less and an each content of impurity elements of 0.1 mass ppm or less or those having a nitrogen content of 0.1 mass ppm or less is listed.

The nitrogen content of the above-mentioned silicon carbide powder is required to be 100 mass ppm or less, preferably 50 mass ppm or less, more preferably 40 mass ppm or less, particularly preferably 0.1 mass ppm or less.

When the above-mentioned nitrogen content is 100 mass ppm or less, 50 mass ppm or less and 40 mass ppm or less, it is further required that each content of impurity elements is 0.1 mass ppm or less, and in this case, a silicon carbide single crystal of high resistance is obtained, and this silicon carbide single crystal can be suitably utilized as a semi-insulating or insulating single crystal substrate, on the other hand, when the above-mentioned nitrogen content is 0.1 mass ppm or less, a silicon carbide single crystal of high resistance is obtained even if each content of impurity elements is not 0.1 mass ppm or less, and this silicon carbide single crystal can be suitably utilized as a semi-insulating or insulating single crystal substrate and the like.

The above-mentioned nitrogen content can be measure, for example, by using an oxygen and nitrogen simultaneous analyzing apparatus, secondary ion mass spectrometer, glow discharge mass spectrometer, photoluminescence measuring apparatus and the like.

Each content of impurity elements in the above-mentioned silicon carbide powder is preferably 0.3 mass ppm or less, more preferably 0.1 mass ppm or less.

When each content of impurity elements is 0.3 mass ppm or less, it is further required that the above-mentioned nitrogen content is 0.1 mass ppm or less, and in this case, a silicon carbide single crystal of extremely high resistance is obtained, and this silicon carbide single crystal can be suitably utilized as a semi-insulating or insulating single crystal substrate, on the other hand, when the above-mentioned each content of impurity elements is 0.1 mass ppm or less, a semi-insulating or insulating silicon carbide single crystal is obtained even if the above-mentioned nitrogen content is not 0.1 mass ppm or less, and this silicon carbide single crystal can be suitably utilized as a semi-insulating or insulating single crystal substrate and the like.

(Method of Producing Silicon Carbide Single Crystal (II))

In the method of producing a silicon carbide single crystal according to the present invention, a silicon carbide powder having a nitrogen content of 100 mass ppm or less, having an each content of impurity elements excepting group XIII elements in the periodic table of element of 0.1 mass ppm or less and having a total content of group XIII elements in the periodic table of element of not less than the nitrogen content (atom ppm) or a silicon carbide powder having a nitrogen content of 0.1 mass ppm or less and having a total content of group XIII elements in the periodic table of element of not less than the nitrogen content (atom ppm) is sublimated and then re-crystallized to grow a silicon carbide single crystal.

—Silicon Carbide Powder (II)—

As the above-mentioned silicon carbide powder, those having a nitrogen content of 100 mass ppm or less, having an each content of impurity elements excepting group XIII elements in the periodic table of element of 0.1 mass ppm or less and having a total content of group XIII elements in the periodic table of element of not less than the nitrogen content (atom ppm) or those having a nitrogen content of 0.1 mass ppm or less and having a total content of group XIII elements in the periodic table of element of not less than the nitrogen content (atom ppm) are listed.

The nitrogen content of the above-mentioned silicon carbide powder is required to be 100 mass ppm or less, preferably 50 mass ppm or less, more preferably 40 mass ppm or less, particularly preferably 0.1 mass ppm or less.

When the above-mentioned nitrogen content is 100 mass ppm or less, 50 mass ppm or less and 40 mass ppm or less, it is further required that each content of impurity elements excepting group XIII elements is 0.1 mass ppm or less, and in this case, if the total convent of group XIII elements is in the range described later, a silicon carbide single crystal which can be suitably utilized as a p-type semiconductor and the like is obtained since compensation between a nitrogen atom acting as a donor and a group XIII element acting as an acceptor is suppressed effectively in the produced silicon carbide single crystal, on the other hand, when the above-mentioned nitrogen content is 0.1 mass ppm or less, if the total convent of group XIII elements is in the range described later even if each content of impurity elements excepting group XIII elements is not 0.1 mass ppm or less, a silicon carbide single crystal which can be suitably utilized as a p-type semiconductor and the like is obtained since compensation between a nitrogen atom acting as a donor and a group XIII element acting as an acceptor is suppressed effectively in the produced silicon carbide single crystal.

The above-mentioned nitrogen content can be measure, for example, by using an oxygen and nitrogen simultaneous analyzing apparatus, secondary ion mass spectrometer, photoluminescence measuring apparatus and the like.

The above-mentioned impurity elements are elements belonging to group I to group XVII elements in the periodic table of 1989 IUPAC inorganic chemical nomenclature revision and having an atomic number of 3 or more (excluding, atomic numbers 6 to 8 and 14)(hereinafter, the same).

The total content of group XIII elements in the periodic table of element in the above-mentioned silicon carbide powder can be appropriately selected depending on the use of the resulted silicon carbide single crystal, object and the like, and required to be not less than the above-mentioned nitrogen content (atom ppm).

When the above-mentioned total content of group XIII elements in the periodic table of element is not less than the above-mentioned nitrogen content (mass ppm), it is advantageous in that the resulting silicon carbide single crystal can be suitably used as a p-type semiconductor.

As the above-mentioned group XIII element, boron (B), aluminum (Al), gallium (Ga), indium (In) and thallium (Tl) are listed. These may be contained alone or in combination of two or more in the above-mentioned silicon carbide powder. Of them, aluminum (Al) is particularly preferable since it can be activated easily. In the present invention, the above-mentioned silicon carbide powders containing only aluminum (Al) as the above-mentioned group XIII element are particularly preferable.

The method of allowing the above-mentioned group XIII element to be contained in the above-mentioned silicon carbide powder is not particularly restricted, and can be appropriately selected depending on the object, and exemplified are a method in which a metal single body of group XIII elements (for example, aluminum powder and the like) and a compound containing group XIII elements (for example, oxides such as alumina and the like, hydroxides such as aluminum hydroxide and the like, chlorides such as aluminum chloride, organic substances such as ethyl aluminate and the like are listed, and of them, organic substances such as ethyl aluminate and the like and chlorides such as aluminum hydroxide and the like are preferable from the standpoint of purity (likewise in B, Ga and the like)) are used, and these are appropriately added in small amount in a process of producing the silicon carbide powder, and other methods. In this case, it is necessary that the above-mentioned nitrogen content and the above-mentioned each content of impurity elements in the resulted silicon carbide powder are in the above-mentioned numerical value ranges.

As the above-mentioned silicon carbide powder, any of 4H, 6H, 15R, 3C and mixtures thereof may be used. The grade of the above-mentioned 3C silicon carbide powder is not particularly restricted, and those commercially available generally may be used, however, those of high purity are preferable.

The volume-average particle size ($D_{50}$) of the above-mentioned silicon carbide powder is preferably from 0.5 to 800 μm, more preferably from 50 to 400 μm.

When the above-mentioned volume-average particle size ($D_{50}$) is 0.5 to 800 μm, workability in the case of production of a silicon carbide single crystal is excellent, and packing in filling is also excellent, and when from 50 to 400 μm, workability is further excellent and packing in filling is also further excellent as compared with a fine powder produced by a CVD method and the like.

The particle size distribution ($D_{90}/D_{10}$) (based on volume-average particle size) of the above-mentioned silicon carbide powder is preferably 4.0 or less, more preferably 3.5 or less from the standpoint of uniformity of the silicon carbide powder.

The above-mentioned silicon carbide powder contains β-SiC (as crystal polymorphism, "3C") preferably in an amount of 30 mass % or less (preferably contains α-SiC in an amount of over 70 mass %), more preferably in an amount of 10 mass % or less (more preferably contains α-SiC in an amount of over 90 mass %), from the standpoint of stability of sublimation speed.

Selection of the α-SiC or β-SiC can be judged from matching peak in ATSM library data and the like.

The silicon carbide powder is obtained by calcinating a mixture containing at least a silicon source and a xylene-based resin.

—Silicon Source—

As the above-mentioned silicon source, silicon compounds are listed.

The above-mentioned silicon compound may be liquid or solid, and these may be used in combination, and preferable is use of at least one liquid compound.

As the above-mentioned liquid compound, alkoxysilane compounds and the like are suitably listed.

As the above-mentioned alkoxysilane compound, for example, alkoxysilanes, alkoxysilane oligomers, alkoxysilane polymers and the like are listed.

In the above-mentioned alkoxysilane, alkoxysilane oligomer and alkoxysilane polymer, the alkoxysilane or alkoxysilane unit may be any of monoalkoxysilanes, dialkoxysilanes, trialkoxysilanes and tetraalkoxysilanes, and tetraalkoxysilanes are preferable.

As the above-mentioned alkoxysilane, for example, methoxysilane, ethoxysilane, propoxysilane, butoxysilane and the like are listed, and of them, ethoxysilane is preferable from the standpoint of handling.

The above-mentioned alkoxysilane oligomer is a low molecular weight polymer having a degree of polymerization of about 2 to 15, and specific examples thereof include methoxysilane oligomer, ethoxysilane oligomer, propoxysilane oligomer, butoxysilane oligomer and the like, and of them, ethoxysilane oligomer is preferable from the standpoint of handling.

The above-mentioned alkoxysilane polymer is a high molecular weight polymer having a degree of polymerization of over about 15, and specific examples thereof include methoxysilane polymer, ethoxysilane polymer, propoxysilane polymer, butoxysilane polymer and the like, and of them, ethoxysilane polymer is preferable from the standpoint of handling.

As the above-mentioned solid compound, for example, silicon oxides such as SiO, silica sol (colloidal ultrafine silica-containing liquid, containing inside an OH group, alkoxyl group), silicon dioxide (silica gel, fine silica, quartz powder) and the like are listed.

In the present invention, the above-mentioned silicon compounds may be used alone or in combination of two or more, and of these silicon compounds, mixtures of ethoxysilane oligomers, ethoxysilane polymers, ethoxysilane oligomers with fine powdery silica, and the like are preferable, and an ethoxysilane dimer, ethoxysilane polymer and the like are more preferable, from the standpoint of excellent homogeneity and handling property.

As the above-mentioned silicon compound, those of high purity are preferable, those having an impurity content of 20 mass ppm or less is preferable, and those having an impurity content of 5 mass ppm or less is more preferable.

Here, the above-mentioned impurity elements are elements belonging to group I to group XVII elements in the periodic table of 1989 IUPAC inorganic chemical nomenclature revision and having an atomic number of 3 or more (excluding, atomic numbers 6 to 8 and 14) (hereinafter, the same).

As the above-mentioned silicon compound, those of high purity are preferable, those having an impurity content of 20 mass ppm or less is preferable, and those having an impurity content of 5 mass ppm or less is more preferable.

—Xylene-based Resin—

The above-mentioned xylene-based resin has high carbon remaining ratio, low content of the above-mentioned impurity elements, and scarcely contains nitrogen in the synthesis process. This xylene-based resin is used as a carbon source.

As the above-mentioned xylene-based resin, a xylene homopolymer (hereinafter, simply abbreviated as xylene polymer), xylene copolymers and the like are listed, and xylene polymers are preferable, resol type xylene polymers are more preferable, from the standpoint of mixing of the above-mentioned impurity elements.

The above-mentioned xylene-based resin may be that which is appropriately synthesized or commercially available.

The above-mentioned xylene-based resin may be an oligomer or polymer, and the degree of polymerization is not particularly restricted and can be appropriately selected, and for example, in the case of the above-mentioned oligomer, the degree of polymerization is preferably from 3 to 15 and in the case of the above-mentioned polymer, the degree of polymerization is preferably from 15 to 1200.

The above-mentioned degree of polymerization can be measured, for example, by a general gel permeation chromatography, osmotic pressure method, GC-MS and the like.

As the above-mentioned xylene-based resin, those of high purity are preferable, those having an impurity element content of 20 mass ppm or less is preferable, and those having an impurity element content of 5 mass ppm or less is more preferable.

—Mixture—

The above-mentioned mixture contains the above-mentioned silicon source and the above-mentioned xylene-based resin.

The ratio of the above-mentioned silicon source to the above-mentioned xylene-based resin in the above-mentioned mixture is not particularly restricted, and can be appropriately selected depending on the object, and it is preferable that the ratio of the above-mentioned silicon source to the above-mentioned xylene-based resin is previously determined so that the amount of free carbon in the resulted silicon carbide powder is small.

The above-mentioned amount of free carbon can be controlled by appropriately adjusting the ratio of carbon contained in the above-mentioned xylene-based resin to silicon contained in the above-mentioned silicon source (hereinafter, referred to as "C/Si ratio") in the above-mentioned mixture.

Here, the above-mentioned C/Si ratio is represented by the following formula: C/Si ratio=(amount (g) of the above-mentioned xylene-based resin×carbon remaining ratio/12.011)/0.4×(amount (g) of the above-mentioned silicon source/60.0843) (here, the above-mentioned "amount of xylene-based resin" means, when the xylene-based resin is a solution, the amount of the above-mentioned xylene-based resin contained in the solution, and the above-mentioned "amount of silicon source" means, when the silicon source is a solution, the amount of the above-mentioned silicon source contained in the solution).

The above-mentioned C/Si ratio can be measured by elementary-analyzing a carbide intermediate obtained by carbonating the above-mentioned mixture at 1000° C.

Stoichiometrically, the amount of the free carbon in a silicon carbide powder obtained when the C/Si ratio is 3.0 is 0%, however, actually, the above-mentioned free carbon may be generated even if the C/Si ratio is small by vaporization of a SiO gas generated simultaneously.

The method of preparing the above-mentioned mixture is not particularly restricted, and can be appropriately selected depending on the object, and particularly preferable is a method in which an acid is added to the above-mentioned silicon source, then, the above-mentioned xylene-based resin is added. In this case, the above-mentioned silicon source and the above-mentioned xylene-based resin can be mixed uniformly, and phase separation does not occur.

As the method of preparing the above-mentioned mixture, when other methods than the method in which an acid is added to the above-mentioned silicon source, then, the above-mentioned xylene-based resin is added are adopted, the above-mentioned silicon source and the above-mentioned xylene-based resin cannot be mixed uniformly, and phase separation may occur. In this case, the mixture in the condition of phase separation can be made into a uniform mixture by heating.

Though the above-mentioned mixture is usually prepared without addition of a halogen compound, in the case of obtaining a silicon carbide powder of ultra high purity, a halogen compound may be added in an amount of 0.5 to 5 mass % to the above-mentioned mixture.

When the above-mentioned halogen amount is added to the above-mentioned mixture, the above-mentioned impurity element mixed in the above-mentioned mixture is halogenated and, in the subsequent calcinations, vaporized and scattered to be effectively removed, consequently obtaining a silicon carbide powder of ultra high purity. Specifically, each content of the above-mentioned impurity elements in the resulting silicon carbide powder can be made to 0.1 mass ppm or less by adding the above-mentioned halogen compound.

When the above-mentioned is added, it is preferable that the above-mentioned is reacted for 10 to 30 minutes near the decomposition temperature of the halogen compound added, and the mixture is heated up to temperature of the subsequently calcinations, from the standpoint of removal of the above-mentioned impurity elements.

Regarding the above-mentioned halogen compound, when the compound is liquid, it is preferable that a liquid halogen compound such as ammonium chloride, hydrochloric acid aqueous solution and the like is added to the above-mentioned mixture, and when the compound is solid (when a thermoplastic xylene-based resin is contained as the above-mentioned xylene-based resin, and a solid compound is contained as the above-mentioned silicon source), it is preferable that a solid halogen compound such as a halogen-containing polymer such as polyvinyl chloride, chlorinated polyethylene, polychloroprene and the like is added to the above-mentioned mixture.

The above-mentioned may be solid or liquid, and in the case of liquid, it may be hardened to be solid before the above-mentioned calcinations.

The method of hardening is not particularly restricted and can be appropriately selected according to the object, and a method of cross-linking by hearing, a method of hardening with a hardening catalyst, a method using electronic beam and radiation, and other methods are listed.

The above-mentioned heating is conducted at temperatures of about 50° C. or more for about 1 hour or more.

The above-mentioned hardening catalyst is not particularly restricted and can be appropriately selected according to the object, and exemplified are acids such as toluenesulfonic acid, toluenecarboxylic acid, acetic acid, oxalic acid, hydrochloric acid, sulfuric acid and the like, and of them, those containing no nitrogen atom are preferable.

It is preferable to heat the above-mentioned mixture at from 500 to 1000° C. under non-oxidizing atmosphere, and it is more preferable to heat the above-mentioned mixture at from 500 to 600° C. under a non-oxidizing atmosphere for 10 to 30 minutes, then, at from 800 to 1000° C. under a non-oxidizing atmosphere for 30 minutes to 2 hours, before the above-mentioned calcinations.

The above-mentioned non-oxidizing atmosphere is not particularly restricted and can be appropriately selected according to the object, and for example, atmospheres of nitrogen, argon and the like are mentioned, and of them, an argon atmosphere is preferable.

—Calcination—

The calcinations is not particularly restricted in the method, conditions and the like, and can be appropriately selected according to the particle size of a silicon carbide single crystal to be obtained, and the like, and from the standpoint of more efficient production of a silicon carbide powder, it is preferable that the above-mentioned mixture is heated at a rate of 100 to 1000° C./h up to 1300 to 1600° C. under a non-oxidizing atmosphere, then, the mixture is heated at a rate of 50 to 300° C./h up to 1900 to 2100° C., then, the mixture is kept at 1900 to 2100° C. for 240 minutes or less.

Carbide of silicon and carbon is obtained by heating the above-mentioned mixture at 800 to 1000° C. In this case, the yield of the above-mentioned carbide based on the above-mentioned mixture is not particularly restricted, however, higher yield is more preferable, and a yield of 50 mass % or more is preferable.

The above-mentioned non-oxidizing atmosphere is not particularly restricted and can be appropriately selected according to the object, and for example, atmospheres of inert gases such as nitrogen, argon and the like are mentioned, and of them, an argon atmosphere is preferable since argon is not reactive even at high temperature.

In the above-mentioned calcination, it is preferable that the above-mentioned inert gas is introduced into a reaction vessel accommodating the above-mentioned mixture. This case is advantageous in that a SiO gas, CO gas and the like containing the above-mentioned impurity elements generated in the above-mentioned calcination can be discharged or removed out of the reaction vessel.

In the above-mentioned calcination, it is preferable that a halogen or hydrogen halide is added in an amount of 1 to 5 vol % to the above-mentioned silicon source and the above-mentioned xylene-based resin since then the amount of the above-mentioned impurity elements contained in the resulting silicon carbide powder can be controlled.

Though the above-mentioned C/Si ratio in the above-mentioned calcination cannot generally be defined since it can vary depending on the pressure in the calcination, it is preferably 1.85 or less, more preferably 1.55 or less since then generation of free carbon can be effectively suppressed.

—Other Treatment—

Other treatments are not particularly restricted and can be appropriately selected according to the object, and for example, the following post treatments and the like are suitably listed.

The above-mentioned post treatment is conducted, after the above-mentioned calcination, preferably at 2000° C. or more, more preferably at 2100° C. or more, particularly preferably at 2150 to 2400° C.

The time of the above-mentioned post treatment is not particularly restricted and can be appropriately selected according to the object, and usually 5 minutes or more, preferably from about 3 to 8 hours, more preferably from about 4 to 6 hours.

The above-mentioned post treatment is preferably conducted under the above-mentioned non-oxidizing atmosphere, and of the non-oxidizing atmospheres, an argon atmosphere is preferable since argon is not reactive even at high temperature.

The above-mentioned post treatment is advantageous in that the above-mentioned impurity elements are removed, and a silicon carbide powder of high quality having high purity, large particle size and narrow particle size distribution is obtained.

An apparatus and the like used in the above-mentioned production of a silicon carbide powder are not particularly restricted and can be appropriately selected according to the object.

The above-mentioned production of a silicon carbide powder may be effected in the mode of continuous treatment, or in the mode of batch treatment. The above-mentioned calcination and the above-mentioned post treatment may be conducted continuously in one heating furnace, or conducted in batch-wise fashion in separate heating furnaces.

The above-mentioned silicon carbide powders are as described above, and in the present invention, a mixture of the silicon carbide powder with a sintered body of the silicon carbide powder or a sintered body of the silicon carbide powder may be used, instead of the above-mentioned silicon carbide powders.

Sublimation and re-crystallization of the above-mentioned silicon carbide powder can be conducted in a reaction vessel.

The above-mentioned reaction vessel is not particularly restricted and can be appropriately selected according to the object, and it is preferable that the reaction vessel can accommodate inside the above-mentioned silicon carbide powder, and the reaction vessel has an end part on which the above-mentioned seed crystal of a silicon carbide single crystal can be placed, at a position approximately facing the above-mentioned silicon carbide powder.

The form of the above-mentioned end part is not particularly restricted, and for example, an approximate plane form is preferable.

The part in which the above-mentioned silicon carbide powder is accommodated is not particularly restricted, and this is preferable an end part approximately facing the above-mentioned end part on which the seed crystal of a silicon carbide single crystal can be placed. In this case, the inside of the above-mentioned reaction vessel is in the form of cylinder, however, the axis of the cylinder may be linear of curved, and the sectional form vertical to the axis direction of the cylinder may be in the form of circle, or polygon. As the preferable example of this circle, those having a linear axis and having a sectional form vertical to the axis direction are suitably listed.

When two end parts are present in the above-mentioned reaction vessel, the above-mentioned silicon carbide powder is accommodated in one end side, and the seed crystal of a silicon carbide single crystal is placed on another end side. Hereinafter, this one end part may be referred to as "silicon carbide powder accommodation part", and this another end part may be referred to as "seed crystal placing part".

The form of the above-mentioned one end part (silicon carbide powder accommodation part) is not particularly restricted, and may be in the form of plane, or, a structure for promoting soaking (for example, convex part and the like) may appropriately provided.

In the above-mentioned reaction vessel, it is preferable that the above-mentioned another end part (seed crystal placing part) is designed so as to enable attaching and detaching thereof. This case is advantageous in that a silicon carbide single crystal grown can be easily removed from the reaction vessel only by detaching the above-mentioned another end part (seed crystal placing part).

As such a reaction vessel, suitably mentioned are a reaction vessel having a vessel body which can accommodate a silicon carbide powder, and a lid body which can be attached and detached from the vessel body and can place a seed crystal of a silicon carbide single crystal approximately at the center of a surface facing the silicon carbide powder accommodated in the vessel body when amounted on the vessel body, and other vessels.

The positional relation of the above-mentioned one end part (silicon carbide powder accommodating part) and the above-mentioned another and part (seed crystal placing part) is not particularly restricted and can be appropriately selected according to the object, and preferable is an aspect in which the above-mentioned one end part (silicon carbide powder accommodating part) is the lowest part and the above-mentioned another and part (seed crystal placing part) is the top part, namely, the above-mentioned one end part (silicon carbide powder accommodating part) and the above-mentioned another and part (seed crystal placing part) are positioned along the gravity direction. This case is preferable in that sublimation of the above-mentioned silicon carbide powder is effected smoothly, and growth of the above-mentioned silicon carbide single crystal is conducted toward the lower direction, namely, toward the gravity direction, in the condition of no excess load.

At the above-mentioned one end part (silicon carbide powder accommodating part), for example, a member formed of a material excellent in heat conductivity may be placed, for the purpose of conducting sublimation of the above-mentioned silicon carbide powder efficiently.

As this member, for example, a reverse pyramidal or reverse trapezoidal pyramidal member which the outer periphery can be in close contact with the periphery surface part in the above-mentioned reaction vessel and the diameter of the inside part gradually increases with approximating the above-mentioned another and part (seed crystal placing part), and the like are suitably listed.

The part exposed out of the above-mentioned reaction vessel may be endowed with thread cutting, concave part for measuring temperature, and the like, and it is preferable that this concave part for measuring temperature is at least one of the above-mentioned one end part and the above-mentioned another end part.

The material of the above-mentioned reaction vessel is not particularly restricted and can be appropriately selected according to the object, and preferably formed of a material excellent in durability, heat resistance, heat conductivity and the like, and particularly preferable is graphite since, additionally, mixing of polycrystal and polymorphism due to generation of impurities is little and control of sublimation and re-crystallization of the above-mentioned silicon carbide powder is easy, and the like.

The above-mentioned reaction vessel may be formed of a single member, or may be formed or two or more members and the member can be appropriately selected according to the object. In the case of formation of two or members, it is preferable that the above-mentioned another end part (seed crystal placing part) is formed of two or more members, and it is more preferable that the center part of the above-mentioned another end part (seed crystal placing part) and the outer periphery part are formed of different members since then temperature difference or temperature gradient can be formed, specifically, it is particularly preferable that a region on which a silicon carbide single crystal is grown (inner region) as the center part and a region situated at the periphery of the above-mentioned inner region and adjacent to the inner periphery part of the reaction vessel (outer region) as the outer periphery part are formed of different members, and one end of the member forming the inner region is exposed into the reaction vessel and another end thereof is exposed out of the reaction vessel.

In this case, when the above-mentioned another end part (seed crystal placing part) is heated from the outside, though the above-mentioned outer region is easily heated, the above-mentioned inner region is not easily heated due to contact resistance with the above-mentioned outer region, consequently, difference in temperature occurs between the above-mentioned outer region and the above-mentioned inner region, and the temperature of the inner region is maintained slightly lower than the temperature of the outer region, as a result, re-crystallization can be easily caused at the inner region than the outer region. Further, since the above-mentioned another end of the member forming the above-mentioned inner region is exposed out of the above-mentioned reaction vessel, the inner region can easily release heat out of the above-mentioned reaction vessel, consequently, silicon carbide can be easily re-crystallized at the inner region than at the outer region.

The aspect in which the above-mentioned another end of the member forming the above-mentioned inner region is exposed out of the above-mentioned reaction vessel is not particularly restricted, and listed are a form in which the above-mentioned inner region is the bottom surface and the diameter thereof varies (increases or decreases) continuously or discontinuously toward the outside of the above-mentioned reaction vessel, and other forms As such a form, specifically listed are pillar forms in which the above-mentioned inner region is the bottom surface (cylinder, prism and the like, and cylinder is preferable), trapezoid pyramidal forms in which the above-mentioned inner region is the bottom surface (truncated cone, truncated pyramid, reverse truncated cone, reverse truncated pyramid and the like are listed, and reverse truncated cone is preferable) and other forms.

In the above-mentioned reaction vessel, it is preferable that the surface of a region (outer region) situated at the outer periphery of a region (inner region) on which the above-mentioned silicon carbide single crystal is grown and adjacent to the inner periphery part of the reaction vessel is made of vitreous carbon or amorphous carbon. This case is advantageous in that re-crystallization easily occurs at the above-mentioned outer region than at the above-mentioned inner region.

The above-mentioned reaction vessel is preferably surrounded by a heat insulating material and the like. In this case, it is preferable that the above-mentioned heat insulating material is not provided approximately at the centers of the above-mentioned one end part (silicon carbide powder accommodating part) and the above-mentioned another end part (seed crystal placing part), in this reaction vessel, for the purpose of forming a window for measuring temperature. When the above-mentioned window for measuring temperature is provided approximately at the center of the above-mentioned one end part (silicon carbide powder accommodating part), it is preferable that a graphite cover member and the like are further provided for preventing falling of the above-mentioned heat insulating material and the like.

It is preferable that the above-mentioned reaction vessel is placed in a quartz tube. This case is preferable in that loss of heating energy for sublimation and re-crystallization of the above-mentioned silicon carbide powder is small.

As the quartz tube, those of high purity are available, and use of an article of high purity is advantageous in the mixing of metal impurities is little.

—Sublimation—

Though sublimation of the above-mentioned silicon carbide powder may be conducted using the same heating means as the heating means to effect necessary heating for re-crystallization, it is preferable to use separate heating means from the standpoints of precise control of the heating means, independent control, interference prevention and the like. In such an aspect, the number of heating means is two or more, and two is preferable in the present invention.

In the case of a preferable aspect in which the number of heating means is two, the heating means for forming a sublimation atmosphere enabling sublimation of the above-mentioned silicon carbide powder is a first heating means, and the heating means for forming the above-mentioned re-crystallization atmosphere enabling re-crystallization of the sublimation silicon carbide only around the seed crystal of a silicon carbide single crystal is a second heating means.

The above-mentioned first heating means is placed at the one end part (silicon carbide powder accommodating part) of the above-mentioned reaction vessel and forms a sublimation atmosphere so as to enable sublimation of the above-mentioned silicon carbide powder, and heat the above-mentioned silicon carbide powder to sublimate the powder.

The above-mentioned first heating means is not particularly restricted and can be appropriately selected according to the object, and for example, a induction heating means, resistance heating means and the like are listed, and a induction heating means is preferable since temperature control is easy, and the induction heating means is preferably a coil which can be induction-heated.

When the above-mentioned first heating means is a coil which can be induction-heated, the number of turns is not particularly restricted, and can be determined so that heating efficiency and temperature efficiency become optimum depending on the distance from the above-mentioned second heating means, the material of the above-mentioned reaction vessel and the like.

—Growth of Silicon Carbide Single Crystal—

The growth of the above-mentioned silicon carbide single crystal is conducted on a seed crystal of a silicon carbide single crystal placed at the above-mentioned another end part (seed crystal placing part) in the above-mentioned reaction vessel.

Regarding the above-mentioned seed crystal of a silicon carbide single crystal, the polymorphism, size and the like of the crystal can be appropriately selected according to the object, and as the polymorphism of the crystal, the same polymorphism as that of a silicon carbide single crystal to be obtained is usually selected.

For re-crystallizing the above-mentioned silicon carbide single crystal on the above-mentioned seed crystal and growing it, it is preferable that temperature lower than the temperature for sublimation of a silicon carbide powder is provided, and a re-crystallization atmosphere is so formed that the sublimated silicon carbide powder can be re-crystallized only around the above-mentioned seed crystal (in other words, atmosphere containing temperature distribution in which temperature lowers with approximating the center part (center of the inner region) along the radial direction of a surface on which the seed crystal is placed).

Formation of the above-mentioned re-crystallization atmosphere can be more suitably conducted by the above-mentioned second heating means. Such a second heating means is placed at the above-mentioned another end part (seed crystal placing part) of the above-mentioned reaction vessel and forms a re-crystallization atmosphere so as to enable re-crystallization of the above-mentioned silicon carbide powder sublimated by the above-mentioned first heating means only around the seed crystal of a silicon carbide single crystal, and allow the silicon carbide powder to re-crystallize on the above-mentioned silicon carbide single crystal.

The above-mentioned second heating means is not particularly restricted and can be appropriately selected according to the object, and for example, a induction heating means, resistance heating means and the like are listed, and a induction heating means is preferable since temperature control is easy, and the induction heating means is preferably a coil which can be induction-heated.

When the above-mentioned second heating means is a coil which can be induction-heated, the number of turns is not particularly restricted, and can be determined so that heating efficiency and temperature efficiency become optimum depending on the distance from the above-mentioned first heating means, the material of the above-mentioned reaction vessel and the like.

The amount of induction heating current passed through the above-mentioned second heating means can be appropriately selected depending on the correlation with induction heating current passed through the above-mentioned first heating means. Regarding the correlation of them, the current value of induction heating current of the above-mentioned first heating means is preferably set larger than the current value of induction heating current of the above-mentioned second heating means. This case is advantageous in that the temperature of the re-crystallization atmosphere around the seed crystal is kept higher than the temperature of the atmosphere for sublimation of the silicon carbide powder, and re-crystallization is easily conducted.

It is preferable to control the current vale of induction heating current of the above-mentioned second heating means so that is decreases continuously or gradually with increasing in the diameter of a silicon carbide single crystal grown. This case is advantageous in that since the heating amount by the above-mentioned second heating means decreases with growth of the above-mentioned silicon carbide single crystal, re-crystallization is effected only around the silicon carbide single crystal continuing to grow, and generation of polycrystal around the silicon carbide single crystal is effectively suppressed.

Regarding the current value of induction heating current of the above-mentioned second heating means, a preferable tendency is that in which the current value decreases when the diameter of the seed crystal of the silicon carbide single crystal is large and the current value increases when the diameter of the seed crystal of the silicon carbide single crystal is small.

In the present invention, since the above-mentioned second heating means can be controlled independently from the above-mentioned first heating means, preferable growth speed can be maintained throughout the whole growth process of a silicon carbide single crystal by appropriately adjusting the heating amount of the above-mentioned second heating means depending on the growth speed of the silicon carbide single crystal.

The temperature of the re-crystallization atmosphere formed by the above-mentioned second heating means is lower than the temperature of the sublimation atmosphere formed by the above-mentioned first heating means preferably by 30 to 300° C., more preferably by 30 to 150° C.

The pressure of the re-crystallization atmosphere formed by the above-mentioned second heating means is preferably from 10 to 100 Torr (1330 to 13300 Pa). When such pressure condition is made, it is preferable that pressure reduction is not effected at lower temperature, pressure reduction is effected after heating to the set temperature, and pressure condition is so adjusted to be in the above-mentioned given numerical value range.

The above-mentioned re-crystallization atmosphere is preferably an inert gas atmosphere such as an argon gas atmosphere and the like.

In the present invention, it is preferable, from the standpoint of obtaining a silicon carbide single crystal of larger diameter, to control the temperature of one end side accommodating a silicon carbide powder (sublimation raw material accommodating part) in the above-mentioned reaction vessel, controlled by the above-mentioned first heating means, temperature of the center part at another end side at which a seed crystal of the silicon carbide single crystal is placed (seed crystal placing part) in the above-mentioned reaction vessel, controlled by the above-mentioned second heating means, and the temperature of places situated at the outer side of the above-mentioned center part and adjacent to the inner periphery surface part of the reaction vessel, according to the following correlation. Namely, when the temperature of one end side accommodating a silicon carbide powder is represented by $T_1$, the temperature of another end side containing a seed crystal of a silicon carbide single crystal placed is represented by $T_2$, and the temperature of adjacent parts to the inner peripheral surface part of the reaction vessel, at this another end side, is represented by $T_3$, it is preferable to effect control so that $T_3-T_2$ and $T_1-T_2$ increase continuously or gradually.

In this case, since $T_1-T_2$ increases continuously or gradually, even if a silicon carbide single crystal continues to grow toward the above-mentioned one end side with the lapse of time, the crystal growth peak side of the silicon carbide single crystal is always maintained at the condition of easy re-crystallization. On the other hand, since $T_3-T_2$ increases continuously or gradually, even if a silicon carbide single crystal continues to grow toward the outer peripheral direction at the above-mentioned another end side with the lapse of time, the crystal growth outer peripheral end side of the silicon carbide single crystal is always maintained at the condition of easy re-crystallization. As a result, production of a silicon carbide polycrystal is effectively suppressed, and the silicon carbide single crystal continues to grow toward the direction of larger thickness while enlarging the diameter, and finally, a silicon carbide single crystal of larger diameter containing no incorporated silicon carbide polycrystal and the like is obtained, advantageously.

In the present invention, it is preferable that the above-mentioned silicon carbide single crystal re-crystallizes and grows according to the first aspect to the third aspect.

In the first aspect, the above-mentioned silicon carbide single crystal is grown while keeping the whole surface of the growing surface in convex shape throughout the whole growth process. In this case, on the whole surface of the growing surface of the silicon carbide single crystal, a depressed concave part is not formed at the above-mentioned another end part (seed crystal placing part).

In the second aspect, growth of the silicon carbide single crystal is conducted only at regions excepting adjacent parts to the peripheral surface part in the reaction vessel (inner region), at the above-mentioned end part in the above-mentioned reaction vessel. In this case, a silicon carbide polycrystal does not grow in the condition of contact with the peripheral surface part in the reaction vessel, at the above-mentioned another end part (seed crystal placing part). Therefore, when the grown silicon carbide single crystal is cooled to room temperature, stress based on difference in thermal expansion is not applied concentratedly from the silicon carbide polycrystal side to the silicon carbide single crystal side, and defects such as cracking and the like do not occur in the resulting silicon carbide single crystal.

In the third aspect, the above-mentioned silicon carbide single crystal is grown while keeping the whole surface of the growing surface in convex shape throughout the whole growth process, only at regions excepting adjacent parts to the peripheral surface part in the reaction vessel (inner region), at the above-mentioned end part of the above-mentioned reaction vessel.

In this case, a depressed concave part is not formed in the form of ring at the above-mentioned another end part (seed crystal placing part) of the above-mentioned reaction vessel, on the whole surface of the growing surface of the above-mentioned silicon carbide single crystal, and a silicon carbide polycrystal does not grow in the condition of contact with the peripheral surface part in the reaction vessel, at the above-mentioned another end part (seed crystal placing part). Therefore, when the grown silicon carbide single crystal is cooled to room temperature, stress based on difference in thermal expansion is not applied concentratedly from the silicon carbide polycrystal side to the silicon carbide single crystal side, and defects such as cracking and the like do not occur in the resulting silicon carbide single crystal.

Regarding the form of the above-mentioned silicon carbide single crystal grown, it is preferable that the whole surface of the growing surface is in the form of convex form toward the growth direction, and when the above-mentioned one end part (silicon carbide single crystal accommodating part) and the above-mentioned another end part (seed crystal placing part) are facing, it is preferable that the whole surface of the growing surface is in the form of convex form toward the above-mentioned silicon carbide powder side, namely, toward the above-mentioned one end (silicon carbide single crystal accommodating part) side.

This case is preferable in that mixing of polycrystal and polymorphism is significant, and there is no concave part depressed to the above-mentioned another end part (seed crystal placing part) side, which is believed to be a part on which stress based on difference in thermal expansion is easily concentrated.

The form of the silicon carbide single crystal grown may partially contain a plat part even if the above-mentioned convex form is not formed, providing the whole surface of the growing surface does not contain a part in the form of concave toward the reverse direction to the growing direction.

The form of the crystal of silicon carbide containing a silicon carbide single crystal is preferably in the form approximately of peak toward the above-mentioned silicon carbide powder side, namely, toward the above-mentioned one end side, and it is more preferable that the diameter thereof decreases gradually.

Though a silicon carbide polycrystal and polymorphism may be mixed in the base part of the crystal of silicon carbide in the above-mentioned peak, namely, at the outer peripheral parts, occurrence of this mixing can be prevented by combination of the thickness, size, form and the like of the seed crystal, with the condition of heating amount of the above-mentioned second heating means. Prevention of mixing of a silicon carbide polycrystal and polymorphism is preferable since then the crystal of silicon carbide containing the silicon carbide can be made only of a silicon carbide single crystal.

In the present invention, a plate member in the form of ring may be fixed and placed approximately in parallel to the above-mentioned another end part (seed crystal placing part), to the peripheral surface part in the above-mentioned reaction vessel. In this case, when the silicon carbide single crystal is re-crystallized and grown on the seed crystal, only the silicon carbide single crystal can be re-crystallized and grown on the above-mentioned seed crystal, and a silicon carbide polycrystal is not allowed to generate, or can be deposited selectively on the above-mentioned plate member in the form of ring. In this case, the diameter of the resulting silicon carbide single crystal is reduced by the size of the plate member in the form of ring.

In the present invention, it is preferable to use an interference preventing means for preventing interference between the first heating means and the second heating means for the purpose of conducting efficient growing of the silicon carbide single crystal.

The interference preventing means is not particularly restricted, and can be appropriately selected depending on the kinds of the above-mentioned first heating means and the above-mentioned second heating means, and the like. For example, an interference preventing coil, interference preventing plate and the like are listed, and when the above-mentioned first heating means and the above-mentioned second heating means are the above-mentioned coil which can be induction-heated, an interference preventing coil and the like are suitably listed.

The above-mentioned interference preventing coil (simply referred to as "coil", in some cases) is preferably one through which induction current can be passed and which has a function to prevent interference between the first heating means and the second heating means by passing the induction current.

The above-mentioned interference preventing coil is preferably placed between the above-mentioned first heating means and the above-mentioned second heating means. This case is preferable in that when induction heating by the above-mentioned first heating means and induction heating by the above-mentioned second heating means are conducted simultaneously, induction current flows through the interference preventing means, and the interference preventing means minimizes and prevents interference between them.

It is preferable to design the above-mentioned interference preventing coil so that the coil itself is not heated by flowing induction current, it is more preferable that the coil can be cooled by itself, and it is particularly preferable that a cooling medium such as water and the like can be flown through it. This case is preferable in that even if induction current in the above-mentioned first heating means and the above-mentioned second heating means flow through the interference preventing coil, this interference preventing coil is not heated, therefore, the above-mentioned reaction vessel is not heated.

The number of turns of the interference preventing means is not particularly restricted and varies depending on the kinds of the above-mentioned first heating means and the above-mentioned second heating means and the amount of current flown through them, and the like, and cannot be generally defined. Even single turn may be sufficient.

According to the method of producing a silicon carbide single crystal of the present invention, a silicon carbide single crystal which has low nitrogen content and high quality, which is a semi-insulator or insulator, and which is suitable as a semi-insulating or insulating tingle crystal substrate and the like, can be efficiently produced.

(Silicon Carbide Single Crystal)

The silicon carbide single crystal of the present invention is produced by the above-mentioned method of producing a silicon carbide single crystal of the present invention.

The silicon carbide single crystal of the present invention has crystal defects (pipe defect) optically image-detected without break in a rate of preferably 100/cm$^2$ or less, more preferably 50/cm$^2$ or less, particularly preferably 10/cm$^2$ or less.

The above-mentioned crystal defect can be detected, for example, by the following method. Namely, the pipe defect can be detected by scanning the whole surface of a silicon carbide single crystal to obtain a microscope image under conditions wherein parts continuing to inside of the pipe defect can be observed, connected to the opening part, as a weaker image than that of the opening part, in illuminating the silicon carbide single crystal with reflected light together with suitable amount of transmission light added and adjusting the microscope focus on the opening part of the crystal defect (pipe defect) on the surface of the silicon carbide single crystal, then, extracting only forms characteristic to the pipe defect by image-treating the microscope image and counting the number of them.

According to the above-mentioned detection, only the above-mentioned pipe defects can be correctly detected without break, from a mixture of defects other than the above-mentioned pipe defect, such as extraneous materials adhered to the surface of the above-mentioned silicon carbide single crystal, polishing flaw, void defect and the like, further, fine pipe defects of for example about 0.35 μm can also detected correctly. On the other hand, conventionally, the above-mentioned pipe defect part is selectively etched with a melted alkali, and enlarged and detected. In this method, however, adjacent pipe defects mutually join by etching, and resultantly, the number of the pipe defects is detected lower than the actual number.

From the view of obtaining a semi-insulating or insulating single crystal substrate and the like, the volume resistivity of the silicon carbide single crystal of the present invention is preferably $1\times10^1$ Ωcm or more, more preferably $1\times10^3$ Ωcm or more, particularly preferably $1\times10^7$ Ωcm or more.

When the above-mentioned volume resistivity is within the above-mentioned range, the silicon carbide single crystal is semi-insulating or insulating, and suitable as a semi-insulating or insulating single crystal substrate and the like.

The nitrogen content of the above-mentioned silicon carbide single crystal is preferably 0.1 mass ppm or less, more preferably 0.01 mass ppm or less.

When the above-mentioned nitrogen content is within the above-mentioned numerical value range, the silicon carbide single crystal is particularly suitable as a semi-insulating or insulating single crystal substrate and the like.

The above-mentioned nitrogen content can be measured, for example, by using an oxygen and nitrogen simultaneous analyzing apparatus, secondary ion mass spectrometer, glow discharge mass spectrometer, photoluminescence measuring apparatus and the like.

The total content of the above-mentioned impurity elements in the above-mentioned silicon carbide single crystal is preferably 10 mass ppm or less.

The silicon carbide single crystal of the present invention has low nitrogen content, high quality, is semi-insulator or insulator, and can be suitably used as a semi-insulating or insulating single crystal substrate and the like.

From the view of obtaining a p-type semiconductor and the like, the volume resistivity of the silicon carbide single crystal of the present invention is preferably $1\times10^1$ Ωcm or less, more preferably $1\times10^0$ Ωcm or less.

When the above-mentioned volume resistivity is within the above-mentioned range, the silicon carbide single crystal is suitable as a p-type semiconductor and the like.

The nitrogen content of the above-mentioned silicon carbide single crystal is preferably 0.1 mass ppm or less, more preferably 0.01 mass ppm or less.

When the above-mentioned nitrogen content is within the above-mentioned numerical value range, the silicon carbide single crystal is particularly suitable as a p-type semiconductor and the like.

The above-mentioned nitrogen content can be measured, for example, by using secondary ion mass spectrometer, photoluminescence measuring apparatus and the like.

The total content of the above-mentioned impurity elements in the above-mentioned silicon carbide single crystal is preferably 10 mass ppm or less.

The silicon carbide single crystal of the present invention has low nitrogen content, high quality, is semi-insulator or insulator, and can be suitably used as a p-type semiconductor and the like.

(Seed Crystal Fixing Apparatus)

Figure 10A:
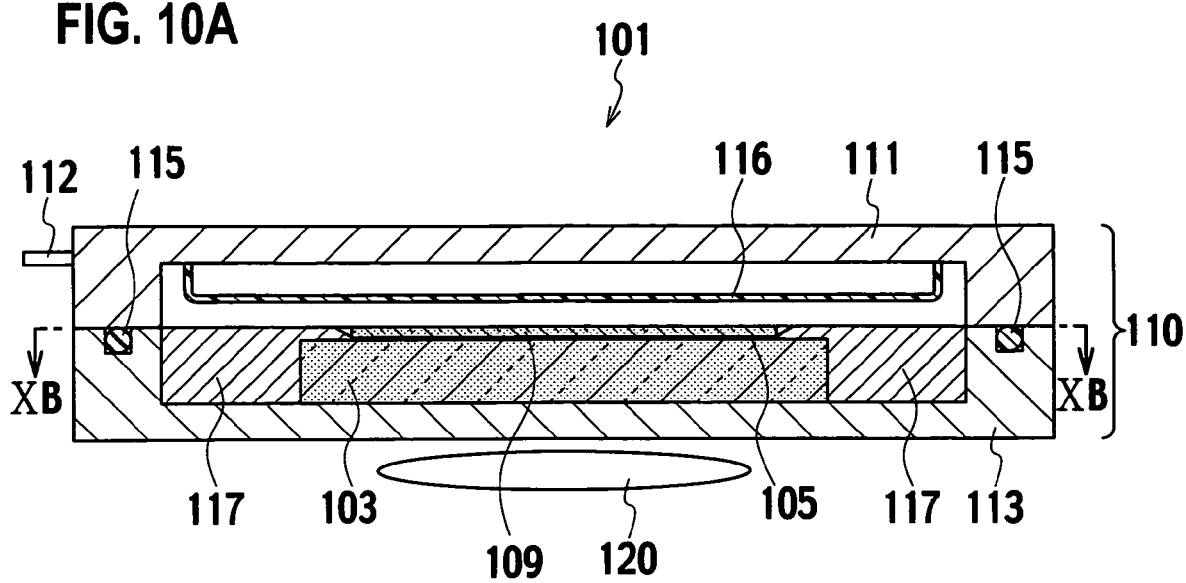
FIG. 10A shows a schematic illustration of the seed crystal fixing apparatus housing a seed crystal fixing part on which a seed crystal is fixed with interposition of an adhesive.
Figure 10B:
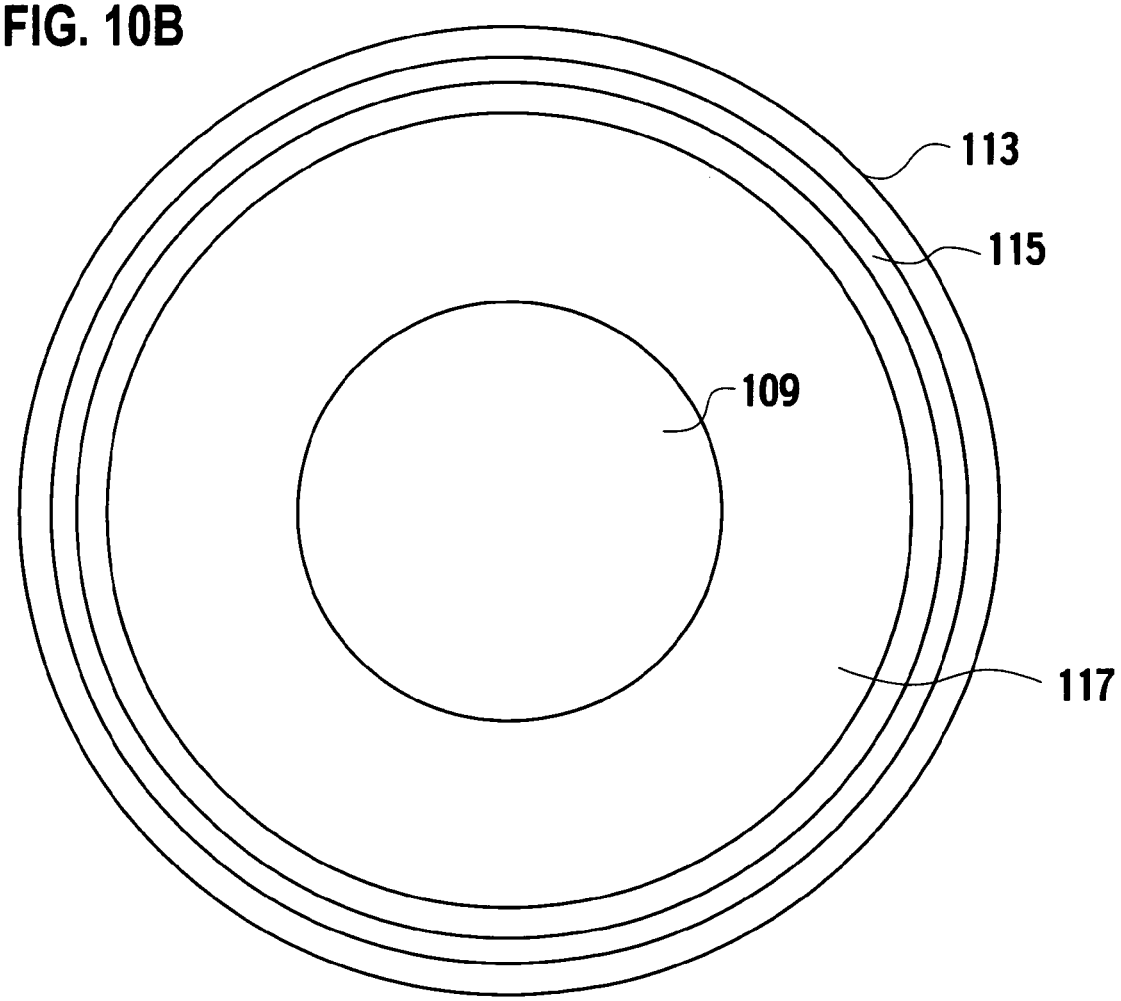
FIG. 10B shows a top view of the lower chamber.

FIG. 10A shows a schematic cross section of a seed crystal fixing apparatus 101 in which a seed crystal setting part 103 on which a seed crystal 109 is placed with interposition of an adhesive 105 is housed, and FIG. 10B shows a top view of a lower chamber. As shown in FIG. 10A, the seed crystal fixing apparatus 101 according to this embodiment is provided for fixing the seed crystal 109 on the seed crystal setting part 103 of a reaction vessel with interposition of the adhesive 105, and has a chamber 110 for forming a hermetic atmosphere so as to enable the seed crystal setting part 103 to be placed within the chamber, and a flexible bag 116 disposed within the chamber 110 for inflation and deflation upon charge and discharge of an air and for uniformly applying a pressure on the entire surface of the seed crystal in contact with the surface of the seed crystal upon inflation. The seed crystal fixing apparatus 101 further has a heating body 120 for hardening the adhesive by heating.

The chamber 110 has an upper chamber 111 and a lower chamber 113 formed so as to be freely attachable and detachable. The chamber is constructed so that, upon use, the hermetic atmosphere is formed by mounting the upper chamber 111 on the lower chamber 113 with interposition of an O-ring 115 placed on the outer circumference of the lower chamber 113. An evacuation port 112 is provided on the chamber 110, and the pressure is reduced by evacuating air from within the chamber 110 in which the hermetic environment is formed. The lower chamber 113 has a guide 117 for fixing the seed crystal setting part 103 as well as the seed crystal 109 as shown in FIGS. 10A and 10B. The guide 117 is fixed to the lower chamber so as to be freely attachable and detachable after housing the seed crystal setting part 103 in the lower chamber 113, and the seed crystal 109 is placed onto the seed crystal setting part 103.

Figure 21A:
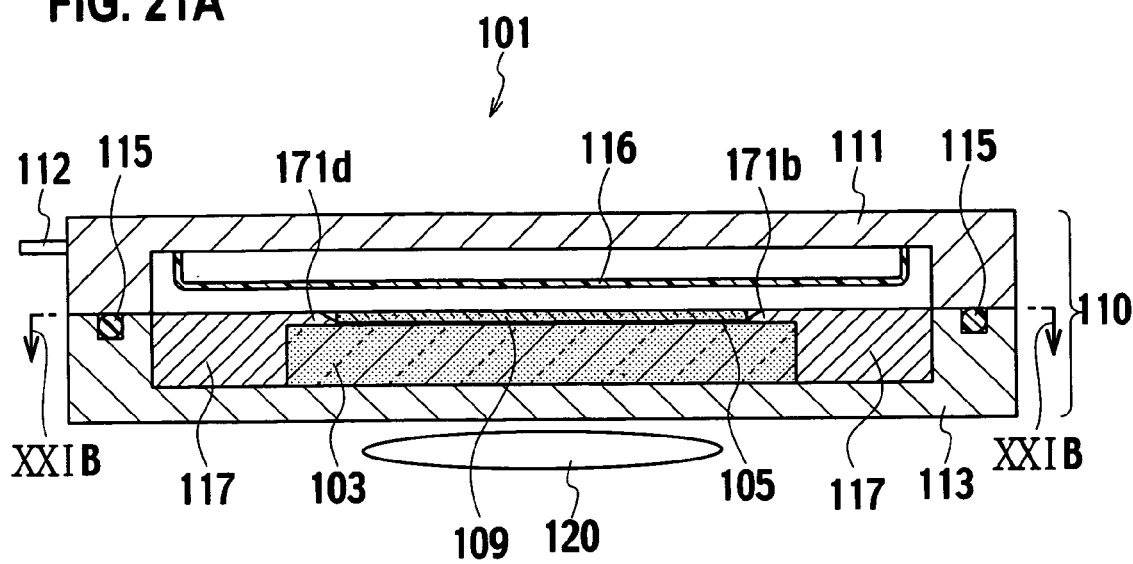
FIG. 21A shows a schematic illustration of the cross section of a modified example of the seed crystal fixing apparatus housing the seed crystal fixing part on which the seed crystal is fixed with interposition of an adhesive.
Figure 21B:
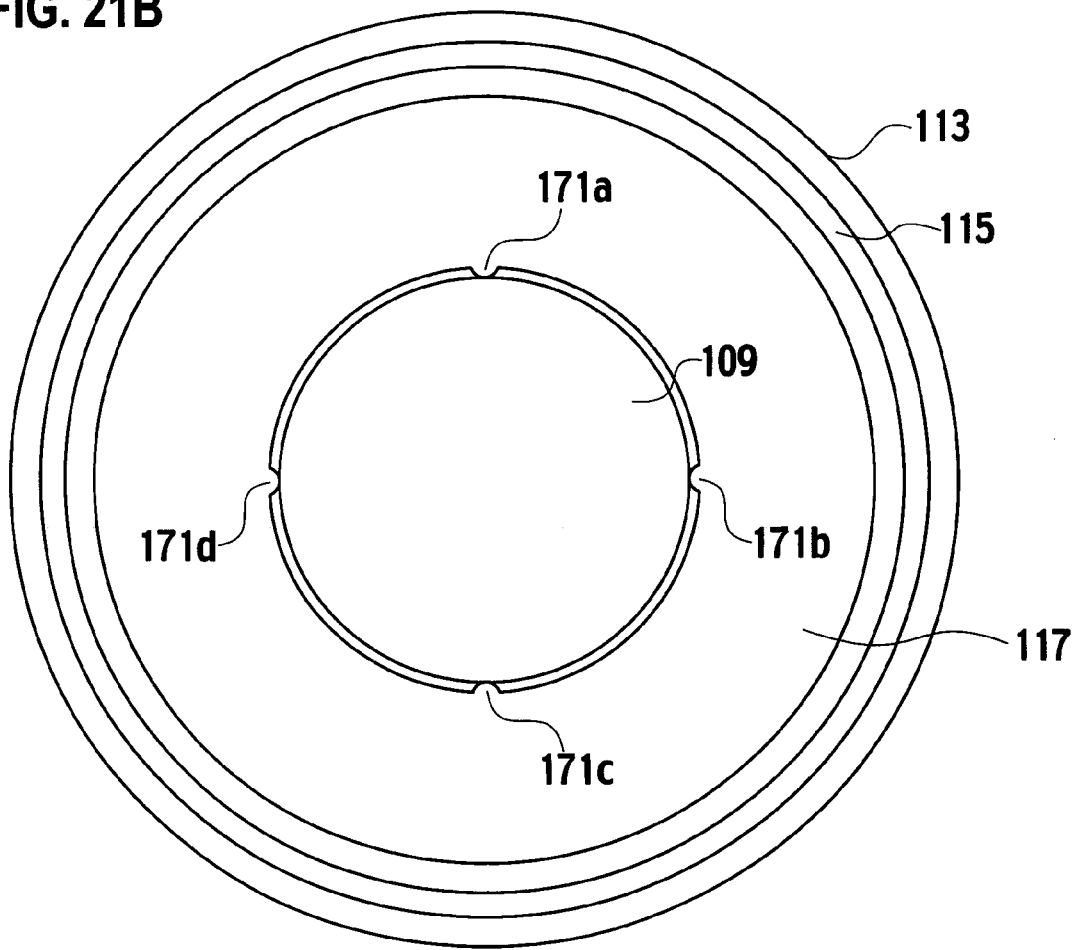
FIG. 21B shows a top view of the lower chamber.

The guide 117 preferably contacts the side face of the seed crystal 109 at least at three points, in order to prevent the adhesive 105 overflowed out of the seed crystal 109 from being adhered and hardened on the guide 117 to make the seed crystal 109 to be hardly peeled from the guide 109. Specifically, jaws 171a to 171d are provided on the guide 117 so as to hold the seed crystal 109 at these four points as shown in FIG. 21B. The shape of the jaws 171a to 171d is not restricted to the semi-circle as shown in the top view of FIG. 21B. Instead, the shape may be an approximate triangle having a tip tapered in the direction of contact point with the seed crystal 109. The shape of the jaws 171a to 171d is preferably approximately equilateral triangle so that the seed crystal is readily pressed with the flexible bag 116. The surface of the guide 117 is preferably coated with a fluorinated resin (Teflon®). Teflon® coating may be applied either only on the surface of the jaws 171a to 171d of the guide 117 or on the entire surface of the guide 117.

The flexible bag 116 is composed of a rubber or resin. The method for fixing the seed crystal setting part 103 is not restricted to those as described above, and the part may be fixed by embedding it in the chamber.

Figure 18:
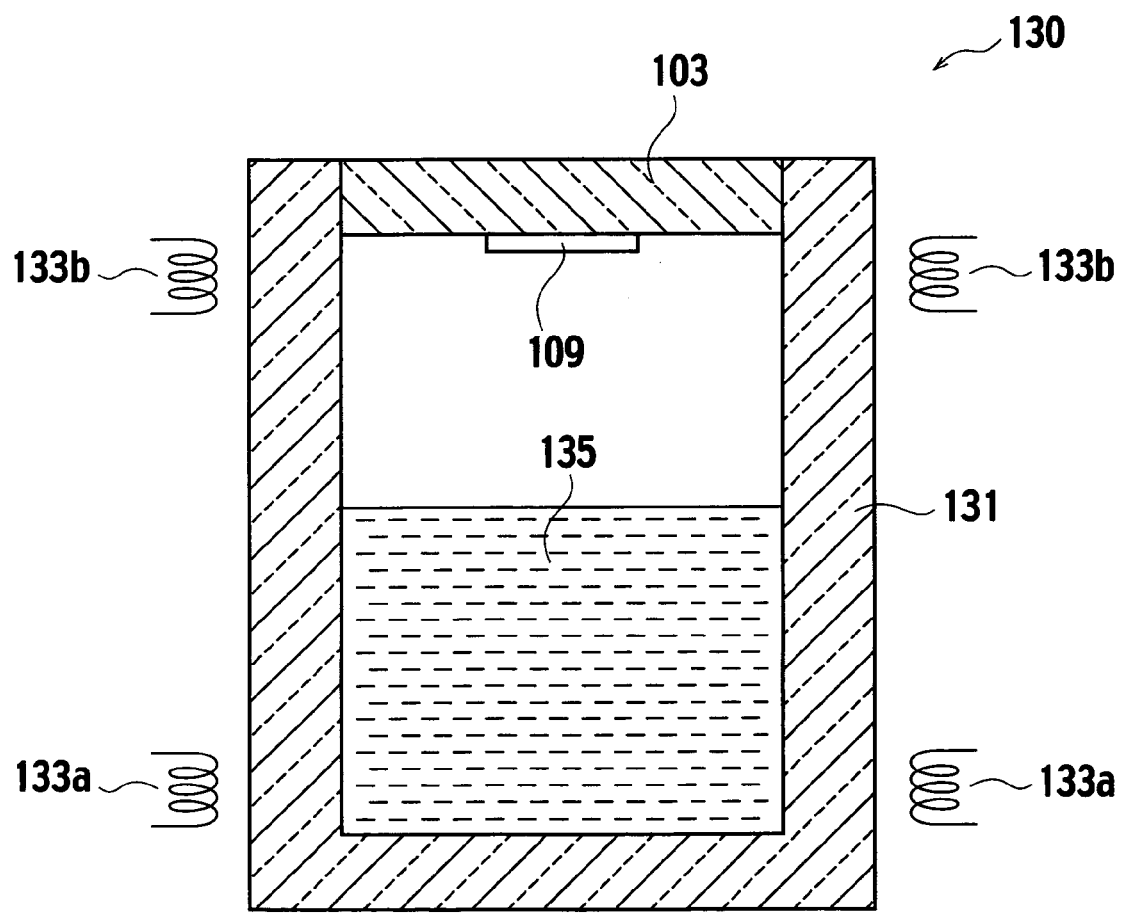
FIG. 18 shows a schematic illustration of a silicon carbide single crystal producing apparatus (a crucible).

A seed crystal setting part 103 of a silicon carbide single crystal producing apparatus 130 shown in FIG. 18 to be described below may be used as the seed crystal setting part 103 housed in the seed crystal fixing apparatus 101. While the seed crystal 109 may be appropriately determined depending on the object of use, Lely crystals of 6H-SiC and Acheson crystals of 6H-SiC can be used as the seed crystal. Examples of the adhesive 105 include resins, carbohydrates and heat resistant fine particles. Examples of the resin include heat curable resins such as phenol resin, novolac resin and furfuryl alcohol resin. The resin may comprise a carbon powder mixed with the phenol resin. Examples of the carbohydrate include sugars, for example monosaccharides such as glucose and polysaccharides such as cellulose, and derivatives thereof. Examples of the heat resistant fine particles include heat resistant substances such as graphite (carbon) as well as silicon carbide (SiC) and boron nitride (BN), and high melting-point metals such as tungsten and tantalum and compounds thereof such as carbides and nitrides.

(Method for Fixing Seed Crystal)

The method for fixing the seed crystal according to this embodiment using the seed crystal fixing apparatus in FIGS. 10A and 10B will be described with reference to FIGS. 11, 12, 13, 14, 15, 16, and 17.

Figure 11:
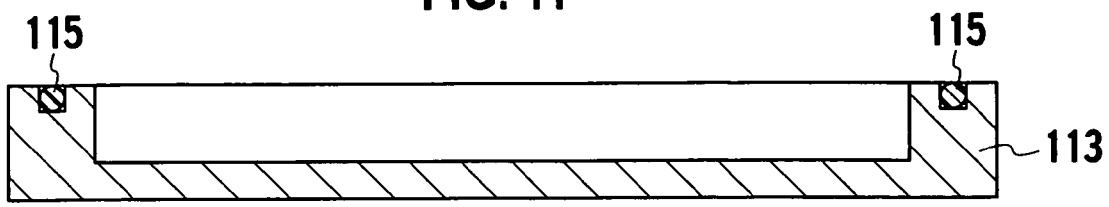
FIG. 11 to FIG. 17 show the steps for fixing the seed crystal.

(i) The lower chamber 113 as shown in FIG. 11 is prepared.

Figure 12:
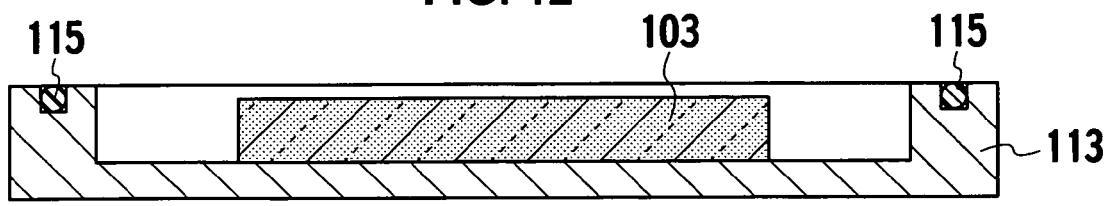

(ii) The seed crystal fixing part 103 of the reaction vessel is placed in the lower chamber 113 as shown in FIG. 12.

Figure 13:
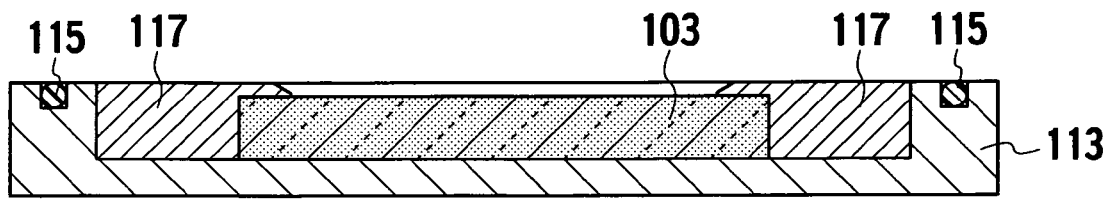

(iii) The seed crystal fixing part 103 is fixed with the guide 117 as shown in FIG. 13.

Figure 14:
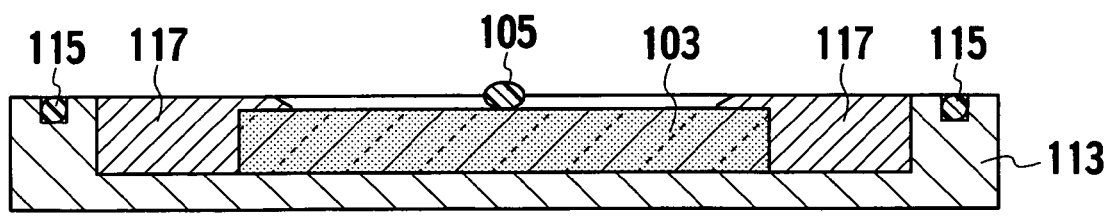

(iv) The adhesive 105 is applied on the seed crystal fixing part 103 as shown in FIG. 14. The amount of application is preferably in the range form 1 µl/cm² to 25 µl/cm².

Figure 15:
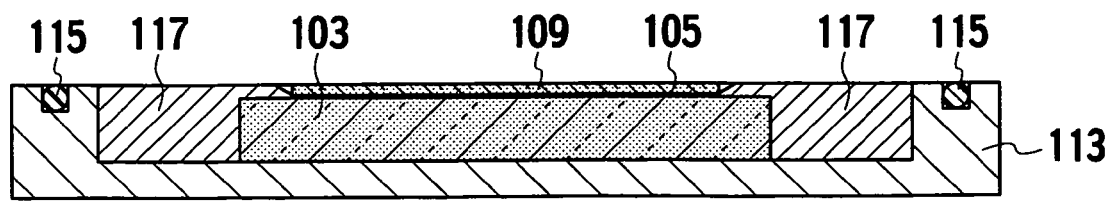

(v) Then, the seed crystal 109 is placed on the seed crystal fixing part 103 with interposition of the adhesive 105 as shown in FIG. 15. The surface of the seed crystal 109 to be in contact with the seed crystal fixing part 103 is preferably polished in advance for improving adhesiveness. Specifically, the surface roughness (Ra) of the contact face of the seed crystal 109 is preferably 0.1 µm or less. It is also preferable for improving adhesiveness to adjust the surface roughness (Ra) of the surface of the seed crystal fixing part 103 on which the seed crystal 109 is fixed is 1.4 µm or less.

Figure 16:
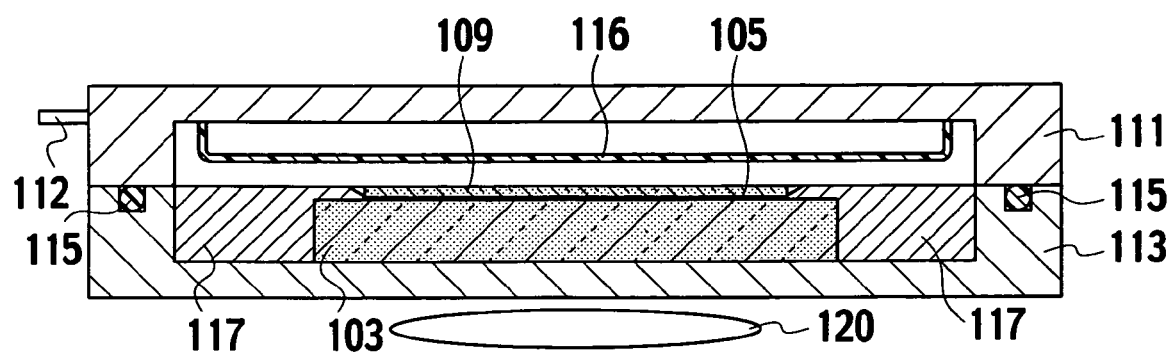

(vi) A hermetic atmosphere is formed by mounting the upper chamber 111 on the lower chamber 113 as shown in FIG. 16.

Figure 17:
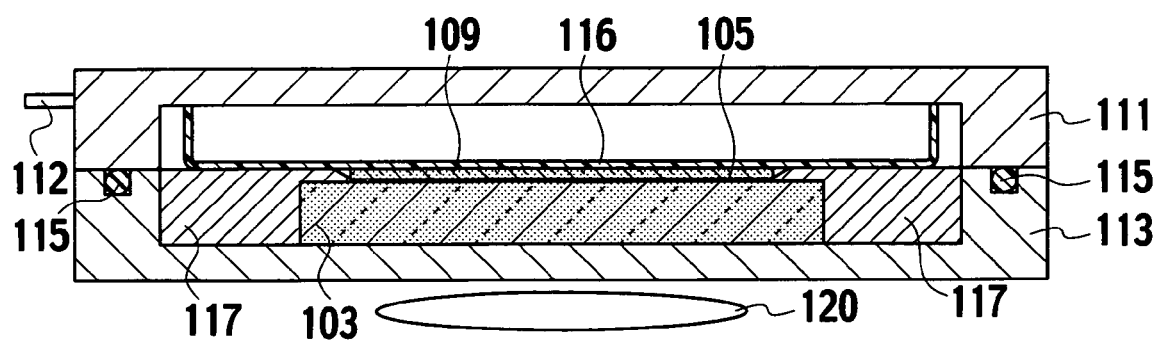

(vii) The flexible bag 116 is inflated by supplying a gas to the flexible bag as shown in FIG. 17. Then, a pressure is uniformly applied to the entire surface of the seed crystal 109 by allowing the flexible bag 116 to contact the seed crystal 109 on the opposite surface to the seed crystal fixing surface. The seed crystal is loaded with a pressure of preferably about 0.01 to 1 MPa.

(viii) The adhesive 105 is hardened by heating with a heating body 120. While the heating condition depends on the property of the adhesive (heat curable resin), the temperature is in the range from 100° C. to 1000° C., preferably 100° C. to 300° C. and is applied for about 5 to 10 minutes.

A gas generated by hardening the adhesive 105 may cause irregular bonding when the gas is left behind between the seed crystal 109 and seed crystal fixing part 103 as bubbles. Accordingly, the gas that is considered to cause irregular bonding are evacuated from the chamber 110 using a vacuum pump (not shown) connected to the evacuation port 112, and the resin is preferably hardened while a reduced pressure atmosphere is formed. For forming the reduced pressure atmosphere, the reduced pressure atmosphere may be formed in advance to the step (vii), and the steps (vii) and (viii) are performed so as to obtain an effect for making the pressure applied on the seed crystal 109 uniform. Reproducibility of adhesiveness is improved by bonding under a constant condition throughout the steps. The pressure of this reduced pressure atmosphere is preferably 300 Torr or less. The seed crystal 109 is fixed on the seed crystal fixing part 103 as described above.

Silicon Carbide Single Crystal

The silicon carbide single crystal is produced by the method for producing the silicon carbide single crystal as described above. The silicon carbide single crystal has crystal defects (tubular defects) of 50 defects/cm² or less, preferably 10 defects/cm² or less, as evaluated by etching with a molten alkali. The total content of metal impurity elements in the silicon carbide single crystal is preferably 10 ppm or less. Since the silicon carbide single crystal obtained in the invention has a quite high quality without mingling of polycrystals and polymorphic crystals and without crystal defects such as micro-pipes, it is excellent in dielectric breakdown resistance, heat resistance and radiation resistance, and may be favorably used for electronic devices such as semiconductor wafers and optical devices such as light emission diodes.

According to the aforementioned method for producing the silicon carbide single crystal of the invention, a high quality silicon carbide single crystal can be readily and efficiently produced without causing damages such as cracks.

EXAMPLES

The following examples illustrate the present invention, but do not limit the scope of the invention at all.

Example I-1

A silicon carbide single crystal is produced by using a silicon carbide single crystal producing apparatus 1 a shown in FIG. 1. The silicon carbide single crystal producing apparatus 1 has a graphite crucible 10 composed of a vessel body 12 which can accommodate a silicon carbide powder 40 and a lid body 11 which can be attached to and detached from the vessel body 12 by screwing and can place a seed crystal 50 of a silicon carbide single crystal at approximately the center of a surface facing a silicon carbide powder 40 accommodated in the vessel body 12 in mounting on the vessel body 12, a supporting rod fixing the graphite crucible 10 to inside of a quartz tube 30, a first induction heating coil 21 placed on a part on the outer periphery of the quartz tube 30 and accommodating the silicon carbide powder 40, and a second induction heating coil 20 placed on a part on the outer periphery of the quartz tube 30 and on which the lid body 11 of the graphite crucible 10 is positioned. The graphite crucible 10 is by insulating materials (not shown).

A silicon carbide powder 40 was produced as shown below. Namely, to 212 g of high purity tetraethoxysilane having a $SiO_2$ content of 40 mass % was added 34 g of high purity maleic acid as a catalyst, then, 127 g of resol type xylene-based in the form of a 50 mass % high purity solution (manufactured by Mitsubishi Gas Chemical Co., Inc., Nikanol PR-1440M) was mixed, to obtain a candy-like mixture of high viscosity. This candy-like mixture was thermally hardened at 70° C., to obtain homogeneous resinous solid. 300 g of this resinous solid was carbonated at 900° C. for 1 hour to obtain 129 g of carbide (yield: 43%). The C/Si ratio in the above-mentioned resinous solid was 1.5 when calculated according to (127 g×0.5 g×0.4/12.011)/(0.4×212 g/60.0843), and 1.52 as a result of elemental analysis.

129 g of this carbide was plated in a carbon vessel, and calcinated by heating at 800° C./hr up to 1600° C., then, heating at 100° C./hr up to 1900° C., then, keeping at 1900° C. for 2 hours, to obtain β-SiC. The yield at this point was 35 mass %. Further, this powder was heated under an argon atmosphere up to 2350° C., kept for 6 hours, to obtain a silicon carbide powder of high purity (100 mass % α-SiC). The resulted silicon carbide powder 40 revealed pale greenish gray color. Even by using a glow discharge mass spectrometer and the like, an impurity element of over 0.1 mass ppm was not detected.

The nitrogen content in the silicon carbide powder 40 was measured by using an oxygen and nitrogen simultaneous analyzing apparatus (manufactured by LECO, TC436) to find that it was less than 40 mass ppm.

For analysis of impurity elements in the silicon carbide powder 40, the silicon carbide powder 40 was thermally decomposed under pressure with a mixed acid containing hydrofluoric acid, nitric acid and sulfuric acid, then, ICP-mass analysis method and flameless atomic absorption method were conducted, to find that the contents of B, Na, K, Al, Cr, Fe, Ni, Cu, W, Ti and Ca as impurity elements were each not more than 0.1 mass ppm.

Further, the volume-average particle size ($D_{50}$) and particle size distribution ($D_{90}/D_{10}$) (based on volume-average particle size) of the silicon carbide powder 40 were measured by a particle size distribution measuring apparatus (COULTER LS230), to find that the volume-average particle size ($D_{50}$) was 300 μm and the particle size distribution ($D_{90}/D_{10}$) (based on volume-average particle size) was 3.4, and distribution showed one mountain.

Next, in the silicon carbide single crystal producing apparatus 1, current was flown through the first induction heating coil 21 to heat this. By this heat, the silicon carbide powder 40 was heated, and heater up to 2500° C., then, the pressure was reduced to 50 Torr (6645 Pa) under an argon gas atmosphere and maintained. The silicon carbide powder 40 was heated to give temperature (2500° C.) to sublimate. The sublimated silicon carbide powder 40 does not re-crystallize unless cooled to the re-crystallization temperature. Here, since the lid body 11 side was heated by the second induction heating coil 20 and maintained in a re-crystallization atmosphere (pressure: 50 Torr (6645 Pa)) in which the temperature was lower than the silicon carbide powder 40 side (temperature of seed crystal: 2400° C.) and the sublimated silicon carbide powder 40 can re-crystallize, silicon carbide was re-crystallized only around on the seed crystal 50 the silicon carbide single crystal, to grow the crystal of silicon carbide.

Figure 2:
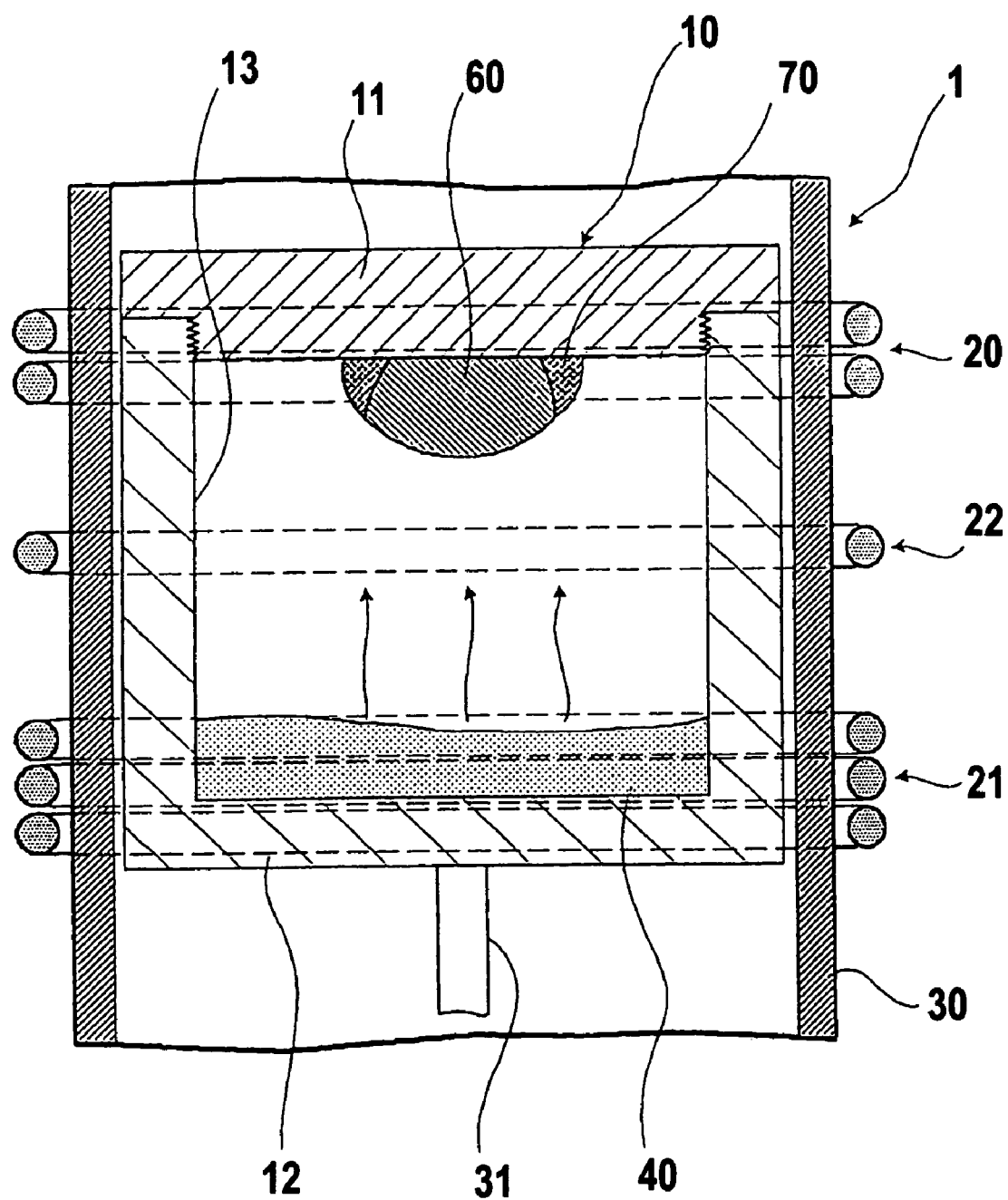
FIG. 2 is a schematic view for illustrating a state of producing a silicon carbide single crystal by a method of producing a silicon carbide single crystal of the present invention.

As shown in FIG. 2, a silicon carbide single crystal 60 re-crystallized and grew on the seed crystal 50 of the silicon carbide single crystal, and a silicon carbide single crystal 70 re-crystallized and grew at the outer peripheral part of the seed crystal 50 of the silicon carbide single crystal. In growth of the silicon carbide single crystal 60, and during the whole grow process, convex form was maintained toward the silicon carbide powder 40 side, and no concave part depressed toward the lid body 1 side was formed in the form of ring, and a silicon carbide polycrystal 70 did not grow in the condition of contact with the peripheral surface part 14 in the vessel body 12.

Figure 3:
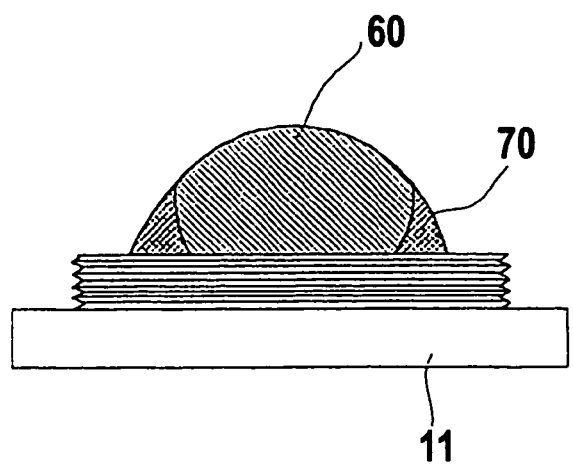
FIG. 3 is a schematic view of a silicon carbide single crystal of the present invention produced by a method of producing a silicon carbide single crystal of the present invention.

As a result, as shown in FIG. 3, when the grown silicon carbide single crystal 60 was cooled to room temperature, stress based on difference in thermal expansion was not applied concentratedly from the silicon carbide polycrystal 70 side to the silicon carbide single crystal 60 side, and breaks such as cracking and the like did not occur on the resulting silicon carbide single crystal 60.

The resulted silicon carbide single crystal 60 was evaluated, as a result, mixing of a polycrystal and polymorphism was not found, the proportion of crystal defects of micro pipes was 4/cm², meaning little presence. Namely, the crystal 60 had extremely high quality.

For detection of the above-mentioned crystal defects of micro pipes, the resulted silicon carbide single crystal 60 was cut at a thickness of 0.4 mm, and mirror polishing was performed to give a wafer having a surface roughness of 0.4 nm, and extraneous materials on the surface were removed to the utmost by alkali washing, then, detection was effected as described below. Namely, the micro pipes were detected by scanning the whole surface of the above-mentioned wafer to obtain a microscope image under conditions wherein parts continuing to inside of the micropipe can be observed, connected to the opening part, as a weaker image than that of the opening part, in illuminating the above-mentioned wafer after alkali washing with reflected light together with suitable amount of transmission light added and adjusting the microscope focus on the opening part of the micropipe on the surface of the wafer, then, extracting only forms characteristic to the micro pipe by image-treating the microscope image and counting the number of them. In this detection, even fine micro pipes of about 0.35 μm were correctly detected without break.

Further, the resulted silicon carbide single crystal 60 was thermally decomposed under pressure with a mixed acid containing hydrofluoric acid and nitric acid, the resulted solution was concentrated 10-fold or more and ICP-mass analysis method and flameless atomic absorption analysis were used to analyze impurity elements, to find that the contents of B, Na, K, Al, Cr, Fe, Ni, Cu, W, Ti and Ca as impurity elements were each not more than 15 mass ppb.

The volume resistivity of the resulted silicon carbide single crystal 60 was measured to find $4 \times 10^7$ Ωcm.

The nitrogen content of the resulted silicon carbide single crystal 60 was measured by using a photoluminescence measuring apparatus, to find a content of 0.01 mass ppm.

Example I-2

Figure 4:
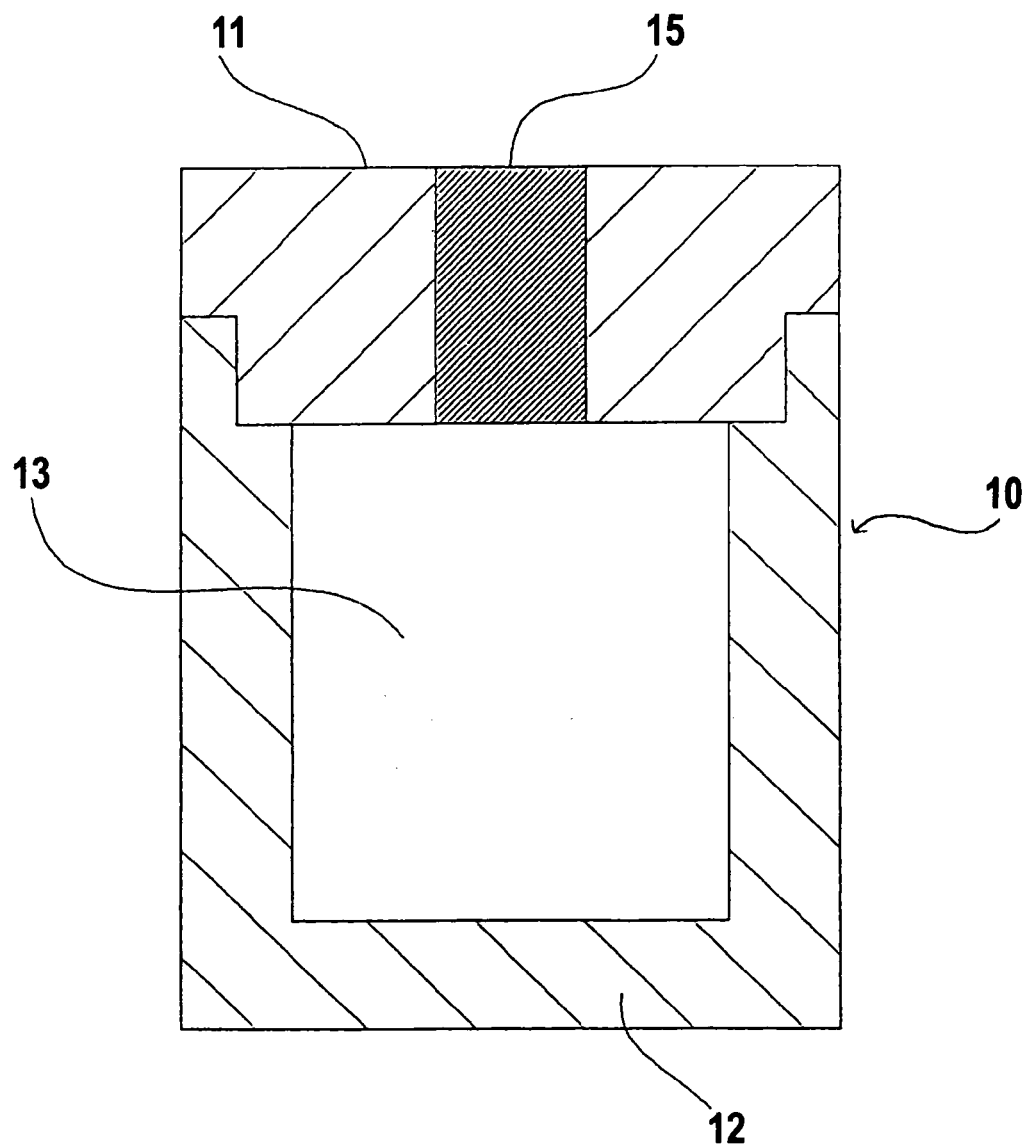
FIG. 4 is a schematic illustration view showing one example of a crucible used in a method of producing a silicon carbide single crystal of the present invention.

The same procedure was conducted as in Example I-1 excepting the graphite crucible 10 was substituted by a graphite crucible 10 shown in FIG. 4 in Example I-1. As a result, the same results as in Example I-1 were obtained. The graphite crucible 10 shown in FIG. 4 is different from the graphite crucible 10 shown in FIG. 1 used in Example I-1, only in that an inner region forming part 15 is provided on the lid body 11. The inner region forming part 15 is, as shown in FIG. 4, a cylinder in which the above-mentioned inner region at which the seed crystal of a silicon carbide single crystal is placed is the bottom surface, and one end thereof is exposed out of the graphite crucible 10. The material of the inner region forming part 15 had a heat conductivity of 117 J/m/s/° C. (W/m·K), and the material of the lid body 11 other than the inner region forming part 15 had a heat conductivity of 129 J/m/s/° C. (W/m·K).

In the case of Example I-2, since the above-mentioned inner region is formed of a member (inner region forming part 15) different from that of the above-mentioned outer region, it is not easily heated due to difference in contact resistance, further, since one end of the inner region forming part 15 is exposed into outside, heat is easily released into outside, consequently, re-crystallization of silicon carbide was carried out easily.

Example I-3

Figure 5:
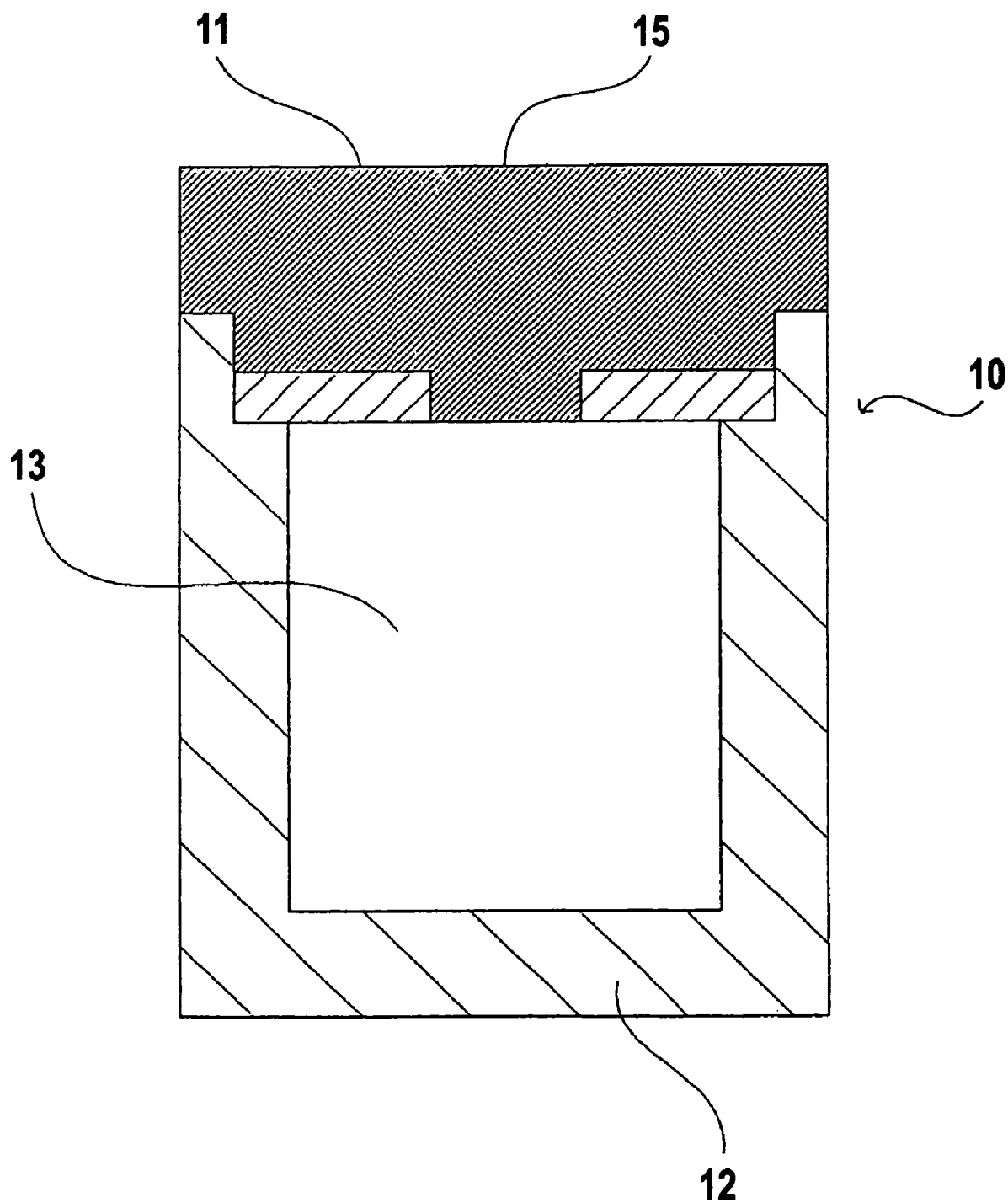
FIG. 5 is a schematic illustration view showing another example of a crucible used in a method of producing a silicon carbide single crystal of the present invention.
Figure 8:
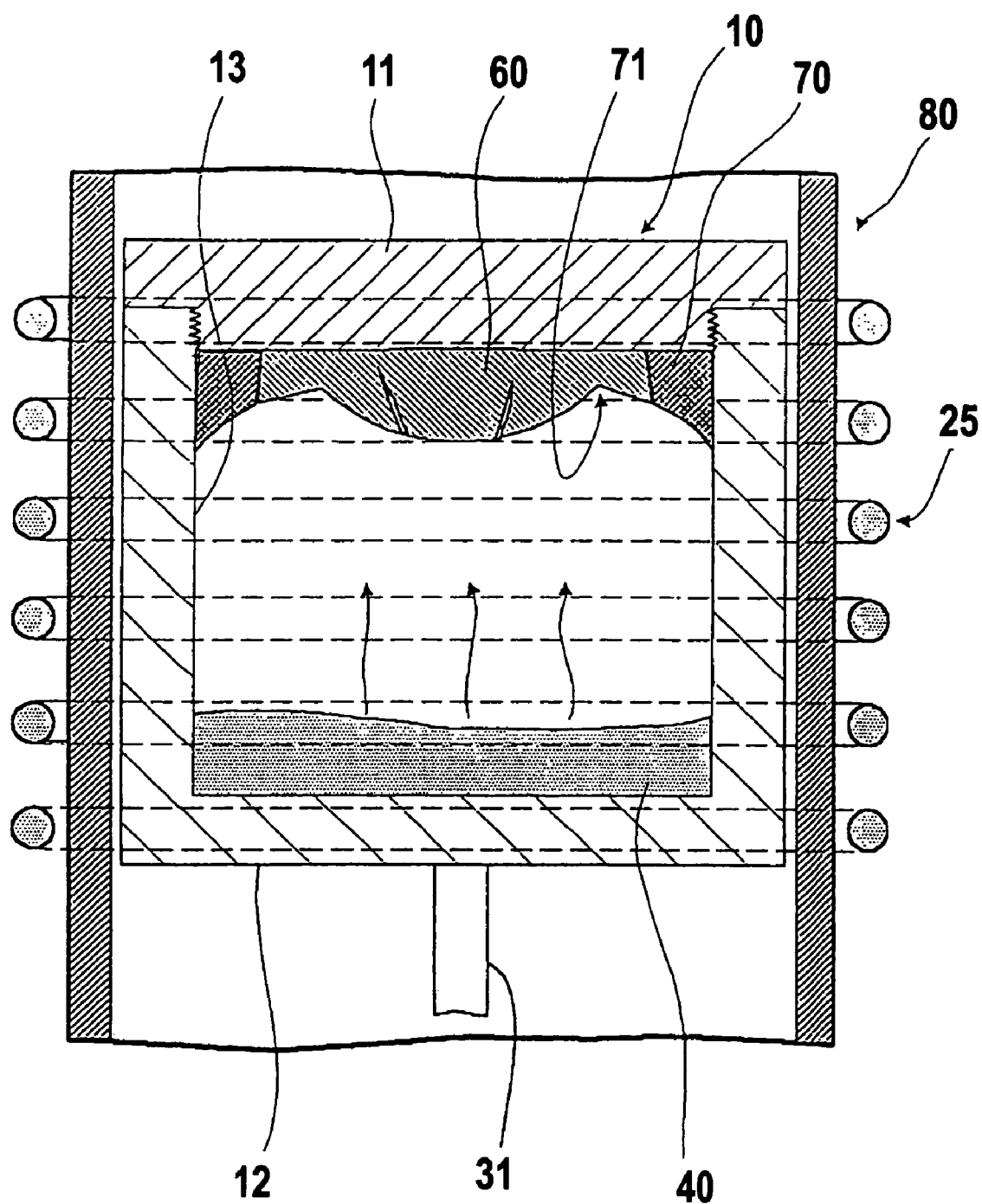
FIG. 8 is a schematic view for illustrating a state of producing a silicon carbide single crystal by a method of producing a silicon carbide single crystal of the present invention.

The same procedure was conducted as in Example I-1 excepting the graphite crucible 10 was substituted by a graphite crucible 10 shown in FIG. 5 and a silicon carbide single crystal production apparatus 80 shown in FIG. 8 was used in Example I-1. As a result, the same results as in Example I-1 were obtained. The graphite crucible 10 shown in FIG. 5 is different from the graphite crucible 10 shown in FIG. 1 used in Example I-1, only in that an inner region forming part 15 is provided on the lid body 11. The inner region forming part 15 has, as shown in FIG. 5, a form in which the above-mentioned inner region at which the seed crystal of a silicon carbide single crystal is placed is the bottom surface and the bottom surface has stair shape in which the diameter increases by two steps discontinuously toward outside, and one end thereof is exposed out of the crucible. The material of the inner region forming part 15 had a heat conductivity of 117 J/m/s/° C. (W/m·K), and the material of the lid body 11 other than the inner region forming part 15 had a heat conductivity of 129 J/m/s/° C. (W/m·K).

In the case of Example I-3, since the above-mentioned inner region is formed of a member different from that of the above-mentioned outer region, it is not easily heated due to difference in contact resistance, further, since one end of the inner region forming part 15 is exposed into outside, heat is easily released into outside, consequently, re-crystallization of silicon carbide was carried out easily.

Example I-4

The same procedure was conducted as in Example I-1 excepting the following points in Example I-1. Namely, the resulted silicon carbide powder had 6H and an average particle size of 300 μm, and the seed crystal 50 of a silicon carbide single crystal was a wafer of 15R (diameter 40 mm, thickness 0.5 mm) obtained by cutting the bulk silicon carbide single crystal obtained in Example I-1 and mirror-polishing the whole surface.

Figure 6:
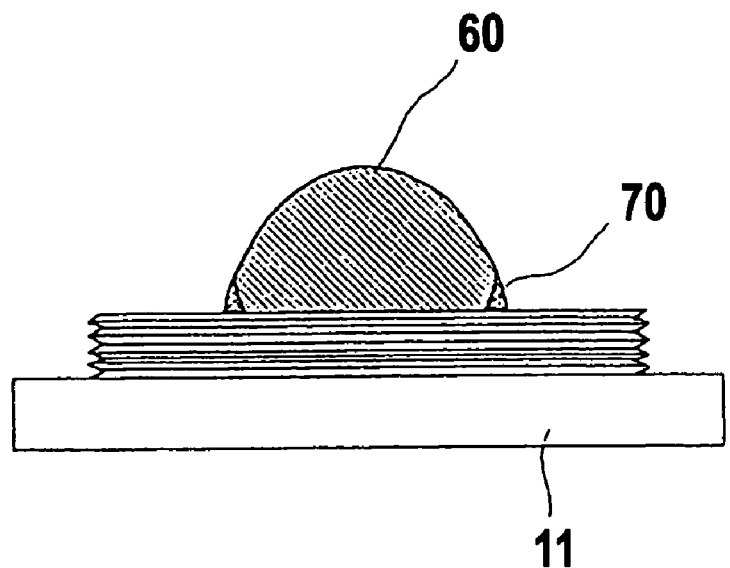
FIG. 6 is a schematic view of a silicon carbide single crystal of the present invention produced by a method of producing a silicon carbide single crystal of the present invention.

Current of 20 kHz was passed through the first induction heating coil 21 to heat this, current of 40 kHz was passed through the second induction heating coil 20 to raise temperature to heat this. The lower part (accommodation part for silicon carbide powder 40) of the graphite crucible 10 was heated to 2312° C., and the upper part (placing part for seed crystal 50 of silicon carbide single crystal on lid body 11) of the graphite crucible 10 was heated to 2290° C., respectively. In this operation, the feed power to the first induction heating coil 21 was 10.3 kW, the induction heating current (feed current to LC circuit) was 260 A, the feed power to the second induction heating coil 20 was 4.6 kW, and the induction heating current was 98 A. The pressure was reduced from normal pressure to 20 Torr (2658 Pa) over 1 hour and kept for 20 hours, as a result, a silicon carbide single crystal 60 having convex form maintained toward the silicon carbide powder 40 side as shown in FIG. 6 was obtained. In this case, the height up to the tip of the convex form on the silicon carbide single crystal 60 was 12 mm, and the diameter of the grown crystal of silicon carbide containing the silicon carbide single crystal 60 and a silicon carbide polycrystal formed around it was 87 mm. On the silicon carbide single crystal 60, a concave part depressed to the lid body 11 direction was not formed in the form of ring. The silicon carbide single crystal 60 did not grow in the condition of contact with the peripheral surface part 13 of the vessel body 12 of the graphite crucible 10. Further, on the silicon carbide single crystal 60, the silicon carbide polycrystal 70 was generated only in small amount around it.

Example I-5

The same procedure was conducted as in Example I-1 excepting the following points in Example I-4. Namely, the conditions are the same as in Example I-4 except that the seed crystal 50 a silicon carbide single crystal had a diameter of 20 mm and a thickness of 0.5 mm, the flow part (accommodation part for silicon carbide powder 40) of the graphite crucible 10 was heated to 2349° C. and the upper part (placing part for seed crystal 50 of silicon carbide single crystal on lid body 11) of the graphite crucible 10 was heated to 2317° C., and in this operation, the feed power to the second induction heating coil 20 was 5.5 kW, the induction heating current was 118 A, and the diameter of the grown crystal of silicon carbide containing the silicon carbide single crystal 60 and a silicon carbide polycrystal formed around it was 60 mm, and the same excellent results were obtained as in Example I-4.

Example I-6

The same procedure was conducted as in Example I-1 excepting the following points in Example I-1. Namely, an interference preventing coil 22 through which water flows inside and which can be cooled was used. The resulted silicon carbide powder had 6H and an average particle size of 250 μm, and the seed crystal 50 of a silicon carbide single crystal was a wafer (6H) having a diameter of 25 mm and a thickness of 2 mm obtained by cutting the bulk silicon carbide single crystal obtained in Example I-4 and mirror-polishing the whole surface.

Figure 7:
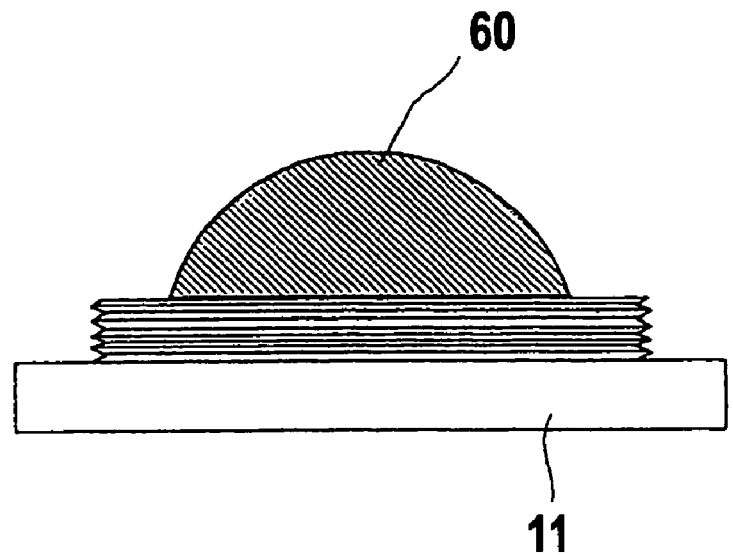
FIG. 7 is a schematic view of a silicon carbide single crystal of the present invention produced by a method of producing a silicon carbide single crystal of the present invention.

Current of 20 kHz was passed through the first induction heating coil 21 to heat this, current of 40 kHz was passed through the second induction heating coil 20 to heat this. The lower part (accommodation part for silicon carbide powder 40) and the upper part (placing part for seed crystal 50 of silicon carbide single crystal on lid body 11) of the graphite crucible 10 were each heated to 2510° C., and heated for 1 hour. Further, the temperature of the seed crystal placing part on the lid part 11 of the graphite crucible 10 was decreased to 2350° C. ($T_2$) over 20 hours and the temperature of the outer periphery part of the seed crystal placing part on the lid body 11 was decreased to 2480° C. ($T_3$) as the calculated estimated temperature, respectively, by gradually decreasing the feed power to the second induction heating coil (from 5.8 kW, 120 A to 4.2 kW, 90 A) while maintaining the lower part of the graphite crucible 10 at the same temperature ($T_1$). In this procedure, when the pressure was reduced to 20 Torr (2658 Pa) from normal pressure simultaneously over 1 hour, then as shown in FIG. 7, a silicon carbide single crystal 60 having convex form maintained toward the silicon carbide powder 40 side was obtained. In this case, the height up to the tip of the convex form on the silicon carbide single crystal 60 was 18 mm. On the silicon carbide single crystal 60, a concave part depressed toward the lid body 11 direction was not formed in the form of ring. The silicon carbide single crystal 60 did not grow in the condition of contact with the peripheral surface part 13 of the vessel body 12 of the graphite crucible 10.

Further, on the silicon carbide single crystal 60, the silicon carbide polycrystal 70 was not generated or grown adjacently around it.

Example I-7

The same procedure was conducted as in Example I-1 excepting the following points in Example I-1. Namely, the second induction heating coil 20 and the first induction heating coil 21 was substituted by the induction heating coil 25 in the conventional silicon carbide single crystal production apparatus 80 shown in FIG. 8, and a carbon thin film judged as vitreous or amorphous by X ray diffraction was formed in a thickness of 1 to 10 μm only on the outer regions of a circle having a radius of 60 mm from the center, on the surface (surface on which growth of silicon carbide single crystal is conducted) facing the inside part of the vessel body 12, according the following method. The crucible was placed in a vacuum chamber in the condition of exposure of only the above-mentioned outer regions on the lid body 11, and the pressure in the chamber was adjusted to 0.23 Pa under a benzene atmosphere. Thereafter, film formation was effected by collision at fast speed to the above-mentioned outer regions on the lid body 11 of positive ions generated in plasma by decomposing benzene by arc discharge plasma generated at facing parts between a filament and an anode while keeping the lid body 11 at a negative potential of 2.5 kV.

In Example I-7, on the surface facing the inside part of the vessel body 12 of the lid body 11, the crystal of silicon carbide did not grow on parts on which a film of vitreous carbon or amorphous carbon was not formed, and the silicon carbide single crystal 60 on which the whole surface of the growing surface is maintained in convex form toward the silicon carbide powder 40 side was grown only on the center part (circle part of a diameter of 60 mm) on which film formation was not conducted. Therefore, the silicon carbide single crystal 60 did not grow in the condition of contact with the peripheral surface part 13 of the vessel body 12 of the graphite crucible 10, and when cooled to room temperature, breaks such as cracking and the like did not occur.

Example I-8

A silicon carbide single crystal was produced in the same manner as in Example I-1 except that the silicon carbide single crystal production apparatus 80 shown in FIG. 8 was used.

Specifically, the same procedure as in Example I-1 was conducted except that the first induction heating coil 21 and the second induction heating coil 20 placed at parts which are around the quartz tube 30 and on which the lid body 11 of the graphite crucible 10 was situated were substituted by the induction heating coil 25 placed, in the condition of winding in the form of spiral at approximately the same interval, at parts which are around the quartz tube 30 and on which the graphite crucible 10 was situated, and the interference preventing coil 22 was not used.

Figure 9:
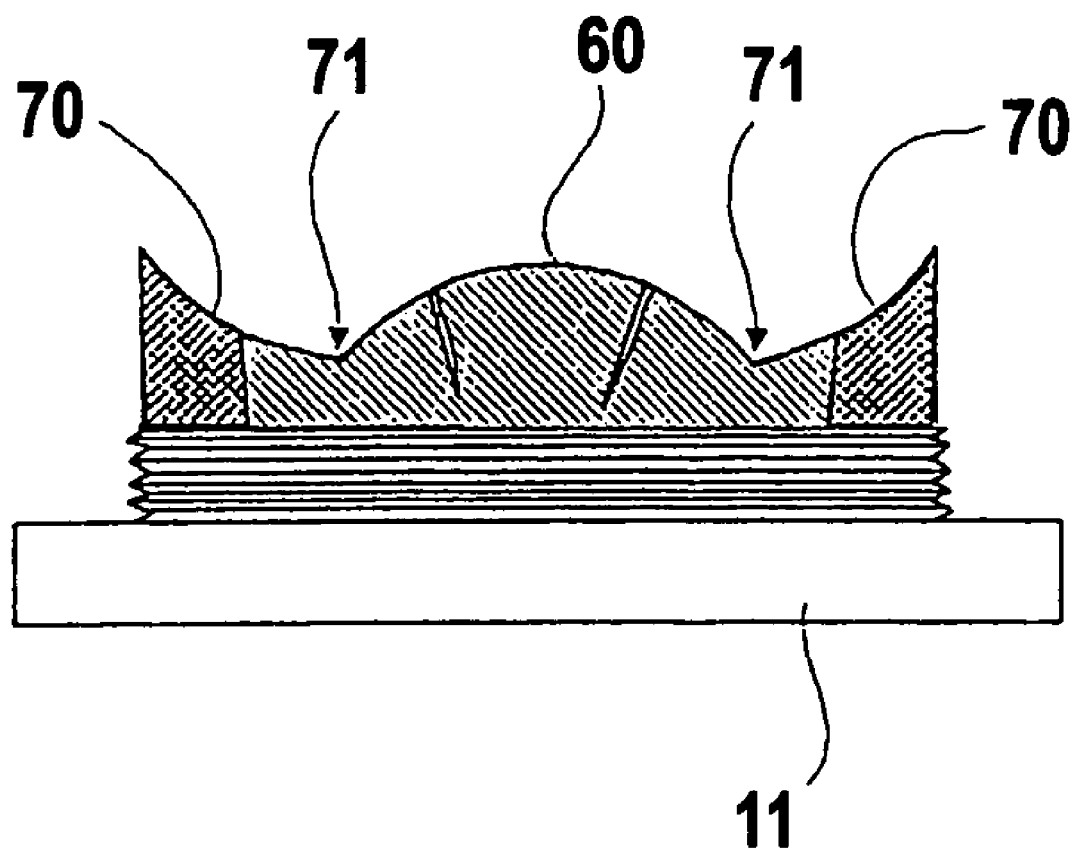
FIG. 9 is a schematic view of a silicon carbide single crystal produced by a method of producing a silicon carbide single crystal of the present invention.

In Example I-8, as shown in FIG. 9, the whole surface facing the inside part of the vessel body 12, on the lid body 11, was covered with the crystal of silicon carbide, and on the outer peripheral parts of the lid body 11, the silicon carbide polycrystal 70 grew in the condition of contact with the inner peripheral surface of the vessel body 12. Under this condition, when cooled to room temperature, stress based on difference in thermal expansion was applied concentratedly from the silicon carbide polycrystal 70 side to the silicon carbide single crystal 60 side, and as shown in FIG. 9, cracking occurs on the silicon carbide single crystal 60.

Comparative Example I-1

A silicon carbide powder 40 was produced in the same manner as in Example I-1 except that the resol type xylene resin used in producing the silicon carbide powder 40 in Example I-1 was substituted by a resol type phenol resin. The nitrogen content in the resulted silicon carbide powder was 500 mass ppm or more.

A silicon carbide single crystal 60 was produced using this silicon carbide powder 40, and the same evaluation as in Example I-1 was conducted, to obtain the same results as in Example I-1. The silicon carbide single crystal 60 had a volume resistivity of 0.02 Ωcm and nitrogen content of 160 mass ppm.

According to the present invention, a silicon carbide single crystal which has a small content of impurity elements, also has a small content of elements such as nitrogen and the like other than the impurity elements, can be used as a semi-insulator or insulator, and can be suitably used as a semi-insulating or insulating single crystal substrate and the like, and a method of producing a silicon carbide single crystal which can produce this silicon carbide single crystal efficiently, can be provided.

Example II-1

A silicon carbide single crystal is produced by using a silicon carbide single crystal producing apparatus 1 a shown in FIG. 1. The silicon carbide single crystal producing apparatus 1 has a graphite crucible 10 composed of a vessel body 12 which can accommodate a silicon carbide powder 40 and a lid body 11 which can be attached to and detached from the vessel body 12 by screwing and can place a seed crystal 50 of a silicon carbide single crystal at approximately the center of a surface facing a silicon carbide powder 40 accommodated in the vessel body 12 in mounting on the vessel body 12, a supporting rod fixing the graphite crucible 10 to inside of a quartz tube 30, a first induction heating coil 21 placed on a part on the outer periphery of the quartz tube 30 and accommodating the silicon carbide powder 40, and a second induction heating coil 20 placed on a part on the outer periphery of the quartz tube 30 and on which the lid body 11 of the graphite crucible 10 is positioned. The graphite crucible 10 is by insulating materials (not shown).

A silicon carbide powder 40 was produced as shown below. Namely, to 212 g of high purity tetraethoxysilane having a $SiO_2$ content of 40 mass % was added 34 g of high purity maleic acid as a catalyst, then, 127 g of resol type xylene-based in the form of a 50 mass % high purity solution (manufactured by Mitsubishi Gas Chemical Co., Inc., Nikanol PR-1440M), 136 g of ethyl aluminate (manufactured by Aldrich Co., Inc.,) was mixed, to obtain a candy-like mixture of high viscosity. This candy-like mixture was thermally hardened at 70° C., to obtain homogeneous resinous solid. 300 g of this resinous solid was carbonated at 900° C. for 1 hour to obtain 130 g of carbide (yield: 43%). The C/Si ratio in the above-mentioned resinous solid was 1.5 when calculated according to (127 g×0.5 g×0.4/12.011)/(0.4×212 g/60.0843), and 1.53 as a result of elemental analysis.

130 g of this carbide was plated in a carbon vessel, and calcinated by heating at 800° C./hr up to 1600° C., then, heating at 100° C./hr up to 1900° C., then, keeping at 1900° C. for 2 hours. Further, this powder was heated under an argon atmosphere up to 2350° C., kept for 4 hours, to obtain a silicon carbide powder of high purity (100 mass % α-SiC). The resulted silicon carbide powder 40 revealed pale greenish gray color.

The nitrogen content in the silicon carbide powder 40 was measured by using an oxygen and nitrogen simultaneous analyzing apparatus (manufactured by LECO, TC436) to find that it was less than 40 mass ppm.

For analysis of impurity elements in the silicon carbide powder 40, the silicon carbide powder 40 was thermally decomposed under pressure with a mixed acid containing hydrofluoric acid, nitric acid and sulfuric acid, then, ICP-mass analysis method and flameless atomic absorption method were conducted, to find that the contents of Na, K, Cr, Fe, Ni, Cu, W, Ti and Ca as impurity elements were each not more than 0.1 mass ppm, and the content of Al was 400 mass ppm.

Further, the volume-average particle size ($D_{50}$) and particle size distribution ($D_{90}/D_{10}$) (based on volume-average particle size) of the silicon carbide powder 40 were measured by a particle size distribution measuring apparatus (COULTER LS230), to find that the volume-average particle size ($D_{50}$) was 300 μm and the particle size distribution ($D_{90}/D_{10}$) (based on volume-average particle size) was 3.4, and distribution showed one mountain.

Next, in the silicon carbide single crystal producing apparatus 1, current was flown through the first induction heating coil 21 to heat this. By this heat, the silicon carbide powder 40 was heated, and heater up to 2500° C., then, the pressure was maintained at 50 Torr (6645 Pa) under an argon gas atmosphere. The silicon carbide powder 40 was heated to give temperature (2500° C.) to sublimate. The sublimated silicon carbide powder 40 does not re-crystallize unless cooled to the re-crystallization temperature. Here, since the lid body 11 side was heated by the second induction heating coil 20 and maintained in a re-crystallization atmosphere (pressure: 50 Torr (6645 Pa)) in which the temperature was lower than the silicon carbide powder 40 side (temperature of seed crystal: 2400° C.) and the sublimated silicon carbide powder 40 can re-crystallize, silicon carbide was re-crystallized only around on the seed crystal 50 the silicon carbide single crystal, to grow the crystal of silicon carbide.

As shown in FIG. 2, a silicon carbide single crystal 60 re-crystallized and grew on the seed crystal 50 of the silicon carbide single crystal, and a silicon carbide single crystal 70 re-crystallized and grew at the outer peripheral part of the seed crystal 50 of the silicon carbide single crystal. In growth of the silicon carbide single crystal 60, and during the whole grow process, convex form was maintained toward the silicon carbide powder 40 side, and no concave part depressed toward the lid body 1 side was formed in the form of ring, and a silicon carbide polycrystal 70 did not grow in the condition of contact with the peripheral surface part 14 in the vessel body 12.

As a result, as shown in FIG. 3, when the grown silicon carbide single crystal 60 was cooled to room temperature, stress based on difference in thermal expansion was not applied concentratedly from the silicon carbide polycrystal 70 side to the silicon carbide single crystal 60 side, and breaks such as cracking and the like did not occur on the resulting silicon carbide single crystal 60.

The resulted silicon carbide single crystal 60 was evaluated, as a result, mixing of a polycrystal and polymorphism was not found, the proportion of crystal defects of micro pipes was 4/cm², meaning little presence. Namely, the crystal 60 had extremely high quality.

For detection of the above-mentioned crystal defects of micro pipes, the resulted silicon carbide single crystal 60 was cut at a thickness of 0.4 mm, and mirror polishing was performed to give a wafer having a surface roughness of 0.4 nm, and extraneous materials on the surface were removed to the utmost by alkali washing, then, detection was effected as described below. Namely, the micro pipes were detected by scanning the whole surface of the above-mentioned wafer to obtain a microscope image under conditions wherein parts continuing to inside of the micropipe can be observed, connected to the opening part, as a weaker image than that of the opening part, in illuminating the above-mentioned wafer after alkali washing with reflected light together with suitable amount of transmission light added and adjusting the microscope focus on the opening part of the micropipe on the surface of the wafer, then, extracting only forms characteristic to the micro pipe by image-treating the microscope image and counting the number of them. In this detection, even fine micro pipes of about 0.35 μm were correctly detected without break.

Further, the resulted silicon carbide single crystal 60 was thermally decomposed under pressure with a mixed acid containing hydrofluoric acid and nitric acid, the resulted solution was concentrated 10-fold or more and ICP-mass analysis method and flameless atomic absorption analysis were used to analyze impurity elements, to find that the contents of Na, K, Cr, Fe, Ni, Cu, W, Ti and Ca as impurity elements were each not more than 15 mass ppb, the content of Al as impurity elements was 40 mass ppm.

From the evaluation of the hole effect, it is found that the resulted silicon carbide single crystal 60 was a p-type semiconductor which has 0.03 Ωcm volume resistivity.

The nitrogen content of the resulted silicon carbide single crystal 60 was measured by using a photoluminescence measuring apparatus, to find a content of 0.05 mass ppm. or less.

Example II-2

The same procedure was conducted as in Example II-1 excepting the graphite crucible 10 was substituted by a graphite crucible 10 shown in FIG. 4 in Example II-1. As a result, the same results as in Example II-1 were obtained. The graphite crucible 10 shown in FIG. 4 is different from the graphite crucible 10 shown in FIG. 1 used in Example II-1, only in that an inner region forming part 15 is provided on the lid body 11. The inner region forming part 15 is, as shown in FIG. 4, a cylinder in which the above-mentioned inner region at which the seed crystal of a silicon carbide single crystal is placed is the bottom surface, and one end thereof is exposed out of the graphite crucible 10. The material of the inner region forming part 15 had a heat conductivity of 117 J/m/s/° C. (W/m·K), and the material of the lid body 11 other than the inner region forming part 15 had a heat conductivity of 129 J/m/s/° C. (W/m·K).

In the case of Example II-2, since the above-mentioned inner region is formed of a member (inner region forming part 15) different from that of the above-mentioned outer region, it is not easily heated due to difference in contact resistance, further, since one end of the inner region forming part 15 is exposed into outside, heat is easily released into outside, consequently, re-crystallization of silicon carbide was carried out easily.

Example II-3

The same procedure was conducted as in Example II-1 excepting the graphite crucible 10 was substituted by a graphite crucible 10 shown in FIG. 5. As a result, the same results as in Example II-1 were obtained. The graphite crucible 10 shown in FIG. 5 is different from the graphite crucible 10 shown in FIG. 1 used in Example II-1, only in that an inner region forming part 15 is provided on the lid body 11. The inner region forming part 15 has, as shown in FIG. 5, a form in which the above-mentioned inner region at which the seed crystal of a silicon carbide single crystal is placed is the bottom surface and the bottom surface has stair shape in which the diameter increases by two steps discontinuously toward outside, and one end thereof is exposed out of the crucible. The material of the inner region forming part 15 had a heat conductivity of 117 J/m/s/° C. (W/m·K), and the material of the lid body 11 other than the inner region forming part 15 had a heat conductivity of 129 J/m/s/° C. (W/m·K).

In the case of Example II-3, since the above-mentioned inner region is formed of a member different from that of the above-mentioned outer region, it is not easily heated due to difference in contact resistance, further, since one end of the inner region forming part 15 is exposed into outside, heat is easily released into outside, consequently, re-crystallization of silicon carbide was carried out easily.

Example II-4

The same procedure was conducted as in Example II-1 excepting the following points in Example II-1. Namely, the resulted silicon carbide powder had 6H and an average particle size of 300 µm, and the seed crystal 50 of a silicon carbide single crystal was a wafer of 15R (diameter 40 mm, thickness 0.5 mm) obtained by cutting the bulk silicon carbide single crystal obtained in Example II-1 and mirror-polishing the whole surface.

Current of 20 kHz was passed through the first induction heating coil 21 to heat this, current of 40 kHz was passed through the second induction heating coil 20 to raise temperature to heat this. The lower part (accommodation part for silicon carbide powder 40) of the graphite crucible 10 was heated to 2312° C., and the upper part (placing part for seed crystal 50 of silicon carbide single crystal on lid body 11) of the graphite crucible 10 was heated to 2290° C., respectively. In this operation, the feed power to the first induction heating coil 21 was 10.3 kW, the induction heating current (feed current to LC circuit) was 260 A, the feed power to the second induction heating coil 20 was 4.6 kW, and the induction heating current was 98 A. The pressure was reduced from normal pressure to 20 Torr (2658 Pa) over 1 hour and kept for 20 hours, as a result, a silicon carbide single crystal 60 having convex form maintained toward the silicon carbide powder 40 side as shown in FIG. 6 was obtained. In this case, the height up to the tip of the convex form on the silicon carbide single crystal 60 was 12 mm, and the diameter of the grown crystal of silicon carbide containing the silicon carbide single crystal 60 and a silicon carbide polycrystal formed around it was 87 mm. On the silicon carbide single crystal 60, a concave part depressed to the lid body 11 direction was not formed in the form of ring. The silicon carbide single crystal 60 did not grow in the condition of contact with the peripheral surface part 13 of the vessel body 12 of the graphite crucible 10. Further, on the silicon carbide single crystal 60, the silicon carbide polycrystal 70 was generated only in small amount around it.

Example II-5

The same procedure was conducted as in Example II-1 excepting the following points in Example II-4. Namely, the conditions are the same as in Example II-4 except that the seed crystal 50 a silicon carbide single crystal had a diameter of 20 mm and a thickness of 0.5 mm, the flow part (accommodation part for silicon carbide powder 40) of the graphite crucible 10 was heated to 2349° C. and the upper part (placing part for seed crystal 50 of silicon carbide single crystal on lid body 11) of the graphite crucible 10 was heated to 2317° C., and in this operation, the feed power to the second induction heating coil 20 was 5.5 kW, the induction heating current was 118 A, and the diameter of the grown crystal of silicon carbide containing the silicon carbide single crystal 60 and a silicon carbide polycrystal formed around it was 60 mm, and the same excellent results were obtained as in Example II-4.

Example II-6

The same procedure was conducted as in Example II-1 excepting the following points in Example II-1. Namely, an interference preventing coil 22 through which water flows inside and which can be cooled was used. The resulted silicon carbide powder had 6H and an average particle size of 250 µm, and the seed crystal 50 of a silicon carbide single crystal was a wafer (6H) having a diameter of 25 mm and a thickness of 2 mm obtained by cutting the bulk silicon carbide single crystal obtained in Example II-4 and mirror-polishing the whole surface.

Current of 20 kHz was passed through the first induction heating coil 21 to heat this, current of 40 kHz was passed through the second induction heating coil 20 to heat this. The lower part (accommodation part for silicon carbide powder 40) and the upper part (placing part for seed crystal 50 of silicon carbide single crystal on lid body 11) of the graphite crucible 10 were each heated to 2510° C., and heated for 1 hour. Further, the temperature of the seed crystal placing part on the lid part 11 of the graphite crucible 10 was decreased to 2350° C. ($T_2$) over 20 hours and the temperature of the outer periphery part of the seed crystal placing part on the lid body 11 was decreased to 2480° C. ($T_3$) as the calculated estimated temperature, respectively, by gradually decreasing the feed power to the second induction heating coil (from 5.8 kW, 120 A to 4.2 kW, 90 A) while maintaining the lower part of the graphite crucible 10 at the same temperature ($T_1$). In this procedure, when the pressure was reduced to 20 Torr (2658 Pa) from normal pressure simultaneously over 1 hour, then as shown in FIG. 7, a silicon carbide single crystal 60 having convex form maintained toward the silicon carbide powder 40 side was obtained. In this case, the height up to the tip of the convex form on the silicon carbide single crystal 60 was 18 mm. On the silicon carbide single crystal 60, a concave part depressed toward the lid body 11 direction was not formed in the form of ring. The silicon carbide single crystal 60 did not grow in the condition of contact with the peripheral surface part 13 of the vessel body 12 of the graphite crucible 10. Further, on the silicon carbide single crystal 60, the silicon carbide polycrystal 70 was not generated or grown adjacently around it.

Example II-7

The same procedure was conducted as in Example II-1 excepting the following points in Example II-1. Namely, the second induction heating coil 20 and the first induction heating coil 21 was substituted by the induction heating coil 25 in the conventional silicon carbide single crystal production apparatus 80 shown in FIG. 8, and a carbon thin film judged as vitreous or amorphous by X ray diffraction was formed in a thickness of 1 to 10 µm only on the outer regions of a circle having a radius of 60 mm from the center, on the surface (surface on which growth of silicon carbide single crystal is conducted) facing the inside part of the vessel body 12, according the following method. The crucible was placed in a vacuum chamber in the condition of exposure of only the above-mentioned outer regions on the lid body 11, and the pressure in the chamber was adjusted to 0.23 Pa under a benzene atmosphere. Thereafter, film formation was effected by collision at fast speed to the above-mentioned outer regions on the lid body 11 of positive ions generated in plasma by decomposing benzene by arc discharge plasma generated at facing parts between a filament and an anode while keeping the lid body 11 at a negative potential of 2.5 kV.

In Example II-7, on the surface facing the inside part of the vessel body 12 of the lid body 11, the crystal of silicon carbide did not grow on parts on which a film of vitreous carbon or amorphous carbon was not formed, and the silicon carbide single crystal 60 on which the whole surface of the growing surface is maintained in convex form toward the silicon carbide powder 40 side was grown only on the center part (circle part of a diameter of 60 mm) on which film formation was not conducted. Therefore, the silicon carbide single crystal 60 did not grow in the condition of contact with the peripheral surface part 13 of the vessel body 12 of the graphite crucible 10, and when cooled to room temperature, breaks such as cracking and the like did not occur.

Example II-8

A silicon carbide single crystal was produced in the same manner as in Example II-1 except that the silicon carbide single crystal production apparatus 80 shown in FIG. 8 was used.

Specifically, the same procedure as in Example II-1 was conducted except that the first induction heating coil 21 and the second induction heating coil 20 placed at parts which are around the quartz tube 30 and on which the lid body 11 of the graphite crucible 10 was situated were substituted by the induction heating coil 25 placed, in the condition of winding in the form of spiral at approximately the same interval, at parts which are around the quartz tube 30 and on which the graphite crucible 10 was situated, and the interference preventing coil 22 was not used.

In Example II-8, as shown in FIG. 9, the whole surface facing the inside part of the vessel body 12, on the lid body 11, was covered with the crystal of silicon carbide, and on the outer peripheral parts of the lid body 11, the silicon carbide polycrystal 70 grew in the condition of contact with the inner peripheral surface of the vessel body 12. Under this condition, when cooled to room temperature, stress based on difference in thermal expansion was applied concentratedly from the silicon carbide polycrystal 70 side to the silicon carbide single crystal 60 side, and as shown in FIG. 9, cracking occurs on the silicon carbide single crystal 60.

Comparative Example II-1

A silicon carbide powder 40 was produced in the same manner as in Example II-1 except that the resol type xylene resin used in producing the silicon carbide powder 40 in Example II-1 was substituted by a resol type phenol resin. The nitrogen content in the resulted silicon carbide powder was 500 mass ppm or more.

A silicon carbide single crystal 60 was produced using this silicon carbide powder 40, and the same evaluation as in Example II-1 was conducted, to obtain the same results as in Example II-1. The silicon carbide single crystal 60 was a n-type semiconductor which had a volume resistivity of 0.01 Ωcm, nitrogen content of 180 mass ppm, and Al content of 40 mass ppm.

Example III-1

Figure 20:
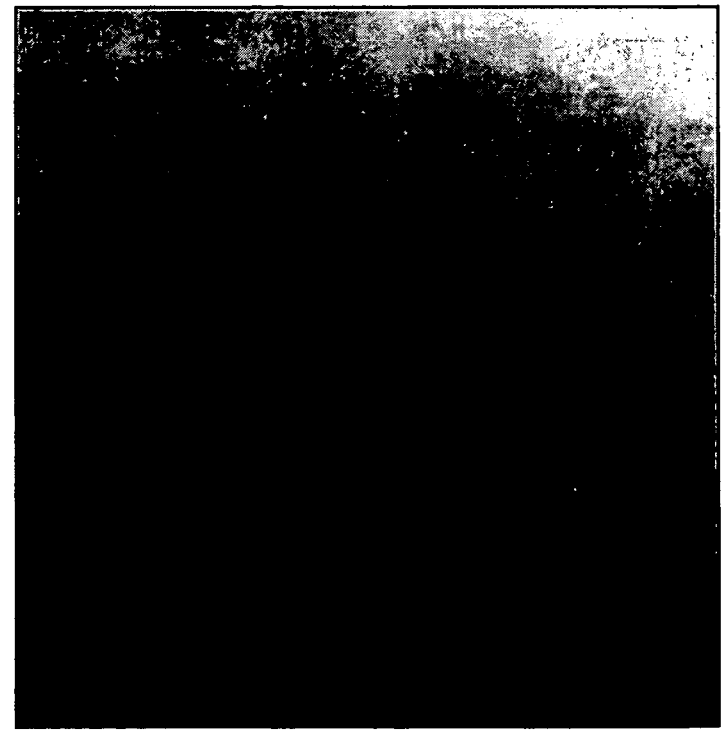
FIG. 20 shows a magnified photograph of the surface of the silicon carbide single crystal obtained in the example.

The seed crystal 109 was fixed on the seed crystal fixing part 103 according to the method for fixing the seed crystal of the invention using the seed crystal fixing apparatus shown in FIG. 1. A phenol resin was applied as the adhesive 105 at a density of 7.5 µl/cm². The seed crystal 109 used was a Lely crystal of 6H-SiC with a thickness of 0.4 mm and a diameter of 50 mm. The seed crystal was heated to 90° C. in 15 minutes under a reduced pressure (30 Torr). After additional preheating at 90° C. for 2 minutes, the seed crystal was heated to 160° C. in 25 minutes and heated at 160° C. for 10 minutes to harden the adhesive. As shown in the surface observation photograph in FIG. 20, it was confirmed that the seed crystal 109 of this example was bonded without any irregular bonding.

The seed crystal fixing part 103 on which the seed crystal 109 was fixed was mounted on the silicon carbide single crystal producing apparatus 130 to permit the silicon carbide single crystal to grow on the seed crystal. A sublimation material 135 contains a high purity tetraethoxysilane polymer as a silicon source and a phenol resin of a resol type as a carbon source. These materials were uniformly mixed, and the mixture was calcinated by heating in an argon atmosphere to obtain a silicon carbide powder (6H-SiC partly containing 3C-SiC; average particle diameter 200 µm), which was used as the sublimation material 135. An electric current was flowed through a first induction heating coil 133a in the silicon carbide single crystal producing apparatus 130 to heat the coil, and the sublimation material 135 was heated with the coil. In this process, the bottom of the reaction vessel 31 was heated at 2350° C., and the argon gas atmosphere in the vessel was maintained at a pressure of 50 Torr (6645 Pa). The sublimation material 135 was sublimated by being heated at a predetermined temperature (2540° C.). The seed crystal fixing part 103 was heated with a second induction heating coil 33b. The temperature of the seed crystal fixing part 103 after heating with the second induction heating coil 33b was adjusted to 2300° C.

An observation of the cross section of the wafer of the silicon carbide single crystal (FIG. 20) showed that the number of macroscopic defects on the entire surface immediately above the seed crystal was 10 or less, while the number of the macroscopic defects 10 mm above the surface of the seed crystal was zero. The size of the defect was smaller than that observed in the single crystal obtained by the conventional method.

Comparative Example III-1

Figure 19:
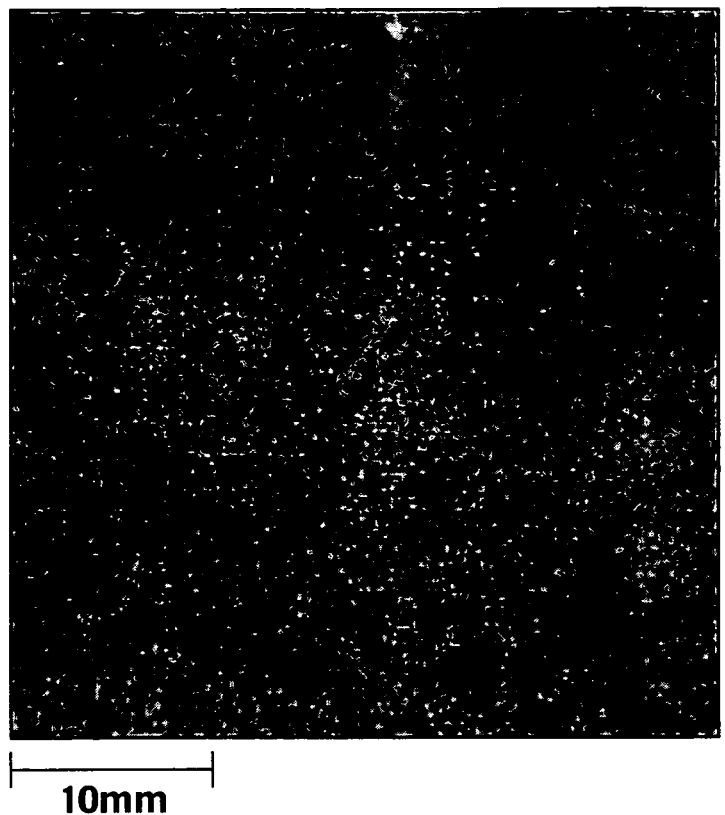
FIG. 19 shows a magnified photograph of the surface of the silicon carbide single crystal obtained in the comparative example.
Figure 22:
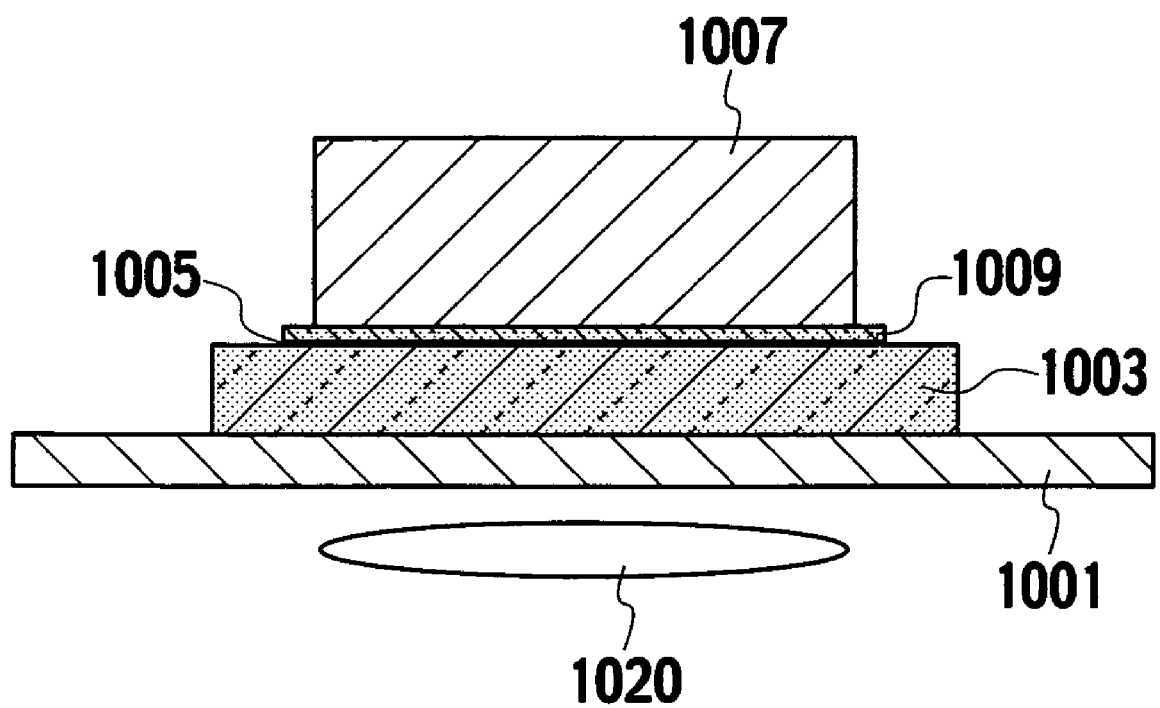
FIG. 22 shows a schematic illustration of a conventional method for fixing the seed crystal.

A seed crystal fixing part 1003 was placed on a mounting table 1001 as shown in FIG. 22, and a seed crystal 1009 was fixed thereon with interposition of an adhesive (phenol resin) 1005. A weight 1007 was loaded on the seed crystal 1009, and the phenol resin was hardened by heating at 300° C. for 0.5 hour while the seed crystal 1009 is loaded with the weight 1007. As shown in the surface observation photograph of the seed crystal in FIG. 19, irregular bonding was found on the surface of the seed crystal 1009 in the comparative example.

A silicon carbide single crystal was grown by the same method as in the example using the seed crystal 1009.

An observation of the vertical cross section (FIG. 19) of the silicon carbide single crystal obtained showed that the number of macroscopic defects on the entire surface of the single crystal immediately above the seed crystal was 100 or less, while the number of the macroscopic defects 10 mm above the surface of the seed crystal was 10 to 20. The size of the macroscopic defect was larger than that in the example.

According to the present invention, a silicon carbide single crystal which has a small content of impurity elements, also has a small content of elements such as nitrogen and the like other than the impurity elements, can be suitably used as a p-type semiconductor and the like, and a method of producing a silicon carbide single crystal which can produce this silicon carbide single crystal efficiently, can be provided.

What is claimed is:

1. A method of producing a silicon carbide single crystal, comprising:

fixing a seed crystal, including setting a seed crystal on a seed crystal fixing part with interposition of an adhesive; applying a uniform pressure on the entire surface of the seed crystal by contacting a flexible bag which is inflatable and deflatable to the seed crystal by charging a gas into the to flexible bag; hardening the adhesive; and sublimating a silicon carbide powder obtained by calcinating a mixture containing at least a silicon source and a resol xylene resin, having a nitrogen content of 100 mass ppm or less and having a content of each impurity elements of 0.1 mass ppm or less, and re-crystallizing for growing a silicon carbide single crystal.

2. The method of producing a silicon carbide single crystal according to claim 1, wherein the silicon carbide powder has nitrogen content of 50 mass ppm or less.

* * * * *